(12) United States Patent
Sarayama et al.

(10) Patent No.: US 8,623,138 B2
(45) Date of Patent: Jan. 7, 2014

(54) CRYSTAL GROWTH APPARATUS

(75) Inventors: Seiji Sarayama, Miyagi (JP); Hisanori Yamane, Miyagi (JP); Masahiko Shimada, Miyagi (JP); Masafumi Kumano, Kanagawa (JP); Hirokazu Iwata, Miyagi (JP); Takashi Araki, Miyagi (JP)

(73) Assignee: Ricoh Company, Ltd., Tokyo (JP)

(*) Notice: Subject to any disclaimer, the term of this patent is extended or adjusted under 35 U.S.C. 154(b) by 855 days.

(21) Appl. No.: 12/353,608

(22) Filed: Jan. 14, 2009

(65) Prior Publication Data

US 2009/0120354 A1 May 14, 2009

Related U.S. Application Data

(62) Division of application No. 11/302,128, filed on Dec. 14, 2005, now Pat. No. 7,531,038, which is a division of application No. 10/134,895, filed on Apr. 30, 2002, now Pat. No. 7,001,457.

(30) Foreign Application Priority Data

| | | | |
|---|---|---|---|
| May 1, 2001 | (JP) | ................... | 2001-134171 |
| May 17, 2001 | (JP) | ................... | 2001-147703 |
| May 22, 2001 | (JP) | ................... | 2001-152977 |
| Jun. 28, 2001 | (JP) | ................... | 2001-195954 |
| Nov. 21, 2001 | (JP) | ................... | 2001-355720 |
| Nov. 26, 2001 | (JP) | ................... | 2001-358808 |

(51) Int. Cl.
*C30B 9/06* (2006.01)

(52) U.S. Cl.
USPC ............ 117/200; 117/213; 117/215

(58) Field of Classification Search
USPC ........................................ 117/200, 213, 225
See application file for complete search history.

(56) References Cited

U.S. PATENT DOCUMENTS

| | | | |
|---|---|---|---|
| 3,865,554 A | 2/1975 | Wenckus et al. |
| 4,519,966 A | 5/1985 | Aldinger et al. |
| 4,734,346 A | 3/1988 | Kumano et al. |
| 4,792,510 A | 12/1988 | Kumano et al. |
| 4,943,839 A | 7/1990 | Kumano et al. |
| 4,966,821 A | 10/1990 | Kawashima et al. |
| 5,053,844 A | 10/1991 | Murakami et al. |

(Continued)

FOREIGN PATENT DOCUMENTS

| | | |
|---|---|---|
| JP | 59-008695 | 1/1984 |
| JP | 60-228300 A | 11/1985 |

(Continued)

OTHER PUBLICATIONS

Aoki et al Growth of GaN single crysta;s from a Na melt at 750c and 5MPa N2, Journal of Crystal Growth vol. 218 2000.*

(Continued)

*Primary Examiner* — Bob M Kunemund
(74) *Attorney, Agent, or Firm* — Dickstein Shapiro LLP

(57) ABSTRACT

A group-III nitride crystal growth method comprises the steps of: a) preparing a mixed molten liquid of an alkaline material and a substance at least containing a group-III metal; b) causing growth of a group-III nitride crystal from the mixed molten liquid prepared in the step a) and a substance at least containing nitrogen; and c) creating a state in which nitrogen can be introduced into the molten liquid prepared by the step a).

25 Claims, 28 Drawing Sheets

(56) References Cited

U.S. PATENT DOCUMENTS

| | | |
|---|---|---|
| 5,108,843 A | 4/1992 | Ohtaka et al. |
| 5,144,458 A | 9/1992 | Adachi et al. |
| 5,155,567 A | 10/1992 | Haga et al. |
| 5,283,207 A | 2/1994 | Haga et al. |
| 5,304,357 A | 4/1994 | Sato et al. |
| 5,393,953 A | 2/1995 | Itoh et al. |
| 5,665,985 A | 9/1997 | Iwata |
| 5,684,523 A | 11/1997 | Satoh et al. |
| 5,868,837 A | 2/1999 | DiSalvo et al. |
| 6,270,569 B1 | 8/2001 | Shibata et al. |
| 6,592,663 B1 | 7/2003 | Sarayama et al. |
| 6,780,239 B2 | 8/2004 | Sarayama et al. |

FOREIGN PATENT DOCUMENTS

| | | |
|---|---|---|
| JP | S 63-274691 | 11/1988 |
| JP | UH06-042958 | 6/1994 |
| JP | 10-256662 | 9/1998 |
| JP | 11-4048 | 1/1999 |
| JP | 2000-12900 | 1/2000 |
| JP | 2000-22212 | 1/2000 |
| JP | 2000-226293 | 8/2000 |
| JP | 2000-281482 | 10/2000 |
| JP | 2000-327495 | 11/2000 |
| JP | 2001-9016 A | 1/2001 |
| JP | 2001-58900 | 3/2001 |
| JP | 2001-064098 | 3/2001 |
| JP | 2001-089299 | 4/2001 |
| JP | 2001-102316 | 4/2001 |
| JP | 2002-068896 | 3/2002 |
| WO | WO 95/04845 | 2/1995 |

OTHER PUBLICATIONS

"InGaN/GaN/AlGaN-based laser diodes with cleaved facets grown on GaN substrates," S. Nakamura et al., Applied Physics Letters, vol. 73, No. 6, Aug. 1998, pp. 832-834.

"Preparation of GaN Single Crystal Using a Na Flux", Chem. Master, 1997, 9, pp. 413-416.

"InGaN/GaN/AlGaN-Based Laser Diodes with Modulation-Doped Strained-Layer Superlattice", Jpn. J. Appl. Phys. vol. 36 (1997) pp. L1568-L1571.

"Bulk and homoepitaxial GaN-growth and characterization", Journal of Crystal Growth 189/190 (1998) 153-158.

Notice of Rejection of Japanese Application No. 2002-145706 dated Mar. 13, 2007.

Notice of Rejection of Japanese Application No. 2002-145706 dated Jul. 24, 2007.

Information Offer Form for Japanese Application No. 2001-134171.

H. Yamane, et al., "GaN Single Crystal Growth From a Na—Ga Melt," Journal of Materials Science 35, 2000, pp. 801-808.

Masato Aoki, et al., "Growth of GaN Single Crystal From a Na—Ga Melt at 750° C and 5 MPa of $N_2$," Journal of Crystal Growth 218, 2000, pp. 7-12.

A.W. Moore, "Characterization of Pyrolytic Boron Nitride for Semiconductor Materials Processing," Journal of Crystal Growth 106, 1990, pp. 5-15.

Notice of Rejection of Japanese Patent Application No. 2001-355720—date of issue: Jan. 23, 2007.

\* cited by examiner

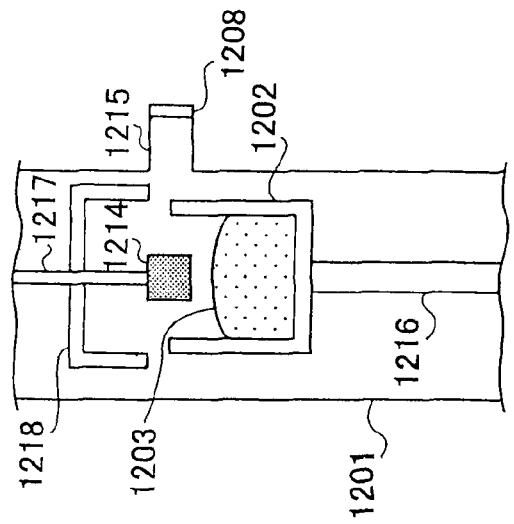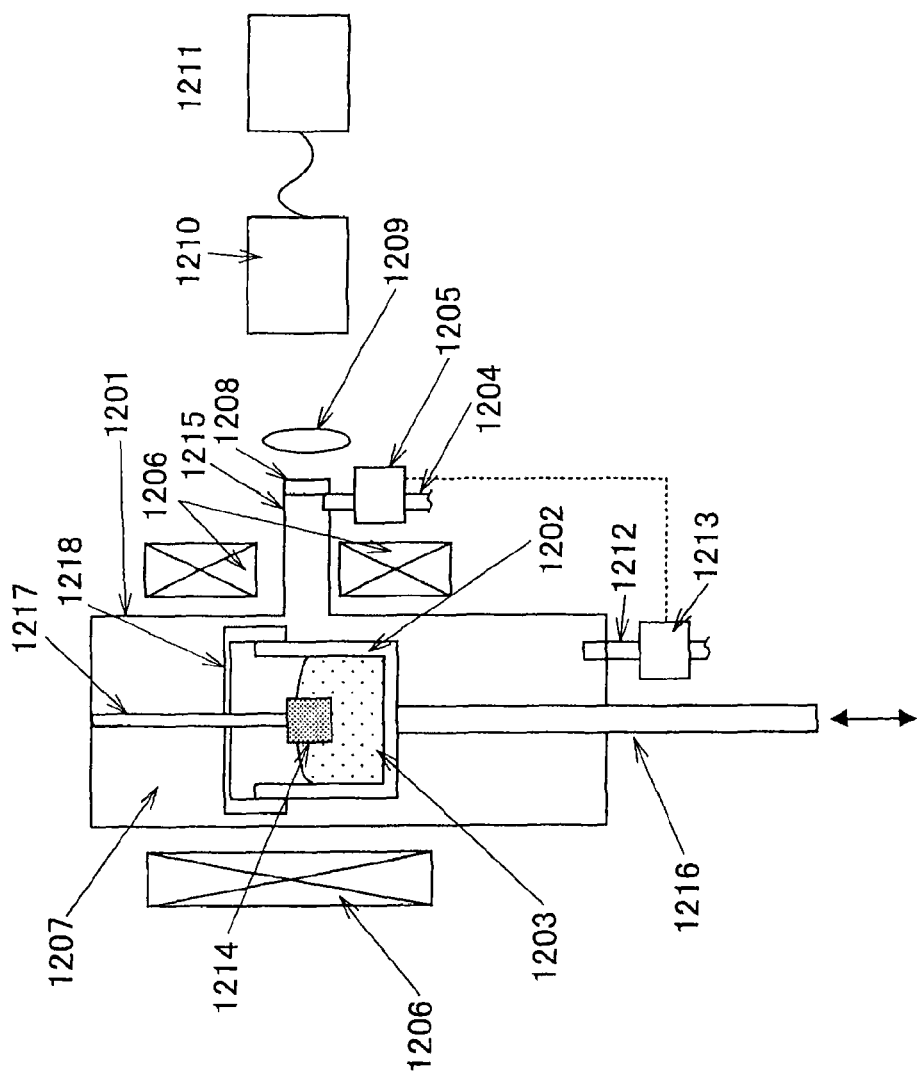

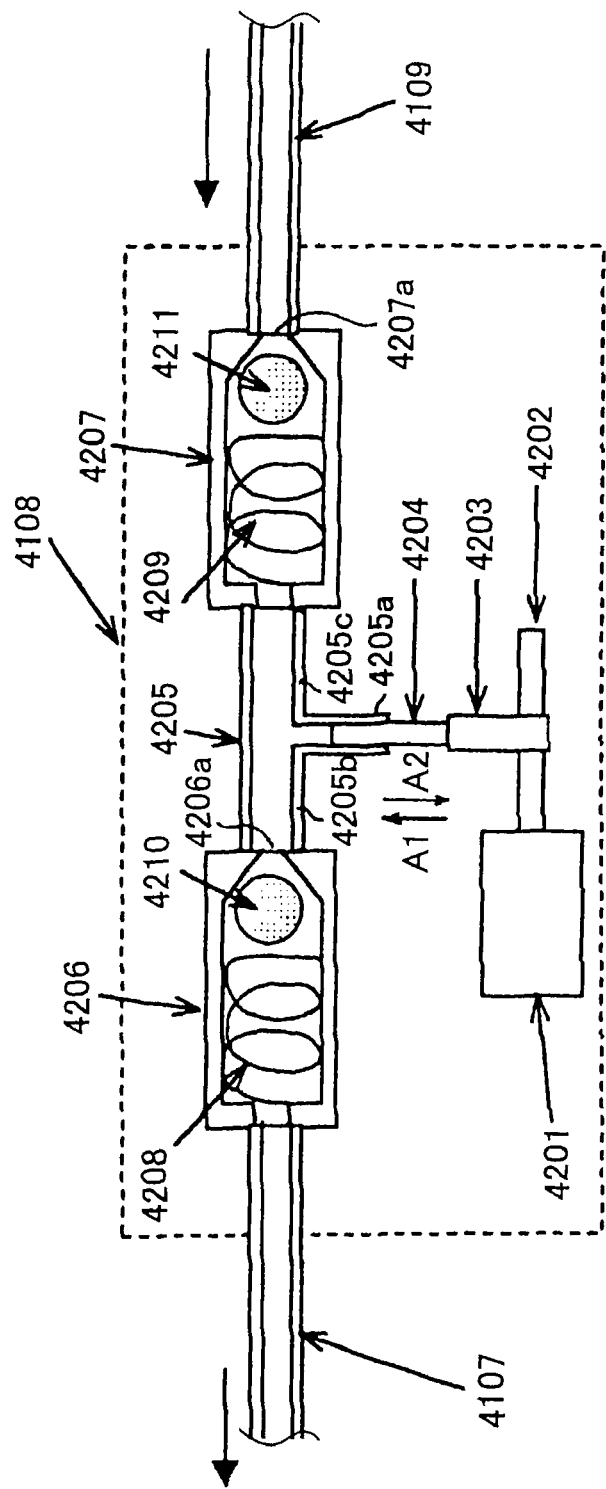

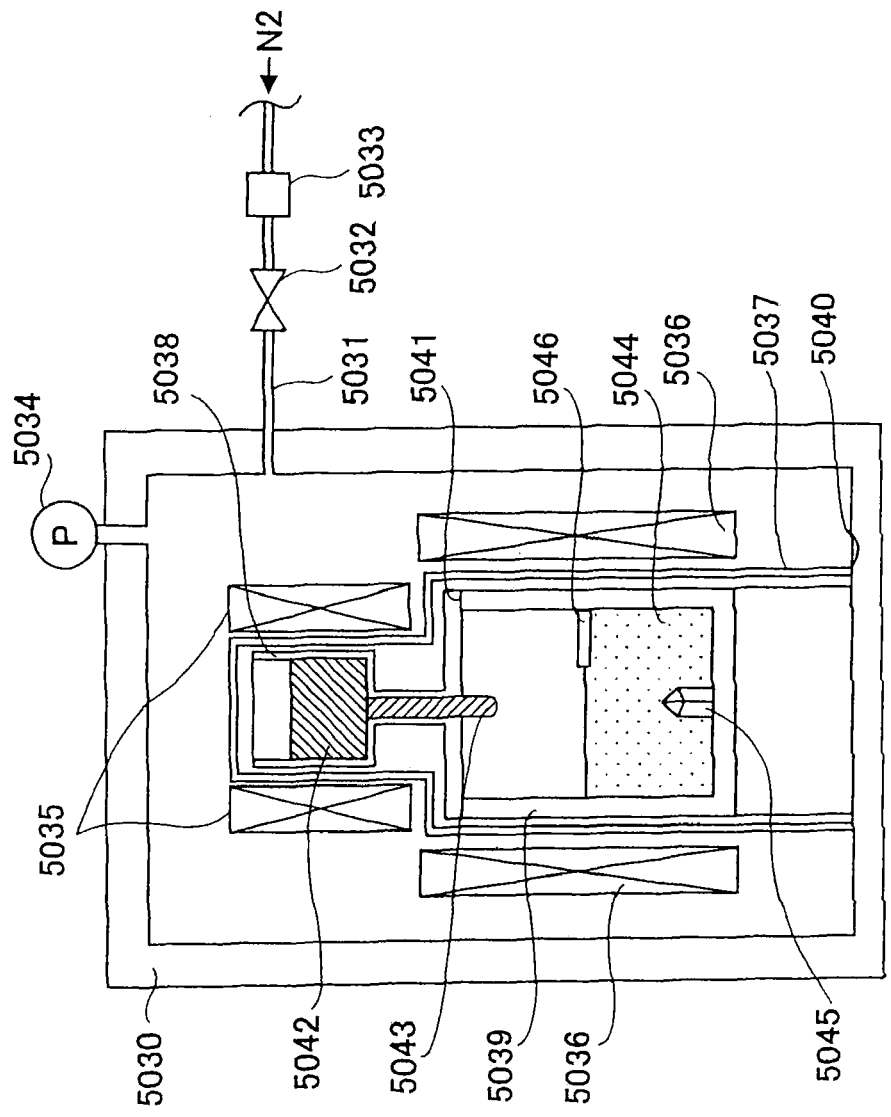

CRYSTAL GROWTH APPARATUS

CROSS-REFERENCE TO RELATED APPLICATIONS

This application is a divisional of U.S. patent application Ser. No. 11/302,128, filed Dec. 14, 2005 now U.S. Pat. No. 7,531,038, which is a divisional of application Ser. No. 10/134,895, filed Apr. 30, 2002 (now U.S. Pat. No. 7,001,457, issued Feb. 21, 2006) the subject matters of which are incorporated in their entirety by reference herein.

BACKGROUND OF THE INVENTION

1. Field of the Invention

The present invention relates to a crystal growth method, a crystal growth apparatus, a group-III nitride crystal, and a group-III nitride semiconductor device. In particular, the present invention relates to a crystal growth method and a crystal growth apparatus for a group-III nitride crystal, the group-III nitride crystal, and a group-III nitride semiconductor device employing the group-III nitride crystal applicable to a blue-violet light source, an ultraviolet light source (LED or LD) for an optical disk drive, a blue-violet light source for electro-photography printing system, and so forth.

2. Description of the Related Art

Now, a InGaAlN-family (group-III nitride) device used as violet through blue through green light sources is produced by a crystal growth process employing an MO-CVD method (organic metal chemical vapor phase growth method), an MBE method (molecular beam crystal growth method), etc. on a sapphire or SiC substrate in most cases. In using sapphire or SiC as a substrate, crystal defect caused due to a large expansivity difference and/or lattice constant difference from a group-III nitride may occur frequently. By this reason, there is a problem that the device characteristic may become worth, it may be difficult to lengthen the life of the light-emission device, or the electric power consumption may become larger.

Furthermore, since a sapphire substrate has an insulating property, drawing of an electrode from the substrate like in another conventional light-emission device is impossible, and therefore, drawing the electrode from the nitride semiconductor surface on which crystal was grown is needed. Consequently, the device area may have to be enlarged, and, thereby, the costs may increase. Moreover, chip separation by cleavage is difficult for a group-III nitride semiconductor device produced on a sapphire substrate, and it is not easy to obtain a resonator end surface needed for a laser diode (LD) by cleavage, either. By this reason, a resonator end surface formation according to dry etching, or, after grinding a sapphire substrate to the thickness of 100 micrometers or less, a resonator end surface formation made in a way near cleavage, should be performed. Also in such a case, it is impossible to perform formation of a resonator end surface and chip separation easily by a single process like for another conventional LD, and, also, complication in process, and, thereby, cost increase may occur.

In order to solve these problems, it has been proposed to reduce the crystal defects by employing a selective lateral growth method and/or another technique for forming a group-III nitride semiconductor film on a sapphire substrate.

For example, a document 'Japanese Journal of Applied Physics, Vol. 36 (1967), Part 2, No. 12A, pages L1568-1571' (referred to as a first prior art, hereinafter) discloses a laser diode (LD) shown in FIG. 1. This configuration is produced as follows: After growing up a GaN low-temperature buffer layer 2 and a GaN layer 3, one by one, on a sapphire substrate 1 by an MO-VPE (organometallic vapor phase epitaxy) apparatus, a $SiO_2$ mask 4 for selective growth is formed. This $SiO_2$ mask 4 is formed through photo lithography and etching process, after depositing a $SiO_2$ film by another CVD (chemistry vapor phase deposition) apparatus. Next, on this $SiO_2$ mask 4, again, a GaN film 3' is grown up to a thickness of 20 micrometers by the MO-VPE apparatus, and, thereby, GaN grows laterally selectively, and, as a result, the crystal defects are reduced as compared with the case where the selective lateral growth is not applied. Furthermore, prolonging of the crystal defect toward an activity layer 6 is prevented by provision of a modulation doped strained-layer superlattice layer (MD-SLS) 5 formed thereon. Consequently, as compared with the case where the selective lateral growth and modulation doped strained-layer superlattice layer are not used, it becomes possible to lengthen the device life.

In the case of this first prior art, although it becomes possible to reduce the crystal defects as compared with the case where the selective lateral growth of a GaN film is not carried out on a sapphire substrate, the above-mentioned problems concerning the insulating property and cleavage by using a sapphire substrate still remain. Furthermore, as the $SiO_2$ mask formation process is added, the crystal growth by the MO-VPE apparatus is applied twice, and, thereby, a problem that a process is complicated newly arises.

As another method, for example, a document 'Applied Physics Letters, Vol. 73, No. 6, pages 832-834 (1998)' (referred to as a second prior art, hereinafter) discloses application of a GaN thick film substrate. By this second prior art, a GaN substrate is produced, by growing up a 200-micrometer GaN thick film by an H-VPE (hydride vapor phase growth) apparatus after 20-micrometer selective lateral growth according to the above-mentioned first prior art, and, then, grinding the GaN substrate thus having grown to be the thick film from the side of the sapphire substrate so that it may have the thickness of 150 micrometers. Then, the MO-VPE apparatus is used on this GaN substrate, crystal growth processes required for an LD device are performed, one by one, and, thus, the LD device is produced. Consequently, it becomes possible to solve the above-mentioned problems concerning the insulating property and cleavage by using the sapphire substrate in addition to solving the problem concerning the crystal defects.

A similar method is disclosed by Japanese Laid-Open Patent Application No. 11-4048 and FIG. 2 shows a device configuration according to this method.

However, the process is more complicated in the second prior art, and, requires higher costs, in comparison to the first prior art. Moreover, in growing the no less than 200 micrometer GaN thick film by the method of the second prior art, a stress occurring due to a lattice constant difference and an expansivity difference from the sapphire of the substrate becomes larger, and a problem that the curvature and the crack of the substrate may newly occur. Moreover, even by performing such a complicated process, the crystal defect density can be reduced to only on the order of $10^6/cm^2$. Thus, it is not possible to obtain a practical semiconductor device.

In order to avoid this problem, setting to 1 mm or more thickness of an original substrate (sapphire and spinel are the most desirable materials as the substrate) from which a thick film grows is proposed by Japanese Laid-Open Patent Application No. 10-256662. According thereto, no curvature nor crack arise in the substrate even when the GaN film grows in 200 micrometers of thickness by applying this substrate having the thickness of 1 mm or more. However, a substrate thick in this way has a high cost of the substrate itself, and it is necessary to spend much time on polish thereof, and leads to the further cost rise of the polish process. That is, as compared with the case where a thin substrate is used, the cost becomes higher by using the thick substrate. Moreover, although no curvature nor crack arise in the substrate after growing up the thick GaN film in using the thick substrate, curvature and/or crack may occur as stress relief occurs during the process of polish. By this reason, even when the thick substrate is used, the GaN substrate having a high crystal quality and having such a large area that it can be practically used for an ordinary semiconductor device manufacturing process cannot be easily produced.

A document 'Journal of Crystal Growth, Vol. 189/190, pages. 153-158 (1998)' (referred to as a third prior art, hereinafter) discloses that a bulk crystal of GaN is made grow up, and it is used as a homoepitaxial substrate. According to this technique, under the high temperature in the range between 1400 and 1700° C., and under the very high nitrogen pressure of 10 kilobars, crystal growth of the GaN is performed from a Ga liquid. In this case, it becomes possible to grow up a group-III nitride semiconductor film required for a device by using this GaN substrate. Therefore, it is possible to provide the GaN substrate without needing a process complicate like in the above-described first and second prior arts.

However, by this third prior art, crystal growth in high temperature and high pressure is needed, and, thus, there is a problem that a reaction vessel which can resist these conditions should be very expensive. In addition, even when such a growth method is employed, the size of the crystal obtained has the problem of being too small, i.e., at most on the order of 1 cm, and, thus, it is too small to put it in practical use of semiconductor device manufacture.

The GaN crystal growth method using Na which is an alkaline metal as a flux is proposed by a document 'Chemistry of Materials, Vol. 9 (1977), pages 413-416' (referred to as a fourth prior art, hereinafter) as a technique of solving the problem of GaN crystal growth in the above-mentioned high temperature and high pressure. According to this technique, sealing sodium azide ($NaN_3$) and Ga metal used as a flux and a material into a reaction vessel made from stainless steel (vessel inner dimension: diameter=7.5 mm and length=100 mm) in nitrogen atmosphere, and the reaction vessel is maintained in the temperature in the range between 600 and 800° C. for 24 to 100 hours to grow up a GaN crystal. In the case of this fourth prior art, crystal growth at the comparatively low temperature in the range between 600 and 800° C. can be achieved, and, also, the require pressure inside the vessel should be only on the order of 100 $kg/cm^2$, which is comparatively lower than the case of the third prior art. However, in this fourth prior art, the size of the crystal obtained is small as less than 1 mm which is too small to be put into practical use in semiconductor device manufacture, like in the case of the third prior art.

Therefore, the applicant of the present application has proposed a method of enlarging a group-III nitride crystal. However, in the method, nucleus generation initiates of the crystal growth is natural nucleus generation, and, thus, a large number of nucleus are undesirably generated. In order to control this nucleus generation, the applicant has proposed to utilize a seed crystal in the U.S. patent application Ser. No. 09/590, 063, filed on Jun. 8, 2000, by Seiji Sarayama et al. (the entire contents of which are hereby incorporated by reference). However, there is a problem that a required crystal growth apparatus becomes complicated. Therefore, it has been demanded to realize a method for effectively controlling nucleus generation, while achieving a simple apparatus configuration of a conventional flux method, in order to solve this problem.

Further, Japanese Laid-Open Patent Application No. 2000-327495 discloses a fifth prior art combining the above-mentioned fourth prior art and an epitaxial method utilizing a substrate. In this method, a substrate on which GaN or AlN is grown previously is used, and, thereon, a GaN film according to the fourth prior art is grown. However, in this method, as it is basically the epitaxial method, the problem of crystal defects occurring in the above-mentioned first and second prior arts cannot be solved. Further, as the GaN film or AlN film should be grown on the substrate previously, the process becomes complicated, and, thereby, the costs increase.

Furthermore, recently, Japanese Laid-Open Patent Applications Nos. 2000-12900 and 2000-22212 disclose a sixth prior art in which a GaAs substrate is used and a GaN thick-film substrate is produced. In this method, a GaN film having a thickness in a range between 70 µm and 1 mm is selectively grown on a GaAs substrate by using an $SiO_2$ film or SiN film as a mask as in the above-mentioned first prior art, as shown in FIGS. 3A through 3C. The crystal growth there is performed by the H-VPE apparatus. Then, the GaAs substrate is etched and thus removed by using aqua regia. Thus, the GaN self-standing substrate is produced, as shown in FIG. 3D. By using this GaN-self standing substrate, a GaN crystal having a thickness of several tens of millimeters is grown by vapor phase epitaxy by the H-VPE apparatus again, as shown in FIG. 4A. Then, this GaN crystal of several tens millimeters is cut into wafer shapes by a slicer, as shown in FIG. 4B. Thus, GaN wafers are produced, as shown in FIG. 4C.

According to this sixth prior art, the GaN self-standing substrate can be obtained, and, also, the GaN crystal having the thickness of several tens of millimeters can be obtained. However, this method has the following problems:

①  As the SiN film or $SiO^2$ film is used as a mask for selective growth, the manufacturing process becomes complicated, and, thus, the costs increase;

②  When the GaN crystal having the thickness of several tens of millimeters is grown by the H-VPE apparatus, GaN crystals (in monocrystal or polycrystal) or amorphous GaN having a similar thickness adhere to the inner wall of the reaction vessel. Accordingly, the productivity/yield is degraded thereby.

③ As the GaAs substrate is etched and removed every time of the crystal growth as a sacrifice substrate, the costs increase thereby.

④  With regard to the crystal quality, problems of lattice mismatch due to crystal growth on a different-substance substrate, and a high defect density due to difference in expansivity remain.

SUMMARY OF THE INVENTION

An object of the present invention is to achieve a group-III nitride crystal having a sufficient size, requiring low costs, and having a high quality, such that a semiconductor device, such as a high-efficient light emitting diode or LD can be produced therefrom, without complicating the process which is the problem in the above-mentioned first or second prior art, without using an expensive reaction vessel which is the problem in the third prior art, and without provision of insufficient size of the crystal which is the problem in the third and fourth prior arts, and, also, solving the above-mentioned problems in the fifth and sixth prior arts, and a crystal growth method and a crystal growth apparatus by which such a group-III nitride crystal can be manufactured, and a high-performance group-III nitride semiconductor device.

A group-III nitride crystal growth method according to the present invention includes the steps of:
a) preparing a mixed molten liquid of an alkaline material and a substance at least containing a group-III metal;
b) causing growth of a group-III nitride crystal from the mixed molten liquid prepared in said step a) and a substance at least containing nitrogen; and
c) creating a state in which nitrogen can be easily introduced into the mixed molten liquid in said step b) prepared by said step a).

In order to create the state in which nitrogen can be easily introduced into the mixed molten liquid, the surface of the mixed molten liquid should be avoided from being completely covered by a solid matter of polycrystalline or amorphous group-III nitride. For this purpose, the purities of the alkaline metal, the substance containing the group-III metal and the substance containing nitrogen applied are ensured sufficiently high. Further, for this purpose, it is also important to apply a material having a high purity as a portion of a mixed molten liquid container/reaction vessel contacting the mixed molten liquid.

According to another aspect of the present invention, a device enabling observation of the inside of the reacting vessel in which group-III nitride crystal growth occurs is provided. Thereby, it is possible to observe the state of crystal growth, and, thus, it is possible to finish the operation performed for the crystal growth in an appropriate timing after confirming completion of the crystal growth, and, then, take out the thus-yielded crystals at an appropriate timing. Accordingly, it is possible to perform crystal growth operation efficiently. In this regard, it is preferable to provide a device of avoiding a problem of transparency loss on the observation device by means of, for example, supplying a nitrogen gas onto the observation device so as to avoid the mist or the like of alkaline metal from staying calm in the vicinity of the observation device, or by means of previously coating onto the inner surface of the observation device the group-III nitride material.

According to another aspect of the present invention, a plurality of crystal growth zones are prepared, alkaline metal is transported therebetween at appropriate timing, and, then, crystal growth is made to occur in each zone to which the alkaline metal is thus transported, in sequence. Accordingly, it is possible to efficiently use the alkaline metal material. Furthermore, as the alkaline metal is transported in gas phase, the purity thereof can be improved by the function of distillation. Thereby, it is possible to yield high-purity group-III nitride crystals.

According to another aspect of the present invention, a material container holding the group-III metal material is provided separate of the mixed molten liquid container, outside of the reaction vessel. Then, a device is provided to continuously and stably feed the group-III metal material to the mixed molten liquid container inside of the reaction vessel. Accordingly, it is possible to achieve crystal growth in a condition in which the ratio of the group-III metal material in the mixed molten liquid container is fixed by appropriately controlling the material feeding rate so that the group-III metal material consumed by the crystal growth reaction be properly supplemented. Thereby, it is possible to yield low-defect-density, i.e., high-quality, group-III nitride crystals.

As the above-mentioned device for stably and continuously feeding the group-III metal material, a device of communication system for providing communication between the reaction vessel and material container may be provided such that the group-III metal material in liquid phase can be fed automatically by gravity. In this case, it is preferable to provide a device of enabling observation of the remaining amount of the material in the material container, and also, to provide a mechanism of controlling the height of the material container with respect to the mixed molten liquid container. Then, the height of the material container is appropriately controlled so that level difference between the surface of the mixed molten liquid in the mixed molten liquid container and the surface of the group-III metal material in the material container is appropriately controlled. Thereby, it is possible to control the material feeding rate to be constant.

Alternatively, a pump device may be provided so as to forcibly feed the group-III metal material to the mixed molten liquid container constantly and stably. This device may employ a reciprocating rod member which performs reciprocation action together with check valves. Then, as a room pressure is increased and decreased alternately, the drawing check valve and feeding check valve accordingly operate alternately so that the material is fed properly through this room.

Further alternatively, decomposing of group-III nitride is utilized. That is, first, group-III nitride fine crystals are yielded, then, these powder crystals are used as materials for producing group-III metal material and/or nitrogen material obtained through decomposition. Specifically, by appropriately controlling the temperatures of a first container preparing the material group-III nitride fine crystals and a second container yielding final-product large-sized group-III nitride crystals, the material fine crystals are first yielded in the first container, the material is then fed into the second container previously holding the alkaline metal, and, then, crystal growth of final-product large-sized crystals occurs in the second container. Thereby, material feeding can be made easily and positively, merely by appropriately controlling the temperatures of the two containers, and, thus, it is possible to yield high-quality group-III nitride crystals at low cost.

BRIEF DESCRIPTION OF THE DRAWINGS

Other objects and further features of the present invention will become more apparent from the following detailed description when read in conjunction with the accompanying drawings:

FIGS. 15A and 15B illustrate a group-III nitride crystal growth apparatus in a sixth embodiment of the present invention;

FIG. 30 illustrates details of a material feeding pump shown in FIG. 29;

FIG. 32 illustrates a group-III nitride crystal growth apparatus in a thirteenth embodiment of the present invention.

DETAILED DESCRIPTION OF THE PREFERRED EMBODIMENTS

Figure 5:
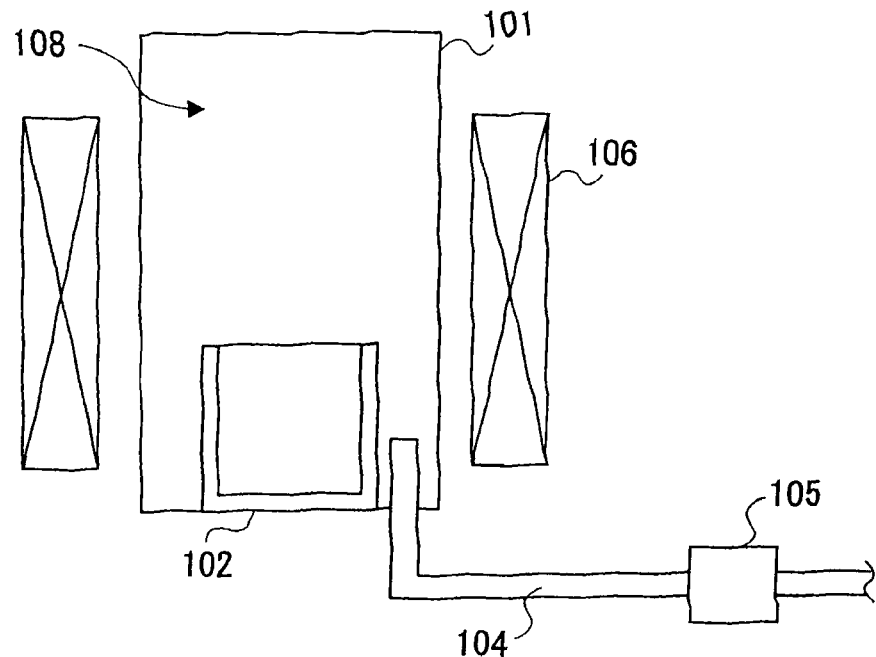
FIG. 5 illustrates a group-III nitride crystal growth apparatus in any of first, second, third, and fourth embodiments of the present invention.

FIG. 5 shows a group-III nitride growth apparatus in a first embodiment of the present invention. As shown in FIG. 5, in a reaction vessel 101, a mixed molten liquid holding container 102 holding a mixed molten liquid containing an alkaline metal (for example, Na) and a substance at least containing group-III metal (for example, Ga) is provided.

The substance including the alkaline metal and group-III metal may be supplied from the outside, or may exist in the reaction vessel 101 from the beginning.

The reaction vessel 101 is formed by stainless steel.

Moreover, a nitrogen supply pipe 104 for supplying substance at least containing nitrogen (for example, nitrogen gas, ammonia gas, or sodium azide) to a space 108 in the reaction vessel 101 is provided in the reaction vessel 101.

In the present invention, the 'nitrogen' means nitrogen molecules, nitrogen molecules or nitrogen atoms generated from a compound containing nitrogen, or atom groups or molecule groups containing nitrogen.

A pressure adjustment mechanism 105 is provided in order to adjust the pressure of nitrogen gas in the nitrogen supply pipe 104. This pressure adjustment mechanism 105 includes a pressure sensor, a pressure adjustment valve, etc.

Moreover, a heating device 106 for controlling the temperature in the inside of the reaction vessel 101 to the temperature at which crystal growth of group-III nitride (for example GaN can occur is provided in the reaction vessel 101. That is, by means of a temperature control function of the heating device 106, control operation such as raising the temperature in the inside of reaction vessel 101 to the temperature at which the crystal growth can occur, lowering to the temperature at which the crystal growth stops, and keeping these states for arbitrary time intervals, respectively, can be achieved. For the details, please see U.S. patent application Ser. No. 09/981,848, filed on Oct. 16, 2001 by the same applicant of the present application. The entire contents of this application Ser. No. 09/981,848 are hereby incorporated by reference.

The crystal growth of group-III nitride can be started to occur as a result of the temperature and effective nitrogen partial pressure in the reaction vessel 101 being set into conditions such that the group-III nitride crystal can grow.

By the above-described group-III nitride crystal growth apparatus and group-III nitride growth method, a mixed molten liquid of an alkaline metal and a substance at least containing a group-III metal is formed in a predetermined container, and, from the mixed molten liquid and a substance containing nitrogen, crystal growth of group-III nitride containing the group-III metal and nitrogen is made to occur. Accordingly, no complicated processes as in the above-mentioned first or second prior art are needed, but high-quality group-III nitride crystal can be obtained at low costs.

Furthermore, as crystal growth can be made to occur by easy requirements such as the growth temperature as low as 1000 degrees C. or less, and also, the required pressure as low as less than 100 atmospheres, it is not necessary to employ a reaction vessel which should bear super high pressure and super high temperature and thus costing much as in the above-mentioned third prior art. Consequently, it is possible to produce group-III nitride crystals at low cost.

In the group-III nitride crystal growth apparatus as shown in FIG. 5, when there are many impurities in the substance containing the alkaline metal and/or the group-III metal, the substance containing nitrogen, or the predetermined container containing the mixed molten liquid, these impurities may become nucleuses or they may cause a catalyst-action, and thereby, a solid matter may be produced therefrom so as to cover the surface of the mixed molten liquid including the alkaline metal and substance at least containing the group-III metal. If the surface of the mixed molten liquid is much covered by this solid matter, dissolution of the nitrogen into the mixed molten liquid is obstructed after that, and, thus, the crystal growth of group-III nitride crystal may not progress well.

The inventors of the present invention found out that the cause of generation of such a solid matter covering the surface of the mixed molten is mainly of the group-III nitride (the solid matter being of the group-III nitride polycrystalline or amorphous), which is generated from impurities contained in the alkaline metal, impurities contained in the substance at least containing group-III metal, impurities contained in the substance containing nitrogen, and/or impurities in the container containing the mixed molten (impurities on the surface of the container or those coming from the inside of the container).

According to the present invention, based on the above-mentioned fact thus found out, growth of group-III nitrogen crystals is made to occur in a condition in which nitrogen can be positively introduced into the surface of the mixed molten liquid during a process of group-III nitride crystal growth made from the mixed molten liquid prepared from alkaline metal and a substance at least containing a group-III metal, and a substance containing nitrogen.

In detail, an object of the present invention is to effectively prevent the entire surface of the mixed molten liquid from being covered by a solid matter generated from impurities contained in the alkaline metal, impurities contained in the substance at least containing group-III metal, impurities contained in the substance containing nitrogen, and/or impurities in the container containing the mixed molten (impurities on the surface of the container or those coming from the inside of the container).

For this purpose, according to the present invention, the purity of the alkaline metal, the purity of the substance at least containing group-III metal, and/or the purity of the substance containing nitrogen are made to be increased into those required for preventing the whole surface of the mixed molten liquid from being covered by polycrystalline or amorphous group-III nitride.

Specifically, according to an experiment made by the inventors of the present invention, when the purity of the alkaline metal is less than 99%, a solid matter covers the surface of the mixed molten liquid. On the other hand, an area of the surface of the mixed molten liquid covered by the solid matter can be effectively reduced when the purity of the alkaline metal is 99% or more.

Furthermore, according to the experiment, when the purity of the alkaline metal is 99.9% or more, an area of the surface of the mixed molten liquid which the solid matter covers can be further effectively reduced.

Furthermore, when the purity of the alkaline metal became 99.95% or more, there is almost no solid matter covering the surface of the mixed molten liquid. Generally speaking, the highest purity of generally available alkaline metal is 99.95%.

Moreover, preferably, the purity of the substance containing group-III metal, and the purity of the substance containing nitrogen should also be increased.

Furthermore, preferably, the predetermined container containing the mixed molten liquid to be used should be made of a material having a higher purity.

For example, the predetermined container may be made of BN (boron nitride). Alternatively, the predetermined container may be made of AlN (aluminum nitride). Alternatively, the predetermined container may be made of pyrolytic BN. Moreover, since the pyrolytic BN has impurities less than those of BN, the pyrolytic BN is further preferable.

The pyrolytic BN is also called 'PBN' (Pyrolytic Boron Nitride), and is usually combined through CVD (Chemical Vapor Deposition) of boron chloride and ammonia. The PBN has fewer impurities as compared with BN produced by sintering (Hot Press) which has generally spread, and PBN has a high purity. That is, generally speaking, BN in form of sintered material contains some percentage of $B_2O_3$, CaO, $SiO_2$ and so forth. In contrast thereto, the PBN contains a content of those impurities smaller than that of BN.

According to the experiment, a tendency of the solid matter covering the surface of the mixed molten liquid can be reduced effectively more in a case of employing the PBN container than in a case of employing the BN container according to the same conditions.

Thus, according to the present invention, by reducing the impurities contained in the alkaline metal, the impurities contained in the substance which contains group-III metal at least, the impurities contained in the substance containing nitrogen and/or the impurities of the predetermined container (impurities which come out from the surface of the predetermined container, or the inside of the predetermined container) which contains the mixed molten liquid, it is possible to prevent the whole surface of the mixed molten liquid from being covered by the solid matter. Thereby, continuous dissolution of the nitrogen into the mixed molten liquid can be achieved, and thus, continuous crystal growth of group-III nitride crystal can be achieved. Furthermore, consumption in the mixed molten liquid on the surface of the mixed molten liquid can be lessened because the group-III metal which may be used to generate the solid matter decreases, and thus, it becomes possible to increase the amount of the group-III metal fed to grow the group-III nitride crystal in the mixed molten liquid. Thereby, it is possible to achieve crystal growth of the group-III nitride crystal in a desired sufficient size.

Figure 6:
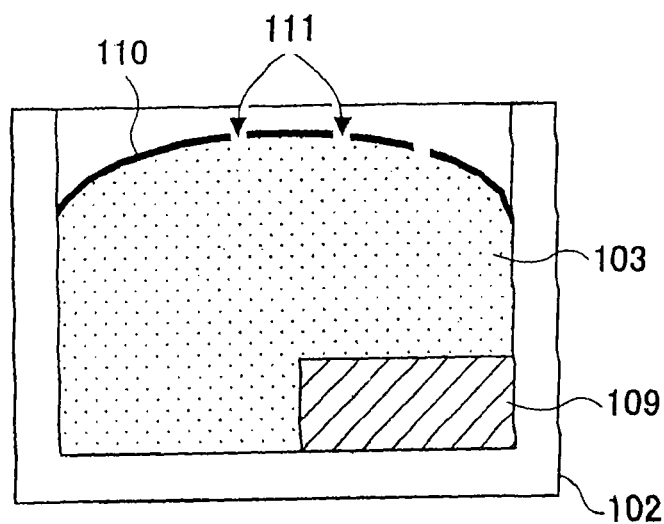
FIG. 6 illustrates an effect of the first embodiment of the present invention.

A first embodiment of the present invention will now be described. According to the first embodiment, as shown in FIG. 6, the mixed molten liquid 103 which contains Ga as the group-III metal and Na as the alkaline metal is held by the mixed molten liquid holding container 102.

In the first embodiment, Ga as the group-III metal has 99.9999% of purity, and Na as the alkaline metal has 99% of purity.

Moreover, in the first embodiment, the purity of a nitrogen gas supplied via a nitrogen supply pipe 104 shown in FIG. 5 is 99.999%. The material of the mixed molten liquid holding container 102 is BN (boron nitride) in a form of sintered material. When carrying out crystal growth of the group-III nitride in this group-III nitride crystal growth apparatus, the following process is executed: The pressure of the nitrogen gas in the reaction vessel 101 is made into 50 atmospheres, and the temperature in the reaction vessel 101 is increased into the temperature of 750 degrees C. by which the crystal growth starts. Then, these growth conditions are maintained, and, thereby, as shown in FIG. 6, the GaN crystal 109, which is the group-III nitride grows in the mixed molten liquid holding container 102.

Although the surface of the mixed molten liquid 103 is covered by the solid matter 110, holes 111 exist at some places of this solid matter 110, at each of which the solid matter 110 does not cover the surface of the mixed molten liquid 103. Thereby, the nitrogen can dissolve into the mixed molten liquid 103 through the holes 111.

The degree of the solid matter 110 covering the surface of mixed molten liquid 103 depends on the purity of Na, the purity of Ga, the purity of nitrogen gas, and the quality of the material of the mixed molten liquid holding container 102. Among those, the degree of the solid matter 110 covering the surface of the mixed molten liquid 103 depends on the purity of Na by the largest percentage according to the experiment. Moreover, according to an analysis, it has been found that the majority of the solid matter 110 covering the surface of mixed molten liquid 103 is polycrystalline GaN or amorphous GaN.

As described above, according to the first embodiment, the purity of Na is 99%, the purity of Ga is 99.9999%, the purity of nitrogen gas is 99.999% and the mixed molten liquid holding container 102 is made of BN in a form of sintered material, and, thereby, as shown in FIG. 6, the solid matter 110 formed on the surface of the mixed molten liquid 103 has the holes 111 therein. Thus, the nitrogen dissolves into the mixed molten liquid 103 through the holes 111, the crystal growth of the single-crystal GaN 109 as the group-III nitride can be made well in the mixed molten liquid 103.

A second embodiment of the present invention will now be described with reference to FIG. 7. As in the above-described first embodiment, the second embodiment uses the same group-III nitride crystal growth apparatus shown in FIG. 5. However, the purity of Ga as the group-III metal used is 99.9999%, the purity of nitrogen gas used is 99.9999%, and the quality of the material of the mixed molten liquid holding container 102 used is BN in a form of sintered material. The growth conditions, such as the temperature, pressure and so forth are the same as in the first embodiment.

Differently from the first embodiment, the purity of Na as the alkaline metal 99.9% according to the second embodiment of the present invention, while, according to the first embodiment, Na as the alkaline metal has 99% of purity. According to the second embodiment, the state in the mixed molten liquid holding container 102 becomes as shown in FIG. 7.

Figure 7:
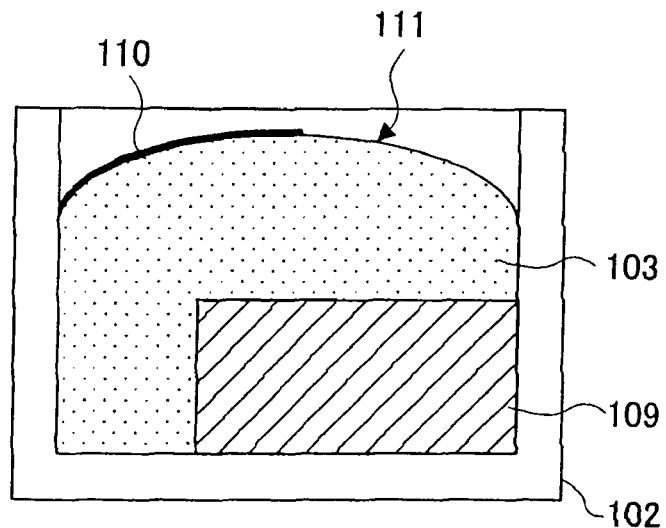
FIG. 7 illustrates an effect of the second embodiment of the present invention.

That is, as the nitrogen gas pressure and temperature are set as in the first embodiment, and the growth conditions are maintained, crystal growth of the GaN single crystal 109 which is the group-III nitride is performed in the mixed molten liquid 103, while, as to the surface of mixed molten liquid 103 in the mixed molten liquid holding container 102, approximately half the entire surface of the mixed molten liquid 103 is covered by the solid matter 110 according to the second embodiment as shown in FIG. 7. Specifically, according to particular cases, the rates of the area covered by this solid matter 110 differ. However, in any case, a larger area is left on the surface of the mixed molten liquid 103 not having the solid matter 110 than in the case of the first embodiment in which merely holes are left not having the solid matter 110.

The nitrogen dissolves into the mixed molten liquid 103 through the area 111 having no solid matter 110 on the surface of this mixed molten liquid 103, and crystal growth of the Ga—N crystal 109 is made to proceed. According to the second embodiment, it becomes possible to grow up a larger GaN single crystal 109 as the area 111 having no solid matter 110 is wider on the surface of this mixed molten liquid 103 as compared with the first embodiment. Namely, as generation of the solid matter 110 produced mainly from polycrystalline or amorphous GaN is reduced, the GaN contained in the mixed molten liquid 103 contributes to the growth of the desired GaN single crystal 109 more efficiently. Furthermore, generation of many nucleuses can be prevented from growing equally, but the nitrogen is preferentially taken in by a single larger nucleus, and growth of the large GaN single crystal is attained, as the dissolution rate of the nitrogen is thus higher.

Thus, according to the second embodiment, the solid matter 110 which covers the surface of mixed molten liquid 103 decreases by raising the purity of Na rather into 99.9% in comparison to the first embodiment. Thereby, it becomes possible to carry out crystal growth for a larger GaN single crystal 109.

A third embodiment of the present invention will now be described. According to the third embodiment, crystal growth is performed by the basically same method as in the first and second embodiments described above using the same group-III nitride crystal growth apparatus shown in FIG. 5.

According to the third embodiment, the purity of Ga as the group-III metal is 99.9999%, the purity of nitrogen gas is 99.9999%, and the material of the mixed molten liquid holding container 102 is BN in a form of sintered material. The growth conditions, such as the temperature and pressure, are the same as those in the first and second embodiments.

Figure 8:
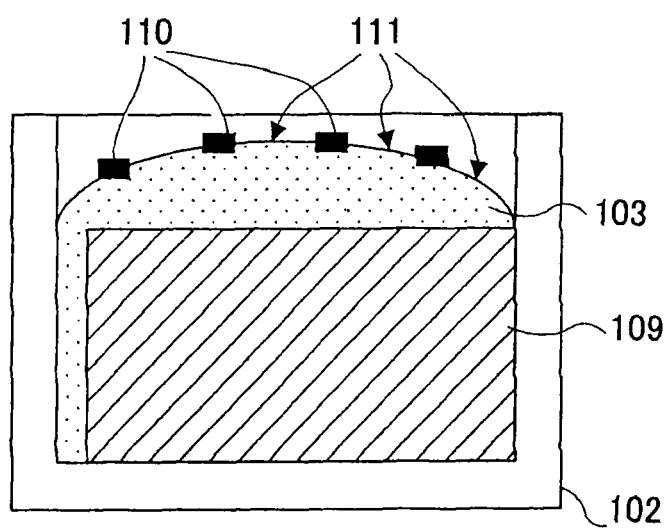
FIG. 8 illustrates an effect of the third embodiment of the present invention.

Differently from the first and second embodiments, the purity of Na as the alkaline metal is made 99.95% according to the third embodiment. In this case, the state in the mixed molten liquid holding container 102 becomes as shown in FIG. 8.

That is, the nitrogen gas pressure and temperature are set as in the first and second embodiments, the growth conditions are maintained. Then, growth of the GaN single crystal 109 which is the group-III nitride is performed in the mixed molten liquid 103. However, according to the third embodiment, it is only dotted parts of the solid matter 110 on the surface of the mixed molten liquid 103 in the mixed molten liquid holding container 102. There are many rates of total area of the solid matter 110 covering the mixed molten liquid 103. However, it is maximum approximately 10%. Accordingly, the areas where the solid matter 110 covers according to the first embodiment approximately corresponds to the areas having no solid matter 110 according to the third embodiment.

The nitrogen dissolves better into the mixed molten liquid 103 through the areas 111 having no solid matter 110 on the surface of the mixed molten liquid 103, and crystal growth of the GaN crystal 109 is made to proceed better. According to the third embodiment, it becomes possible to grow up a further larger GaN single crystal 109 because there are still more areas 111 having no solid matter 110 on the surface of the mixed molten liquid 103 than in the first and second embodiments. Namely, generation of polycrystalline or amorphous GaN forming the solid matter 110 is effectively reduced, and thereby, Ga in the mixed molten liquid 103 contributes to growth of the desired GaN single crystal 109 more efficiently. Furthermore, generation of many nucleuses having equal sizes is prevented, but the nitrogen is preferentially taken in by a single larger nucleus, and growth of the larger GaN single crystal is attained because the dissolution rate of the nitrogen is further larger.

Thus, according to the third embodiment, the solid matter 110 which covers the surface of the mixed molten liquid 103 is reduced by raising the purity of Na into 99.95%, higher than in the first and second embodiments, and it becomes possible to carry out crystal growth for a further lager GaN single crystal 109.

A fourth embodiment of the present invention will now be described. Also in the fourth embodiment, crystal growth is performed by basically the same method as in the first through third embodiments using the same group-III nitride crystal growth apparatus shown in FIG. 5.

The purity of Ga as the group-III metal used is 99.9999%, and the purity of nitrogen gas used is 99.9999%, and also, the growth conditions such as the temperature, pressure, and so forth are the same as the first through third embodiments.

Figure 9:
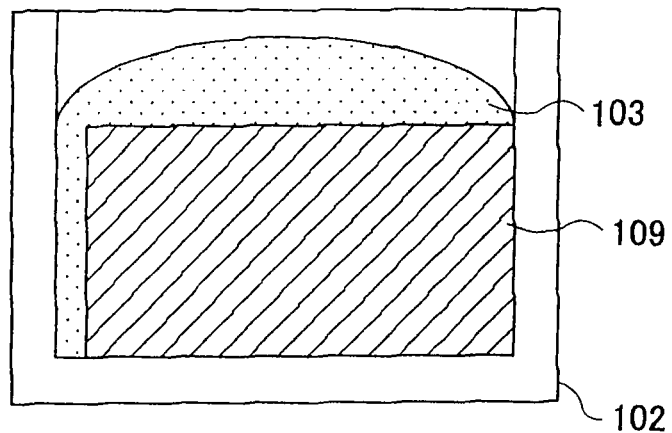
FIG. 9 illustrates an effect of the fourth embodiment of the present invention.

Different from the first through third embodiments, the purity of Na as the alkaline metal is 99.95% or more, and also, different from the first through third embodiments, the material of the mixed molten liquid holding container 102 is made by pyrolytic BN according to the fourth embodiment. In this case, the state in the mixed molten liquid holding container 102 becomes as shown in FIG. 9.

That is, also in the fourth embodiment, the nitrogen gas pressure and temperature in the reaction vessel 101 are set as in the first through third embodiments, and the growth conditions are maintained. Then, growth of the GaN single crystal 109 which is the group-III nitride is performed in the mixed molten liquid 103, the solid matter 110 which exists in the first through third embodiments does not exist on the surface of mixed molten liquid 103 in the mixed molten liquid holding container 102. That is, according to the fourth embodiment, there is nothing that interrupts dissolution of the nitride into the mixed molten liquid 103. Therefore, it becomes possible to that crystal growth of the GaN crystal 109 proceeds more smoothly.

Thus, according to the fourth embodiment, it becomes possible to grow up a larger GaN single crystal 109 because there is no solid matter 110. That is, contribution of Ga in mixed molten liquid 103 to the growth of the desired GaN single crystal 109 can be made more efficiently because there is no generation of the solid matter 110 otherwise by which the polycrystalline or amorphous GaN would form the solid matter 110. Furthermore, generation of many nucleuses having uniform sizes is prevented, but the nitrogen is preferentially taken in by a single larger nucleus, and growth of the larger GaN single crystal is attained, because the dissolution rate of nitrogen is larger.

Thus, according to the fourth embodiment, occurrence of the solid matter 110 which covers the surface of the mixed molten liquid 103 is avoided by raising the purity of Na into 99.95% or more, in comparison to the first through third embodiments, and, also, making the material of the mixed molten liquid holding container 102 of pyrolytic BN different from the first through third embodiments. Thereby, it becomes possible to carry out crystal growth for a further lager GaN single crystal 109. Moreover, as pyrolytic BN is used, and also, the Na purity is high, the impurities contained in mixed molten liquid 103 can be made effectively reduced, and thus, the crystal quality of the GaN single crystal 109 obtained also can be improved.

Although Na is used as the alkaline metal in the above-descried embodiments, it is also possible to use another alkaline metal, such as K (potassium). Moreover, although Ga is used in the above-described embodiments as the substance which contains group-III metal at least, it is also possible to use a GaNa alloy or another group-III metal as Al or In. Moreover, in above-mentioned embodiments, as the substance which contains nitrogen at least, nitrogen gas ($N_2$) is used. However, ammonia gas, sodium azide ($NaN_3$), etc. can also be used instead.

Moreover, although BN is used as the material of the mixed molten liquid holding container 102 in the first through third embodiments, AlN can also be used for the same purpose instead of BN. However, as the material of the mixed molten liquid holding container 102, BN is better than AlN. Moreover, as the material of the mixed molten liquid holding container 102, pyrolytic BN is further better than BN as in the fourth embodiment.

In other words, the group-III nitride crystal growth apparatus according to any of the first through fourth embodiments of the present invention has at least the mixed molten liquid holding container 102 holding the mixed molten liquid of an alkaline metal and a substance which contains a group-III metal at least, the reaction vessel 101 in which the mixed molten liquid holding container 102 is provided, and the nitrogen introduction mechanism (104,105) for introducing the substance which contains nitrogen at least into the reaction vessel 101. In particular, a portion of the mixed molten liquid holding container 102 where the above-mentioned mixed molten liquid touches the mixed molten liquid holding container 102 should have a sufficient purity with few impurities.

Thus, since the portion where the mixed molten liquid touches the mixed molten liquid holding container 102 has a sufficient purity with few impurities, as the rate of dissolution of impurities into the mixed molten liquid can be reduced thereby, it is possible to prevent the whole surface of mixed molten liquid from being covered by the solid matter, continuous dissolution of the nitrogen into the mixed molten liquid can be achieved thereby, and thus crystal growth of group-III nitride crystal can be made to continue, according to the first through fourth embodiments of the present invention.

Furthermore, in the mixed molten liquid surface, consumption of group-III metal can be lessened because the group-III metal which forms the solid matter decreases, and it becomes possible to supply a much amount of the group-III metal to the group-III nitride crystal in the mixed molten liquid. Thus, it becomes possible to cause the crystal growth greatly to produce a desired size of the group-III nitride crystal. Moreover, the impurities contained in the mixed molten liquid decrease and the crystal quality of the group-III nitride single crystal obtained also can be effectively improved.

Figure 10:
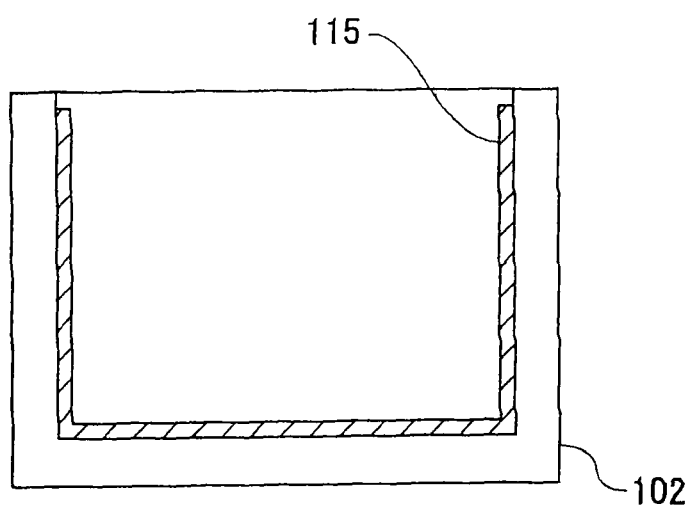
FIG. 10 illustrates a first variant embodiment of any of the above-mentioned first through fourth embodiments of the present invention.

Moreover, as shown in FIG. 10, the group-III nitride 115 (for example, GaN) the same in type as the group-III nitride (for example, GaN) for which crystal growth is carried out through the group-III nitride crystal growth apparatus may be preferably beforehand applied (coated) to the inner wall of the mixed molten liquid holding container 102. In this case, it becomes possible to grow up the group-III nitride crystal (for example, GaN) having high quality in which impurities are further reduced.

Figure 11:
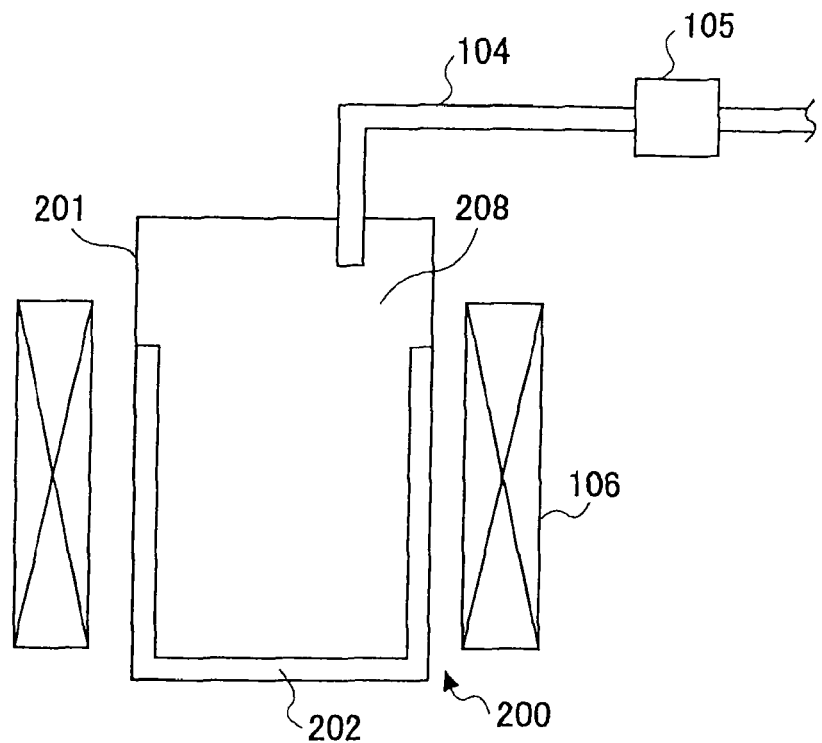
FIG. 11 illustrates a second variant embodiment of any of the above-mentioned first through fourth embodiments of the present invention.

Further, although the mixed molten liquid holding container 102 is formed separately from the reaction vessel 101 in the configuration shown in FIG. 5, it is also possible that the reaction vessel 101 and the mixed molten liquid holding container 102 are integrated into one body, as shown in FIG. 11. FIG. 11 shows a variant example of a configuration of the group-III nitride crystal growth apparatus according to the present invention, also to which each of the above-described first through fourth embodiments may be applied. In FIG. 11, same reference numerals are given to the same parts/components as those shown in FIG. 5.

As shown in FIG. 11, in this configuration, the reaction vessel and the mixed molten liquid holding container shown in FIG. 5 are integrated into a single body in comparison with the configuration shown in FIG. 5. That is, a reaction vessel 200 includes a vessel outer wall 201 and a vessel inner wall 202 for holding the mixed molten liquid substantially.

There, the vessel outer wall 201 is formed by stainless steel corresponding to the reaction vessel 101 of FIG. 5.

Moreover, the inner wall 202 is made by BN, AlN, or pyrolytic BN corresponding to the mixed molten liquid holding container 102 of FIG. 5. However, as the material of the inner wall 202, BN is better than AlN, and further, pyrolytic BN is better than BN as mentioned above.

Moreover, in the configuration of FIG. 11, a nitrogen supply pipe 104 is introduced into the reaction vessel 200 from the top or from the side of the reaction vessel 200. Further, as in the configuration shown in FIG. 5, in order to adjust the pressure of nitrogen gas, a pressure adjustment mechanism 105 is provided in the nitrogen supply pipe 104.

In the group-III nitride crystal growth apparatus shown in FIG. 11, a mixed molten liquid of an alkaline metal (for example, Na) and a substance at least containing a group-III metal (for example, Ga) is formed in the inner wall 202 of the reaction vessel 200. Then, a substance (for example, nitrogen gas, ammonia gas, or sodium azide) which at least contains nitrogen is supplied into a space 208 in the reaction vessel 200 from the nitrogen supply pipe 104. Thus, crystal growth of the group-III nitride (for example, GaN) which includes the group-III metal and nitrogen is made to be performed there.

At this time, as described above, in order to avoid the surface of the mixed molten liquid from being completely covered by polycrystalline or amorphous nitride, the purity of the alkaline metal, the purity of the substance containing group-III metal, and/or the purity of the substance-containing nitrogen are made higher. Thereby, proper crystal growth of the group-III nitride (for example, GaN) can be achieved as in the above-mentioned first, second, third and fourth embodiments.

In other words, the group-III nitride crystal growth apparatus of FIG. 11 includes the reaction vessel 200 holding the mixed molten liquid of the alkaline metal and the substance which contains the group-III metal at least, and nitrogen introduction mechanism (104,105) for introducing the substance which contains nitrogen at least into the reaction vessel 200, and the reaction vessel 200 has the outer wall 201 and inner wall 202 substantially holding the mixed molten liquid. In this configuration, a portion where the mixed molten liquid touches the inner wall 202 has a sufficient purity with few impurities.

Thus, in the group-III nitride crystal growth apparatus shown in FIG. 11, the portion where the mixed molten liquid touches the inner wall 202 of the container 201 has a sufficient purity with few impurities, and, thus, it becomes possible to avoid the surface of the mixed molten liquid from being completely covered by a solid matter. Thereby, continuous dissolution of the nitrogen into the mixed molten liquid can be achieved. Furthermore, consumption of the group-III metal in the mixed molten liquid surface can be lessened because the group-III metal which forms the solid matter decreases, and it becomes possible to supply a more amount of the group-III metal to the group-III nitride crystal in the mixed molten liquid. Thus, it becomes possible to carry out crystal growth so as to yield a required large size of the group-III nitride crystal. Moreover, thereby, the impurities contained in the mixed molten liquid decrease and thus, the crystal quality of the group-III nitride single crystal obtained also improves.

Figure 12:
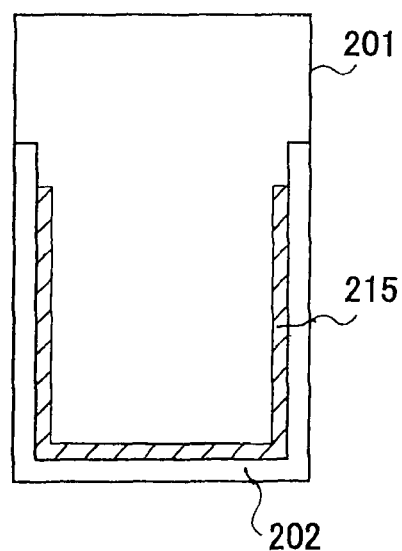
FIG. 12 illustrates a third variant embodiment of any of the above-mentioned first through fourth embodiments of the present invention.

Moreover, as shown in FIG. 12, the group-III nitride 215 (for example, GaN) the same in type as the group-III nitride (for example, GaN) for which crystal growth is carried out through the group-III nitride crystal growth apparatus may be preferably beforehand applied (coated) onto the inner wall 202 of the mixed molten liquid holding container 201. In this case, it becomes possible to grow up the group-III nitride crystal (for example, GaN) having high quality in which impurities are further reduced.

It is noted that the basic concept of the first through fourth embodiments of the present invention, i.e., special provision of a device for creating a state such that the surface the mixed molten liquid containing the alkaline metal and substance containing the group-III metal can be prevented from being covered by a solid matter such as polycrystalline/amorphous group-III nitride may also be applied to any other embodiment of the present invention which will be described later.

Thus, according to the first through fourth embodiments of the present invention, it is possible to produce a high-quality group-III nitride crystal having a large size sufficient such as to be practically used for producing a device such as a high-performance light-emitting diode, laser diode or the like, at low cost.

Accordingly, a high-quality and high-performance group-III nitride semiconductor device can be produced using the thus-obtained high-quality group-III nitride crystal having a practical size. The high-performance device at this time means a device with a large output and a longer life. In case of an electronic device, the high-performance device at this time means a device of low power consumption, low noise, high-speed operation, a high-temperature operation range, while, in case of a photoelectric device, the high-performance device at this time means a device of low noise and long life.

For example, a light-emission device which emits light having a wavelength shorter than 400 nm (light-emission device which has a satisfactory performance even in the ultraviolet zone) as the group-III nitride semiconductor device can be provided. That is, according to the prior art, the light-emission spectrum of a GaN film is such that most of the light-emission is made from a deep level. Accordingly, the device characteristic is not satisfactory for the wavelength shorter than 400 nm. In contrast thereto, according to the present invention, the light-emission device having the satisfactory characteristic also for the ultraviolet zone can be provided. In other words, by employing the high-quality group-III nitride crystal yielded according to the present invention as the substrate, it is possible to achieve a group-III nitride semiconductor device having few crystal defects and few impurities. As a result, it is possible to achieve high-efficiency light-emission characteristics in which light-emission from a deep level is effectively reduced.

Figure 13:
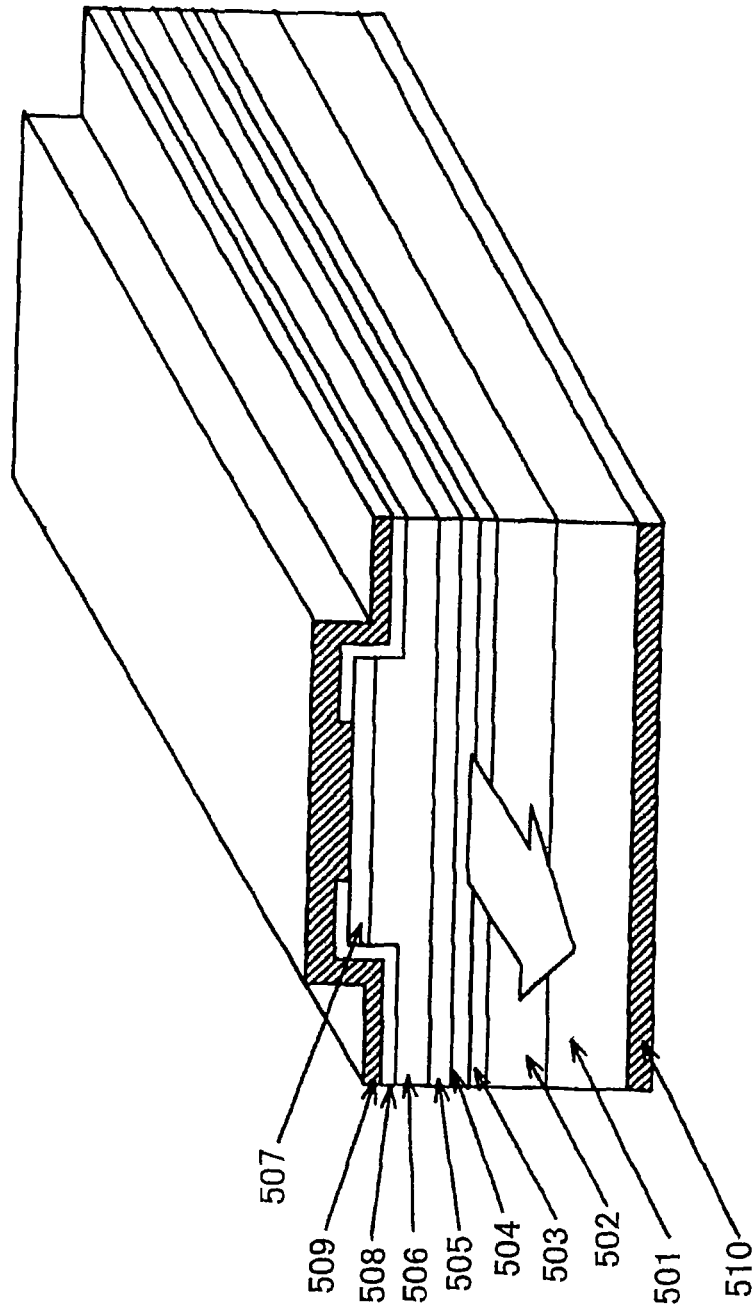
FIG. 13 illustrates an example of a group-III nitride semiconductor device in an embodiment of the present invention produced using a group-III nitride crystal yielded according to any embodiment of the present invention.

FIG. 13 shows an example of configuration of such a semiconductor device according to the present invention. The semiconductor device shown in FIG. 13 is in a form of a semiconductor laser. As shown in the figure, in this semiconductor device, on an n-type GaN substrate 501 using a group-III nitride crystal produced according to any of the crystal growth apparatuses/methods according to the present invention, an n-type AlGaN clad layer 502, an n-type GaN guide layer 503, an InGaN MQW (multiple quantum well) activity layer 504, a p-type GaN guide layer 505, a p-type AlGaN clad layer 506, and a p-type GaN contact layer 507 are formed one by one through crystal growth processes. As a crystal growth method therefor, a thin film crystal growth method, such as an MO-VPE (organometallic vapor phase epitaxy) method, an MBE (molecular beam epitaxy) method, or the like may be applied.

Subsequently, a ridge structure is formed in the laminated films of GaN, AlGaN, and InGaN, SiO$_2$ insulating layer 508 is formed only with a hole formed as a contact region, a p-side ohmic electrode Au/Ni 509, and an n-side ohmic electrode Al/Ti 510 are respectively formed on top and bottom thereof, and thus, a semiconductor device (semiconductor laser) shown in FIG. 13 is formed.

By injecting an electric current from the p-side ohmic electrode Au/Ni 509 and n-side ohmic electrode Al/Ti 510 of this semiconductor laser, it oscillates, and emits laser light in a direction of an arrow shown in FIG. 13.

Figure 1:
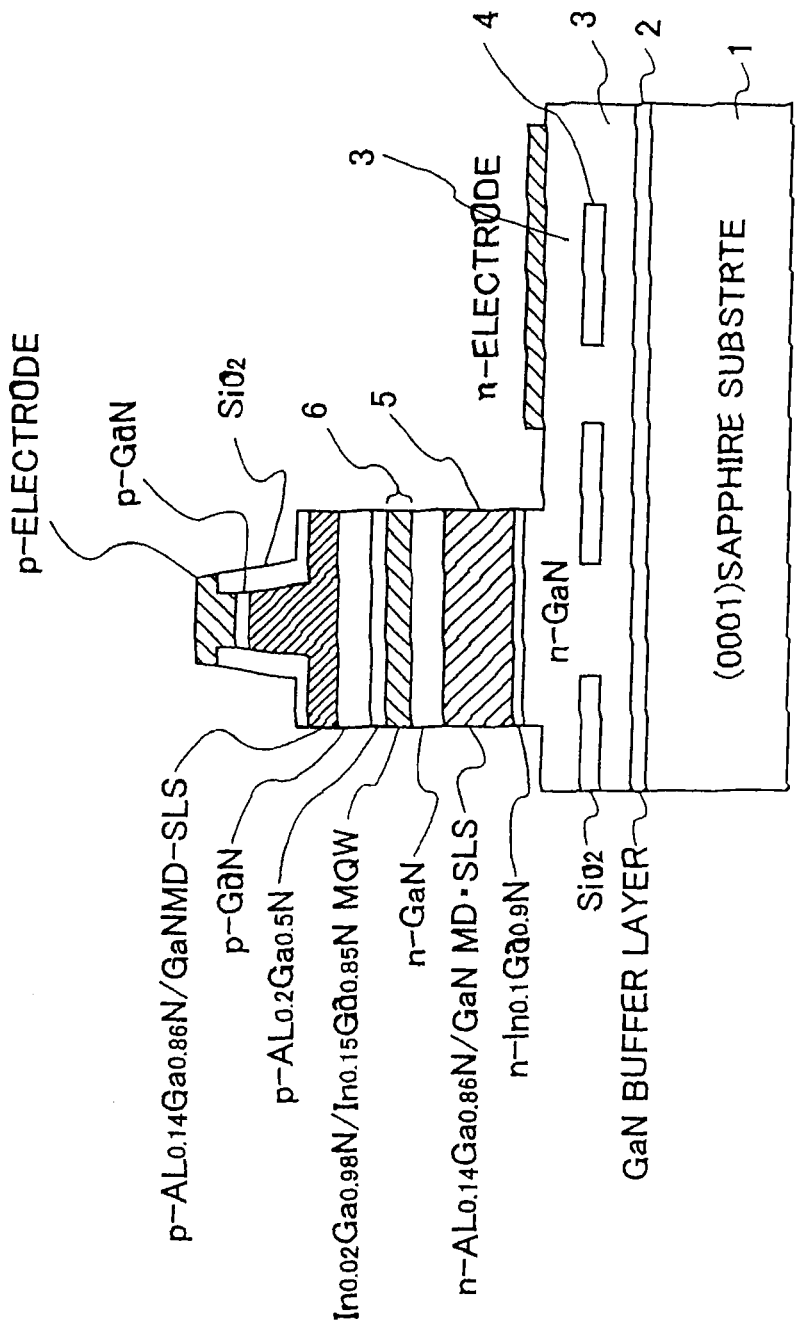
FIG. 1 shows a laser diode in the prior art.
Figure 2:
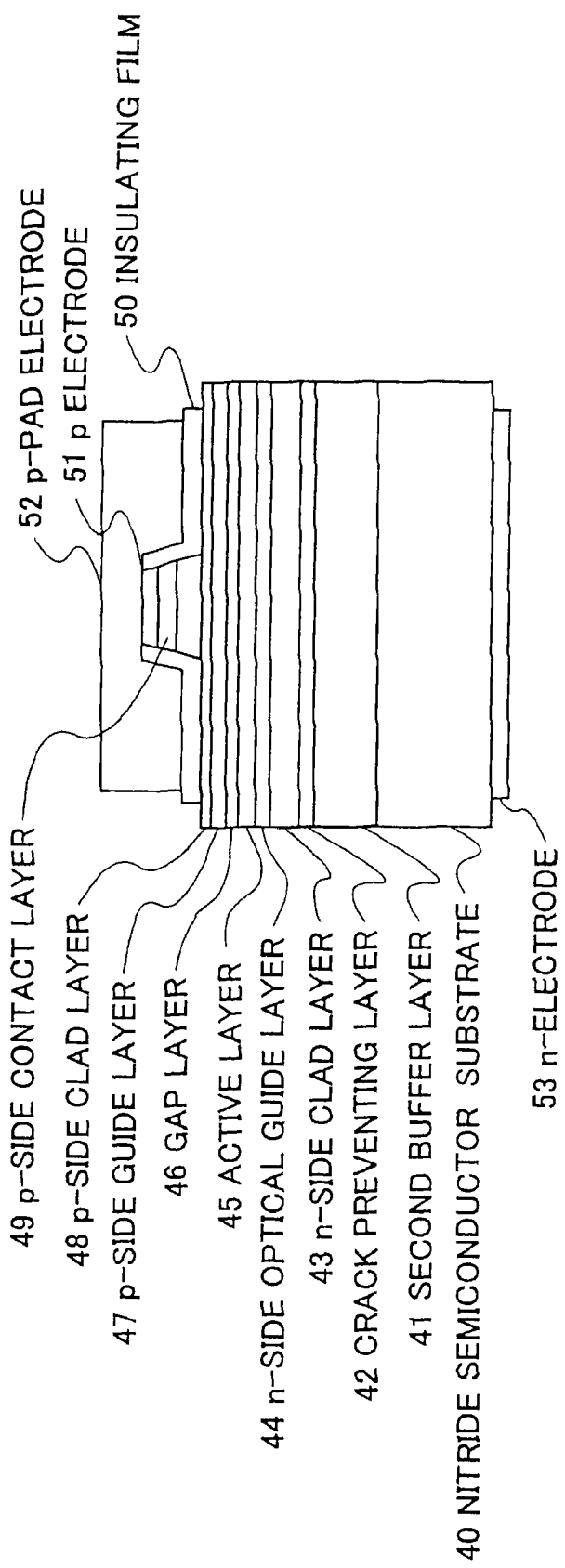
FIG. 2 shows a semiconductor laser in the prior art.
Figure 3A:
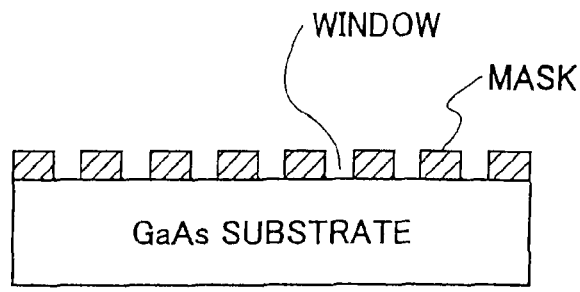
FIGS. 3A through 3D and 4A through 4C illustrate GaN thick film substrate producing process in the prior art.
Figure 3B:
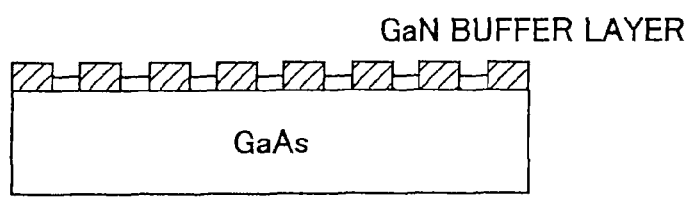
Figure 3C:
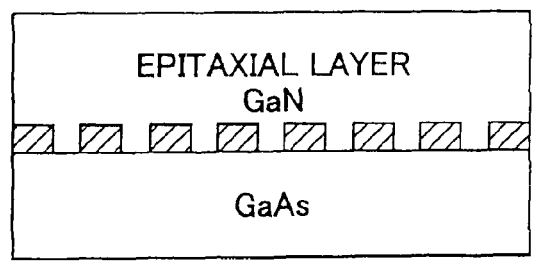
Figure 3D:
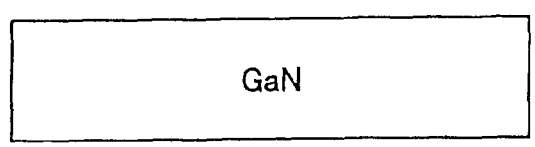
Figure 4A:
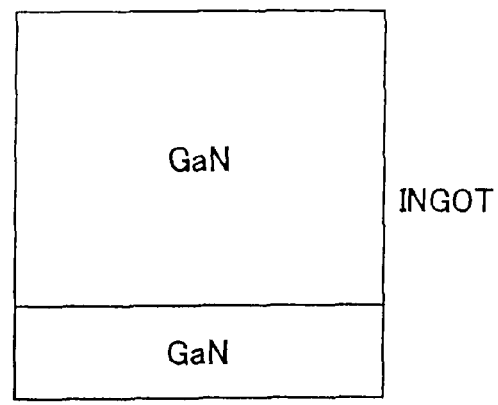
Figure 4B:
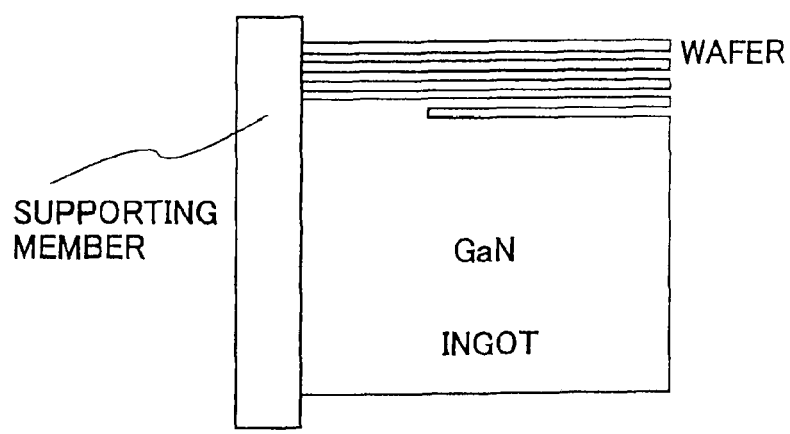
Figure 4C:
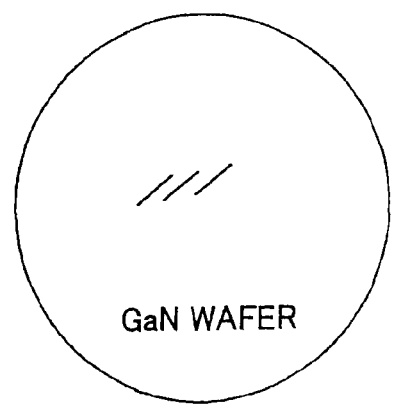

Since the group-III nitride crystal (GaN crystal) according to the present invention is used in this semiconductor laser as the substrate 501, there are few crystal defects in the semiconductor laser device, and it provides a large power output and has a long life. Moreover, since the GaN substrate 501 is of n type, an electrode 510 can be formed directly onto the substrate 501, thus does not need to draw two electrodes of p side and n side only from the obverse surface as in the prior art shown in FIG. 1, and, thus, cost reduction can be achieved.

Furthermore, in the semiconductor device shown in FIG. 13, it becomes possible to form a light emitting end surface by cleavage, also, chip separation can be performed by cleavage. Thus, it is possible to achieve a high-quality semiconductor device at low cost.

In addition, although InGaN MQW is used as the activity layer 504 in the above-mentioned example shown in FIG. 13, it is also possible to shorten the wavelength of light emitted by using AlGaN MQW as the activity layer, instead. According to the present invention, light emission from a deep level is reduced as the GaN substrate 501 thus has few defects and few impurities. Accordingly, it is possible to thus provide a light-emission device having a high efficiency even when the wavelength of the light emitted is shortened.

Moreover, although each of the above-mentioned embodiments is an application of the present invention to an optical device, the present invention may also be applied to an electronic device. That is, by using a GaN substrate with few defects according to the present invention, a GaN-family thin film formed thereon by epitaxial growth also has few crystal defects. Consequently, the leak current can be well controlled, and a career confining effect when a quantum structure is made can be improved, for example. Thus, a high-performance device can be achieved according to the present invention.

Figure 14:
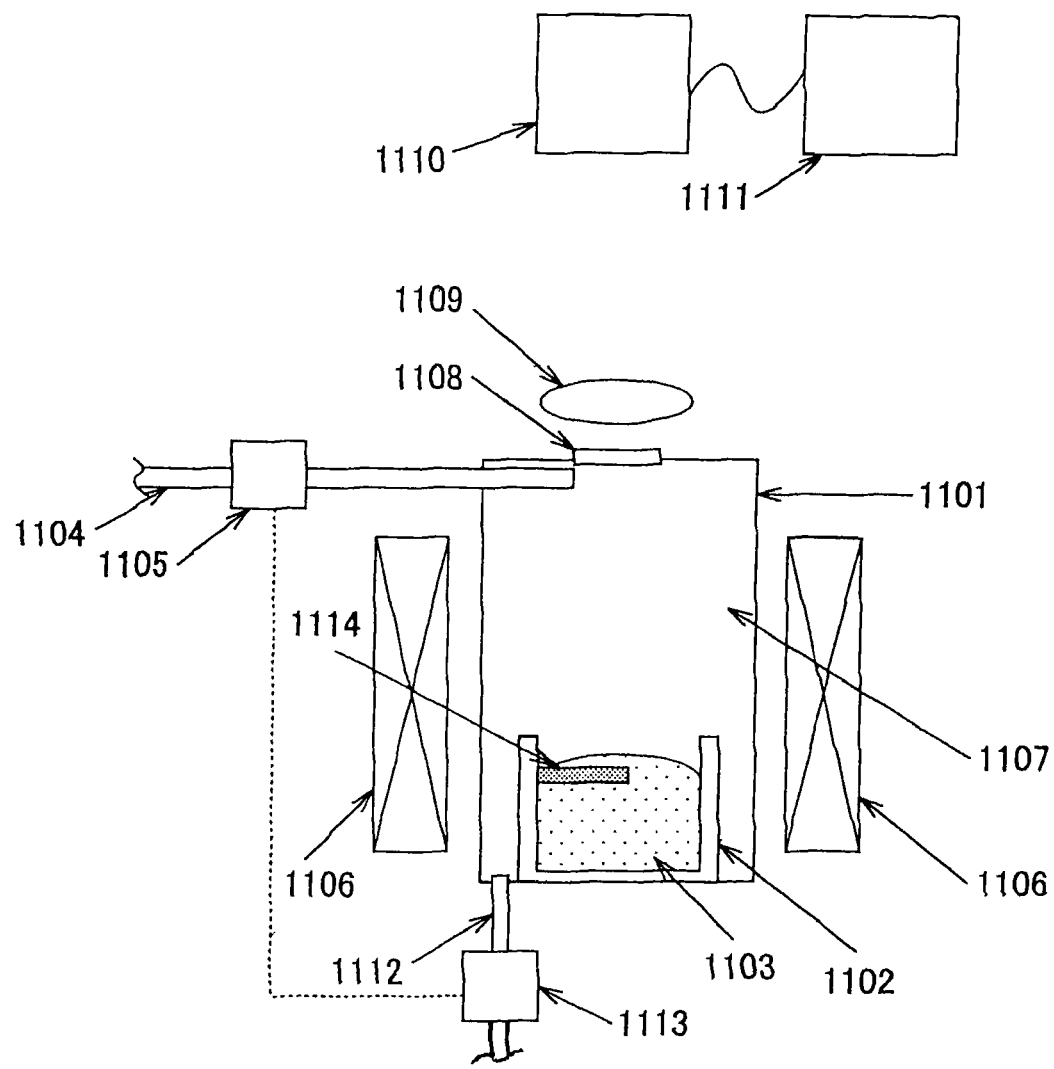
FIG. 14 illustrates a group-III nitride crystal growth apparatus in a fifth embodiment of the present invention.

A fifth embodiment of the present invention will now be described with reference to FIG. 14. FIG. 14 shows a side-elevational sectional view of a group-III nitride crystal growth device in the fifth embodiment of the present invention. A mixed molten liquid holding container 1102 is provided in a reaction vessel 1101. A mixed molten liquid includes Na as the alkaline metal and Ga as the group-III metal and held by the mixed molten liquid holding vessel 1102.

The material of this mixed molten liquid holding vessel 1102 is BN (boron nitride). In the reaction vessel 1101, a heating unit 106 is provided by which the temperature in the vessel 1101 is controlled suitable for the crystal growth. A window 1108 by which the inside of the reaction vessel 1101 can be observed is provided in an upper part of the reaction vessel 1101. The material of this window 1108 is sapphire. A lens 1109 is provided on the outside of the reaction vessel 1101 with respect to the window 1108, and a CCD camera 1110 is provided at a position such that, therethrough, an image of the inside of the reaction vessel 1101 is taken through the lens 1109 and the window 1108. The CCD camera 1110 is electrically connected to a monitor 1111 and a signal of the image indicating the inside of the reaction vessel 1101 taken through the CCD camera 1110 can be observed via the monitor 1111.

Nitrogen gas is used as the nitrogen material. The nitrogen gas can be introduced through a nitrogen supply pipe 1104, and can be supplied into a space 1107 in the reaction vessel 1101 from the outside of the reaction vessel 1101. In a state where the nitrogen supply pipe 1104 is introduced into the inside of the reaction vessel 1101, the gas can be supplied to the inside of the reaction vessel 1101 near the window 1108. In order to adjust the nitrogen gas flow near the window 1108 and nitrogen gas pressure in the reaction vessel 1101, a pressure adjustment mechanism 1105 is provided. This nitrogen pressure adjustment mechanism 1105 includes a pressure sensor, a pressure adjustment valve, etc.

The nitrogen gas is supplied near the window 1108 from the nitrogen supply pipe 1104, as mentioned above. The nitrogen gas is exhausted through an exhaust pipe 1112 so that the nitrogen gas may not stay near the window 1108, and also, the pressure in the reaction vessel 1101 can be kept to be a desired pressure. An exhaust flow adjustment mechanism 1113 is provided in the exhaust pipe 1112. The exhaust flow adjustment mechanism 1113 and pressure adjustment mechanism 1105 are connected electrically together, and can be adjusted so that the desired pressure be kept inside of the reaction vessel 1101.

Under such conditions, the nitrogen pressure in the reaction vessel 1101 is made into 50 atmospheres, and the temperature there is increased into 750° C. at which the crystal growth may start. By keeping these growth conditions for a predetermined time interval, a GaN crystal which is a group-III nitride grows up inside of the mixed molten liquid holding container 1102.

At this time, the nitrogen gas is supplied from the nitrogen supply pipe 1104, and as the gas does not stay inside of the reaction vessel 1101 near the window 11087, so that a condition of growth of the group-III nitride crystal inside of the reacting vessel 1101 can be properly observed through the lens 1109, CCD camera 1110, and monitor 1111. When there is no supply of the nitrogen gas near the window 1108 in the reaction vessel 1101, or when the nitrogen gas stays calm there, the observation from the outside of the reaction vessel 1101 may become difficult because (mist of) Na coming from the mixed molten liquid 1103 may react with the sapphire of the material of the window 1108 and thus loses the transparency, or Na is deposited inside surface of the window 1108.

In addition, it is preferable to coat

As observation of the situation of growth of this group-III nitride crystal can be made as mentioned above through the window 1108, more efficient crystal growth is attained and it leads to cost reduction. That is, after confirming that growing up of the group-III nitride crystal is made so as to yield a desired size of the crystal through the observation, the crystal growth can be finished, i.e., the temperature control and pressure control may be terminated. Thus, energy saving can be made.

Moreover, it becomes possible to change the place at which the observation is made in the reaction vessel 1101 by providing an optical system, such as a lens, a mirror, prism, etc., or any combination thereof (in the example shown in FIG. 14, the lens 1109) outside of the reaction vessel 1101 near the window 1108. Thereby, 3-dimensional observation on the periphery of the grown-up group-III nitride crystal from various view angles is also attained.

A sixth embodiment of the present invention will now be described with reference to FIGS. 15A and 15B. FIG. 15A shows a side-elevational sectional view of a group-III nitride crystal growth device in the sixth embodiment of the present invention. A mixed molten liquid holding container 1202 is provided in a reaction vessel 1201. There is a mixed molten liquid which includes Na as the alkaline metal and Ga as the group-III metal held in the mixed molten liquid holding container 1202. The material of this mixed molten liquid holding container 1202 is BN (boron nitride) as in the fifth embodiment.

An upper part of the reaction vessel 1201 is provided with a group-III nitride crystal holding mechanism 1217. This mechanism 1217 has a seed crystal (not shown in the figure, and, it is inside of a grown-up group-III nitride crystal 1214) at the lowest end of the group-III nitride crystal holding mechanism 1217, and this seed crystal is immersed in the mixed molten liquid 1203.

The upper part of the mixed molten liquid holding container 1202 has a lid 1218, and the group-III nitride crystal holding mechanism 1217 and this lid 1218 are connected together. The mixed molten liquid holding container 1202 is supported by a support stand 1216, and the support stand 1216 is movable along the vertical direction. Therefore, when the support stand 1216 moves along the vertical direction, the mixed molten liquid holding container 1202 and mixed molten liquid 1203 move together along the vertical direction accordingly.

In the reaction vessel 1201, a heating unit 1206 is provided by which the temperature there is controlled so that crystal growth may occur. A part of the reaction vessel 1201 projects through the heating unit 1206, and forms a port 1215 for observation. A window 1208 through which observation into the inside of the reaction vessel 1201 is made is provided at the projection end of the port 1215 for observation. The material of this window 1208 is quartz. A lens 1209 is provided on the outside of the reaction vessel 1201 near the window 1208, and a CCD camera 1210 is provided at a position such that an image in the reaction vessel 1201 can be pick up through the lens 1209 and window 1208.

The CCD camera 1210 is electrically connected to a monitor 1211 and a signal of the image in the reaction vessel 1201 pick up by the CCD camera 1210 can be observed via the monitor 1211. This port 1215 for observation is located at a level approximately same as the level of the bottom end of the group-III nitride holding mechanism 1217. Therefore, when the mixed molten liquid holding container 1202 is lowered along the vertical direction separately from the group-III nitride holding mechanism 1217, as shown in FIG. 15B, the bottom end of the group-III nitride holding mechanism 1217 is exposed and thus can be observed from the outside via the port 1215 for observation.

Also in this sixth embodiment, the nitrogen gas is used as the nitrogen material. The nitrogen gas can be introduced by a nitrogen supply pipe 1204, and can be supplied into a space 1207 inside of the reaction vessel 1201 from the outside. The nitrogen supply pipe 1204 is provided so as to pass through a wall of the port 1215 for observation so that the gas can be supplied near the window 1208 inside of the reaction vessel 1201. In order to adjust the nitrogen gas flow near the window 1208 and the nitrogen gas pressure in the reaction vessel 1201, a pressure adjustment mechanism 1205 is provided. This nitrogen pressure adjustment mechanism 1205 includes a pressure sensor, a pressure adjustment valve, etc.

The nitrogen gas is supplied near the window 1208 from the nitrogen supply pipe 1204, as mentioned above. Further, the nitrogen gas is exhausted through an exhaust pipe 1212 so that nitrogen gas is prevented from staying calm near the window 1208 and also, the pressure in the reaction vessel 1201 can be kept to be a desired pressure. An exhaust flow adjustment mechanism 1213 is provided in the exhaust pipe 1212. The exhaust flow adjustment mechanism 1213 and pressure adjustment mechanism 1205 are electrically connected together so that it becomes possible to keep the desired pressure in the reaction vessel 1201.

Under such conditions, the nitrogen pressure in the reaction vessel 1201 is made into 50 atmospheres, and the temperature there is increased into 750° C. at which the crystal growth may start. By keeping these growth conditions for a predetermined time interval, a GaN crystal which is the group-III nitride glows from the seed crystal attached to the projecting end of the group-III nitride crystal holding mechanism 1217 serving as a center of the growth.

After the growth during a predetermined time interval, the temperature in the reaction vessel 1201 is lowered to 300° C., and the mixed molten liquid holding container 1202 and support stand 1216 are lowered. As the nitrogen gas is supplied from the nitrogen supply pipe 1204 and thereby, the gas does not stay calm near the window 1208 inside of the reaction vessel 1201, it is possible to observe and thus determine how large the group-III nitride crystal has grown at this time through the lens 1209, CCD camera 1210, and monitor 1211 via the window 1208. The nitrogen gas would stay calm near the window 1208 if there were no supply of the nitrogen gas near the window inside of the reaction vessel 1201, and, thus, (mist/steam of) Na coming from the mixed molten liquid 1203 would react with the quartz of the material of the window 1208, or Na would be deposited on the window 1208, so that the transparency of the window 1208 would be lost. Thus, the observation from the outside of the reaction vessel 1201 would become difficult.

As the situation of growth of the group-III nitride crystal can be checked as mentioned above, more efficient crystal growth is attained and it leads to cost reduction, as in the fifth embodiment. That is, after confirming that the group-III nitride crystal has grown up to achieve a desired size through the observation, the crystal growth operation can be finished.

Different from the above-mentioned fifth embodiment, evaporation of Na can be controlled and thus stable growth of GaN crystal is attained because the lid 1218 is provided on the mixed molten liquid holding container 1202 in the sixth embodiment shown in FIG. 15A. Furthermore, even if the flow rate of nitrogen gas is reduced, adhesion of Na to the window 1208 for observation can be avoided, and it becomes easier to carry out observation, since the amount of evaporation of Na is thus controlled.

Furthermore, as in the above-mentioned fifth embodiment, it becomes possible to change the place at which the observation is made in the reaction vessel 2101 by providing the optical system, such as a lens, a mirror, a prism, etc., or any combination thereof, outside of the reaction vessel 2101. Thereby, 3-dimensional observation on the periphery of the grown-up group-III nitride crystal from various view angles is also attained.

In each of the above-described fifth and sixth embodiments shown in FIGS. 14 and 15A, it is preferable that at least the inner surface of the window 1108 or 1208 is covered by a film of the group-III nitride. Specifically, only the inner surface of the window should be covered by the group-III nitride, or, the entire window 1108 or 1208 is made of the group-III nitride, or some part of the window including the inner surface thereof is made of the group-III nitride.

Even in case only the inner surface of the window is coated by the group-III nitride, it is possible to avoid reaction of the window material with Na even when the window is made of sapphire or quartz, and, thereby, it is possible to avoid the transparency of the window from being lost. Accordingly, it is possible to observe the inside of the reaction vessel 1101 or 1201 merely by applying the nitrogen gas onto the window with a smaller gas amount such as to avoid deposition of Na onto the window. Accordingly, it is possible to achieve stable crystal growth of the group-III nitride at low cost as a result of application of high pressure being enabled in the reaction vessel.

Figure 16:
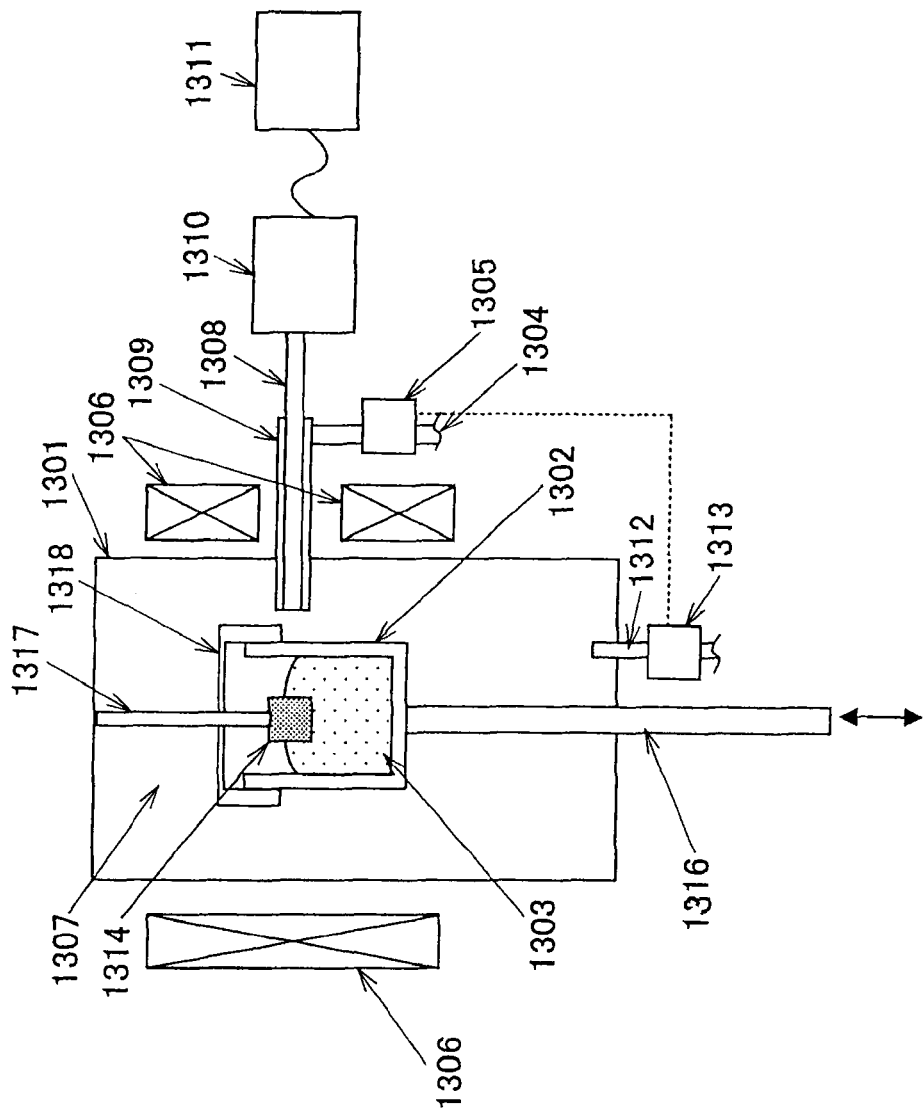
FIG. 16 illustrates a group-III nitride crystal growth apparatus in a seventh embodiment of the present invention.

A seventh embodiment of the present invention will now be described with reference to FIG. 16. FIG. 16 shows a side-elevational sectional view of a group-III nitride crystal growth apparatus in the seventh embodiment of the present invention. A mixed molten liquid holding container 1302 is provided in a reaction vessel 1301. There is a mixed molten liquid which includes Na as the alkaline metal and Ga as the group-III metal held in the mixed molten liquid holding container 1302. The material of this mixed molten liquid holding container 1302 is BN (boron nitride) as in the above-mentioned fifth and sixth embodiments.

An upper part of the reaction vessel 1301 has a group-III nitride crystal holding mechanism 1317 as in the above-mentioned sixth embodiment. Also, a seed crystal (not shown in the figure, and is inside of the grown-up group-III nitride crystal 1314) is attached at the bottom end of the group-III nitride crystal holding mechanism 1317, and this seed crystal is immersed in the mixed molten liquid 1303.

The upper part of the mixed molten liquid holding container 1302 has a lid 1318, and the group-III nitride crystal holding mechanism 1317 and this lid 1318 are connected together. The mixed molten liquid holding container 1302 is supported by a support stand 1316, and the support stand 1316 is movable along the vertical direction. Therefore, when the support stand 1316 moves along the vertical direction, the mixed molten liquid holding container 1302 and mixed molten liquid 1303 move along the vertical direction together.

In the reaction vessel 1301, a heating unit 1306 is provided by which the temperature there is controlled so that crystal growth may occur. An optical fiber 1308 passes through the side wall of the reaction vessel 1301 and also a heating unit 1306, and, thus, passes between the inside and outside of the reaction vessel 1301. A sleeve 1309 covers the optical fiber 1308 coaxially.

A CCD camera 1310 is provided outside of the reaction vessel 1301, and the outside end of the optical fiber 1308 is connected to an image input part of the CCD camera 1310. Accordingly, the image inside of the reaction vessel 1301 can be transmitted and input to the CCD camera 1310. Thus, a signal of the image in the reaction vessel 1301 is pick up by the CCD camera 1310 and then can be observed via a monitor 1311 electrically connected with the CCD camera 1310. Although the optical fiber 1308 passes between the inside and outside of the reaction vessel 1301, the atmosphere is separated between the inside and outside of the reaction vessel 1301 by means of the sleeve 1309.

This optical fiber 1308 is located at a level approximately same as the level of the bottom end of the group-III nitride holding mechanism 1317. Therefore, when the mixed molten liquid holding container 1302 is lowered along the vertical direction separately from the group-III nitride holding mechanism 1317, as shown in FIG. 15B, the bottom end of the group-III nitride holding mechanism 1317 can thus be observed from the outside via the optical fiber 1308 as in the above-described sixth embodiment.

Also in this seventh embodiment, the nitrogen gas is used as the nitrogen material. The nitrogen gas can be introduced by a nitrogen supply pipe 1304, and can be supplied into a space 1307 inside of the reaction vessel 1301 from the outside through the sleeve 1309. The nitrogen supply pipe 1304 is connected to the sleeve 1309 which partially covers the optical fiber 1308. Via the sleeve 1309, the nitrogen gas is supplied to the periphery of the optical fiber 1308 and to the inside end surface of the optical fiber 1308 inside of the reaction vessel 1301. Specifically, the nitrogen gas passes through a space formed between the optical fiber 1308 and sleeve 1309 so that the nitrogen gas is supplied in the periphery of the optical fiber 1308 and to the inside of the reaction vessel 1301.

In order to adjust the nitrogen gas flow in the periphery of the optical fiber 1308 and the nitrogen gas pressure in the reaction vessel 1301, a pressure adjustment mechanism 1305 is provided. This nitrogen pressure adjustment mechanism 1305 includes a pressure sensor, a pressure adjustment valve, etc.

The nitrogen gas is supplied to the periphery of the optical fiber 1308 from the nitrogen supply pipe 1304, as mentioned above. Further, the nitrogen gas is exhausted through an exhaust pipe 1312 so that nitrogen gas is prevented from staying calm in the periphery and inner end surface of the optical fiber 1308 and also, the pressure in the reaction vessel 1301 can be kept to be a desired pressure. An exhaust flow adjustment mechanism 1313 is provided in the exhaust pipe 1312. The exhaust flow adjustment mechanism 1313 and pressure adjustment mechanism 1305 are electrically connected together so that it becomes possible to keep the desired pressure in the reaction vessel 1301.

Under such conditions, the nitrogen pressure in the reaction vessel 1301 is made into 50 atmospheres, and the temperature there is increased into 750° C. at which the crystal growth may start. By keeping these growth conditions for a predetermined time interval, a GaN crystal which is the group-III nitride grows from the seed crystal attached to the projecting end of the group-III nitride crystal holding mechanism 1317 serving as a center of the growth.

After the growth during a predetermined time interval, the temperature in the reaction vessel 1301 is lowered to 300° C., and the mixed molten liquid holding container 1302 and support stand 1316 are lowered. As the nitrogen gas is supplied from the nitrogen supply pipe 1304 and thereby, the gas does not stay calm in the periphery and the inner end surface of the optical fiber 1308 inside of the reaction vessel 1201, it is possible to observe and thus determine how large the group-III nitride crystal has grown up at this time through the CCD camera 1310, and monitor 1311 via the optical fiber 1308. The nitrogen gas would stay calm near the optical fiber 1308 if there were no supply of the nitrogen gas near the fiber 1308 inside of the reaction vessel 1301, and, thus, Na would reacts with the material of the optical fiber 1308, or Na would be deposited there, so that the transparency of the optical fiber 1308 there would be lost. Thus, the observation from the outside of the reaction vessel 1301 would become difficult.

As the situation of growth of the group-III nitride crystal can be checked as mentioned above, more efficient crystal growth is attained and it leads to cost reduction as in the fifth and sixth embodiments. That is, after confirming that the group-III nitride crystal has grown up to achieve a desired size through the observation, the crystal growth operation can be finished.

Different from the above-mentioned fifth embodiment, evaporation of Na can be controlled and thus stable growth of GaN crystal is attained because the lid 1318 is provided on the mixed molten liquid holding container 1302 in the seventh embodiment shown in FIG. 16. Furthermore, even if the flow rate of nitrogen gas is reduced, adhesion of Na to the optical fiber 1308 can be avoided, and it becomes easier to carry out observation, since the amount of evaporation of Na is thus controlled.

Thus, according to the seventh embodiment, different from the fifth and sixth embodiments, the nitrogen gas is introduced inside the sleeve 1309 (specifically, as mentioned above-mentioned, through the space formed between the outer surface of the optical fiber 1308 and inner surface of the sleeve 1309). Accordingly, it is possible to effectively avoid adhesion/deposition of Na onto the optical fiber or reaction of the material of the optical fiber with Na with a relatively small amount of nitrogen gas injected between the fiber and sleeve.

According to any of the fifth, sixth and seventh embodiments, the nitrogen gas is employed as the substance which contains nitrogen, Ga is employed as the substance which contains the group-III metal, and Na is employed as the alkaline metal. However, these embodiments may employ another combination of materials. That is, as the alkaline metal, K or the like, other than Na; as the substance containing the group-III metal, In, Al or the like other than Ga; and as the substance containing nitrogen, ammonia, sodium azide, hydradyne or the like, other than nitrogen gas, may be employed.

According to the fifth, sixth and seventh embodiments, it becomes possible to observe the state of group-III nitride crystal growth performed according to the flux method. Thereby, the growth conditions such as growth temperatures, growth pressures and so forth may be appropriately controlled. Thus, high-quality crystal growth is achieved. Furthermore, growth time interval can be easily recognized, and thus, it is possible to achieve efficient crystal growth, and to yield high-quality crystals at low cost.

Further, by utilizing the optical fiber for the observation as in the seventh embodiment, it is possible to achieve high-pressure growth-pressure control, and, thus, to achieve stable crystal growth.

Further, by providing the lid on the mixed molten liquid holding container as in the sixth and seventh embodiments, it is possible to control evaporation of the alkaline metal, while to observe the crystal growth. Accordingly, it is possible to yield high-quality crystals at low cost.

Also as to these fifth, sixth and seventh embodiments of the present invention, it is possible to apply a group-III nitride crystal yielded according to any of these embodiments to a group-III nitride semiconductor device as shown in FIG. 13 in the manner same as in the above-mentioned first through fourth embodiments of the present invention. Also in this case, the same advantages can be obtained as in the case of applying a group-III nitride crystal according to the first through fourth embodiments described above.

Eighth and ninth embodiments of the present invention will now be described. In each of these embodiments, different from the above-mentioned first through seventh embodiments, there are a plurality of different temperature control zones prepared which can be controlled in temperature independently.

Figure 17:
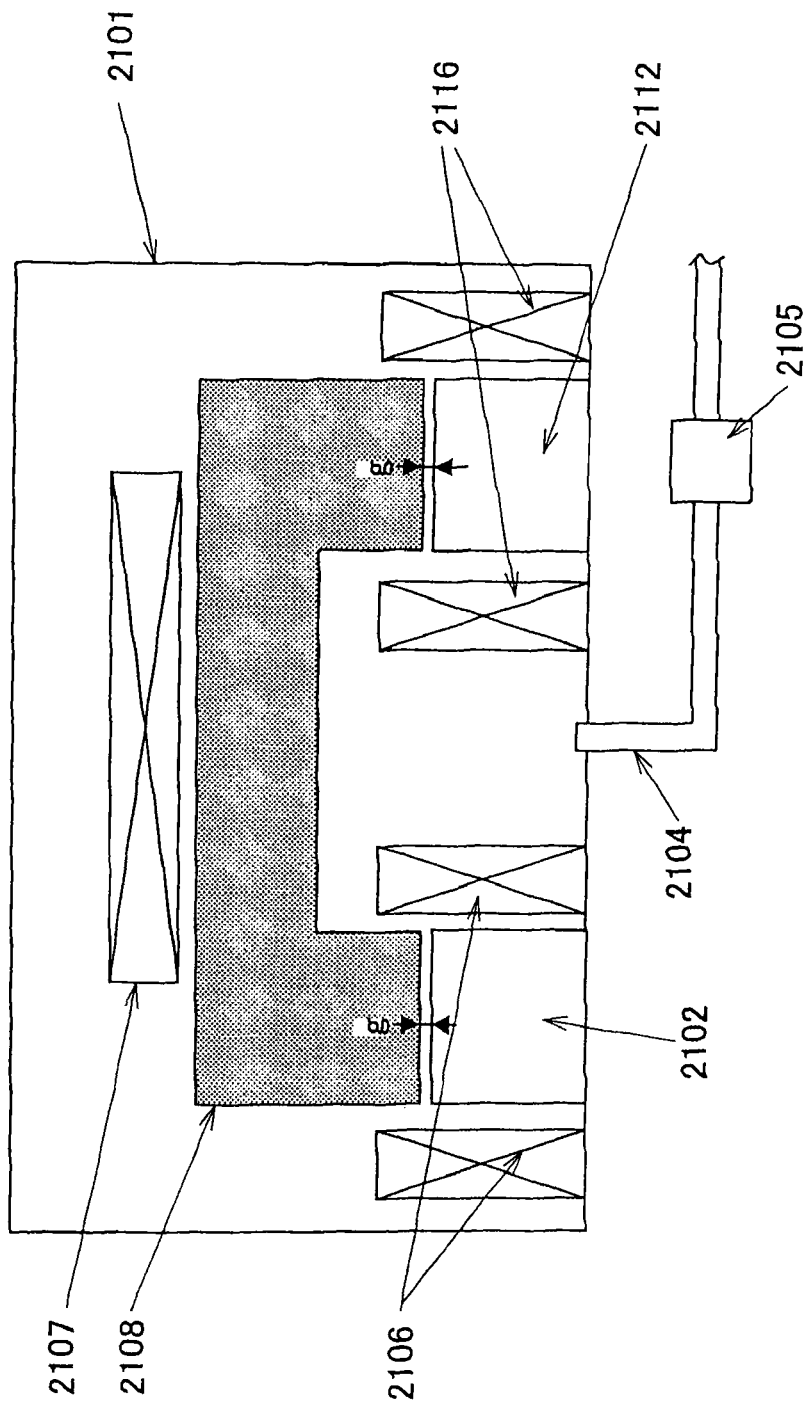
FIG. 17 illustrates a group-III nitride crystal growth apparatus in an eighth embodiment of the present invention.

The eighth embodiment will now be described. FIG. 17 shows a side-elevational sectional view of a group-III nitride crystal growth apparatus in the eighth embodiment. As shown in FIG. 17, a reaction vessel 2101, a first mixed molten liquid holding container 2102 and a second mixed molten liquid holding container 2112 are provided. Moreover, for the first mixed molten liquid holding container 2102, a first heating device 2106 is provided so that heating control into an arbitrary temperature may be made there, and for the second mixed molten liquid holding container 2112, a second heating device 2116 is provided so that heating control into an arbitrary temperature may be made there. This first heating device 2106 and the second heating device 2116 can carry out temperature control of the mixed molten liquid holding containers 2102 and 2112 independently, respectively.

In other wards, the first mixed molten liquid holding container 2102 and the first heating device 2106 provide a first temperature control zone, while the second mixed molten liquid holding container 2112 and the second heating device 2116 provide a second temperature control zone.

Moreover, an upper part of the first mixed molten liquid holding container 2102 and an upper part of the second mixed molten liquid holding container 2112 have openings, respectively, and therethrough, these containers 2102 and 2112 are connected via a connection pipe 2108. A connection pipe heating device 2107 is provided such that heating control of this connection pipe 2108 may be made. There, the connection pipe 2108 functions as an alkaline metal transportation zone for conveying an alkaline metal to another temperature control zone from one temperature control zone between the above-mentioned first and second temperature control zones. In other words, the first and second temperature control zones are connected together via the alkaline metal transportation zone for conveying the alkaline metal between one temperature control zones to another temperature control zone.

Moreover, a nitrogen supply pipe 2104 is provided in the reaction vessel 2101 in order to supply the substance (in this case, nitrogen gas) containing nitrogen into the reaction vessel 2101, and, a pressure adjustment mechanism 2105 is provided in order to adjust the nitrogen pressure there. This pressure adjustment mechanism 2105 includes a pressure sensor, a pressure adjustment valve, etc.

Moreover, between the connection pipe 2108 and each of the upper parts of the mixed molten liquid holding containers 2102 and 2112, a gap 'g' is provided such that nitrogen gas can pass therethrough between the inside and outside of these first, second and transportation zones. Accordingly, the nitrogen gas can enter the first and second mixed molten liquid holding containers 2102 and 2112 through the gaps 'g'.

Moreover, the material of the reaction vessel 2101 is stainless steel, and the material of the mixed molten liquid holding containers 2102 and 2112 and the connection pipe 2108 is BN (boron nitride) or pyrolytic BN.

A group-III nitride crystal growth process executed in the above-described group-III nitride crystal growth apparatus will now be described with reference to FIGS. 18A through 18H. FIGS. 18A through 18D show transition of the state of the first mixed molten liquid holding container 2102, while FIGS. 18E through 18H show corresponding transition of the state of the second mixed molten liquid holding container 2112.

Figure 18A:
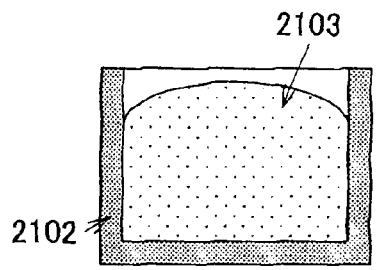
FIGS. 18A through 18H illustrate a group-III nitride crystal growth process according to the present invention performed in the apparatus shown in FIG. 17.

First, a mixed molten liquid 2103 of Ga as the group-III metal and Na as the alkaline metal is prepared in the first mixed molten liquid holding container 2102, as shown in FIG. 18A. At this time, as shown in FIG. 18E, only Ga 2114 as the group-III metal is provided in the second mixed molten liquid holding container 2112.

Under such conditions, the nitrogen pressure in the reaction vessel 2101 is increased into 50 atmospheres, for example, and also, the temperature in the first mixed molten liquid holding container 2102 is increased into 750 degrees C. by using the first heating device 2106 by which crystal growth can starts there. At this time, in the second mixed molten liquid holding container 2112, the temperature is also increased into 750 degrees C. by means of the second heating device 2116. Also, the temperature in the connection pipe 2108 is increased into 750 degrees C. by means of the connection pipe heating device 2107.

Figure 18B:
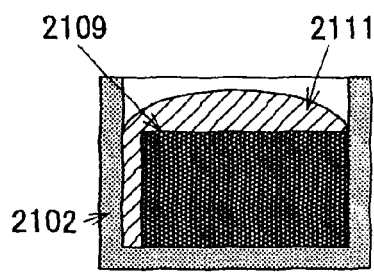
Figure 18C:
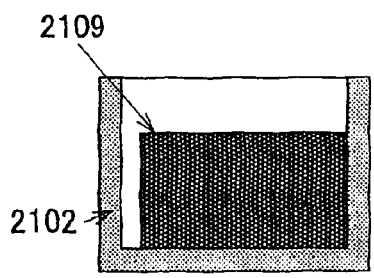
Figure 18D:
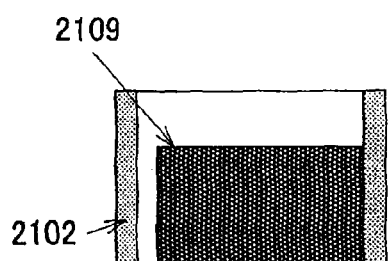
Figure 18E:
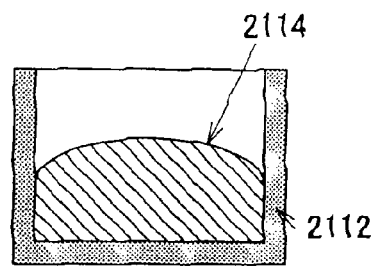
Figure 18F:
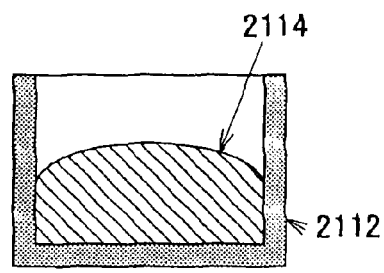

By keeping these growth conditions for a predetermined time interval, the GaN crystal 2109 which is the group-III nitride grows in the first mixed molten liquid holding container 2102, as shown in FIG. 18B. In this time, no transportation of Na occurs between the two mixed molten liquid holding containers 2102 and 2112 as the temperature is uniform therebetween including the connection pipe 2108. Accordingly, there is no Na as the alkaline metal in the second mixed molten liquid holding container 2112, and, thus, GaN crystal does not grow there, as shown in FIG. 18F.

The above-mentioned temperature and nitrogen pressure conditions are kept until the group-III nitride crystal (GaN crystal) grows sufficiently in the first mixed molten liquid holding container 2102. At this time, as shown in FIG. 18B, in the first mixed molten liquid holding container 2102, all Ga is consumed to form the GaN crystal and this container 2102 enters a state where only the GaN crystal 2109 and Na 2111 exist. At this time, in the second mixed molten liquid holding container 2112, the state in FIG. 18E is kept as shown in FIG. 18F.

Figure 18G:
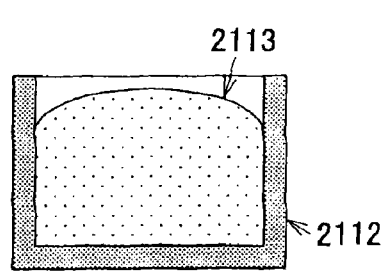

Next, the first mixed molten liquid holding container 2102 and connection pipe 2108 are increased in temperature into 900 degrees C., after the nitrogen pressure is lowered to the normal pressure. Also, the temperature of the second mixed molten liquid holding container 2112 is lowered to the room temperature. Then, by holding these conditions for a predetermined time interval, Na 2111 as the alkaline metal thus transformed into a gas state due to the increased temperature moves to the second mixed molten liquid holding container 2112 from the first mixed molten liquid holding container 2102 due to the temperature difference between the first and second containers 2102 and 2112, and the connection pipe 2108. That is, Na 2111 which exists in the first mixed molten liquid holding container 2102 evaporates, and Na 2111 moves into the second mixed molten liquid holding container 2112 having the lower temperature. At this time, as shown in FIG. 18C, in the first mixed molten liquid holding container 2102, only the GaN crystal remains. Then, by raising the temperature in the second mixed molten liquid holding container 2112 to approximately 100 degrees C., Na and Ga thus form a mixed molten liquid 2113 in the second mixed molten liquid holding container 2112, as shown in FIG. 18G.

Figure 18H:
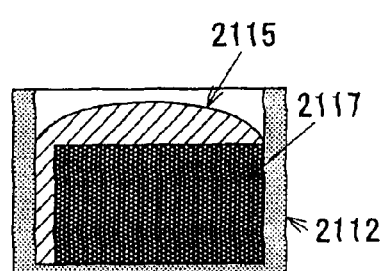

Next, the temperature of the second mixed molten liquid holding container 2112 is increased to 750 degrees C., with the nitrogen pressure kept in the reaction vessel 2101 at 50 atmospheres, while the temperature of the first mixed molten liquid holding container 2102 and the connection pipe 2108 is kept at 750 degrees C. again. Then by keeping these states for a predetermined time interval, a GaN crystal 2117 grows in the second mixed molten liquid holding container 2112. That is, Ga 2114 which was previously prepared in the second mixed molten liquid holding container 2112 at the beginning of the current process completely reacts so as to yield the Ga N crystal in the second mixed molten liquid holding container 2112, as shown in FIG. 18H, and, thus, only the desired GaN crystal 2117 and Na 2115 remain there. In addition, at this time, the in the first mixed molten liquid holding container 2102, the state in FIG. 18C is kept as shown in FIG. 18D. Then, the GaN crystal 2109 can be taken out from the first mixed molten liquid holding container 2102.

Thus, according to the eighth embodiment, Na which is the alkaline metal is used for two times of growth of group-III nitride crystals (GaN crystal) in the group-III nitride crystal growth apparatus. Accordingly, it is possible to effectively reduce the consumption of the alkaline metal, for example, to be halved. Thereby, cost reduction and environmental load reduction can be achieved.

Moreover, a refining effect (due to distillation) of Na which reduces impurities can be obtained by returning Na which is the alkaline metal to liquid phase from gas phase. Therefore, it becomes possible to grow up a high-quality group-III nitride crystal (GaN crystal) with fewer impurities.

Thus, in the group-III nitride crystal growth apparatus shown in FIG. 17, and the group-III nitride crystal growth method described with reference to FIGS. 18A through 18H, after carrying out crystal growth of the group-III nitride crystal in the first temperature control zone, the alkaline metal (Na) conveyed to the second temperature control zone, and crystal growth of the group-III nitride crystal is carried out again in the second temperature control zone.

That is, the group-III nitride crystal is first grown up in the first temperature control zone (first temperature control zone) in the reaction vessel 2101 of the plurality of temperature control zones which can be controlled in temperature independently. Next, the alkaline metal (Na) is moved to another temperature control zone (second temperature control zone). There, in order to convey the alkaline metal (Na), the temperature of the first temperature control zone is raised into more than the temperature at which the alkaline metal (Na) evaporates, and the temperature of the second temperature control zone is set lower than the temperature at which the alkaline metal (Na) does not evaporates evaporate or coagulates coagulate. By holding these states, it is possible to make the alkaline metal (Na) move to the second temperature control zone from the first temperature control zone. Then, the group-III nitride crystal similarly grows up in the second temperature control zone.

When transporting the alkaline metal (Na) from the first temperature control zone to the second temperature control zone, the temperature of the first temperature control zone and the temperature of the second temperature control zone are most important. However, preferably, the temperatures on the other places should be higher than the temperature at which the alkaline metal evaporates similarly to the first temperature control zone. Thereby, conveying the alkaline metal to the second temperature control zone can be made efficiently.

The number of temperature control zones independently controllable is two in the embodiment shown in FIG. 17 (two temperature control zones of the first temperature control zone of the first mixed molten liquid holding container 2102 and the first heating device 2106; and the second temperature control zone of the second mixed molten liquid holding container 2112 and the second heating device 2116). However, this number may be increased into more than two. That is, more than two mixed molten liquid holding containers together with their respective heating devices may be provided in one reaction vessel.

Figure 19:
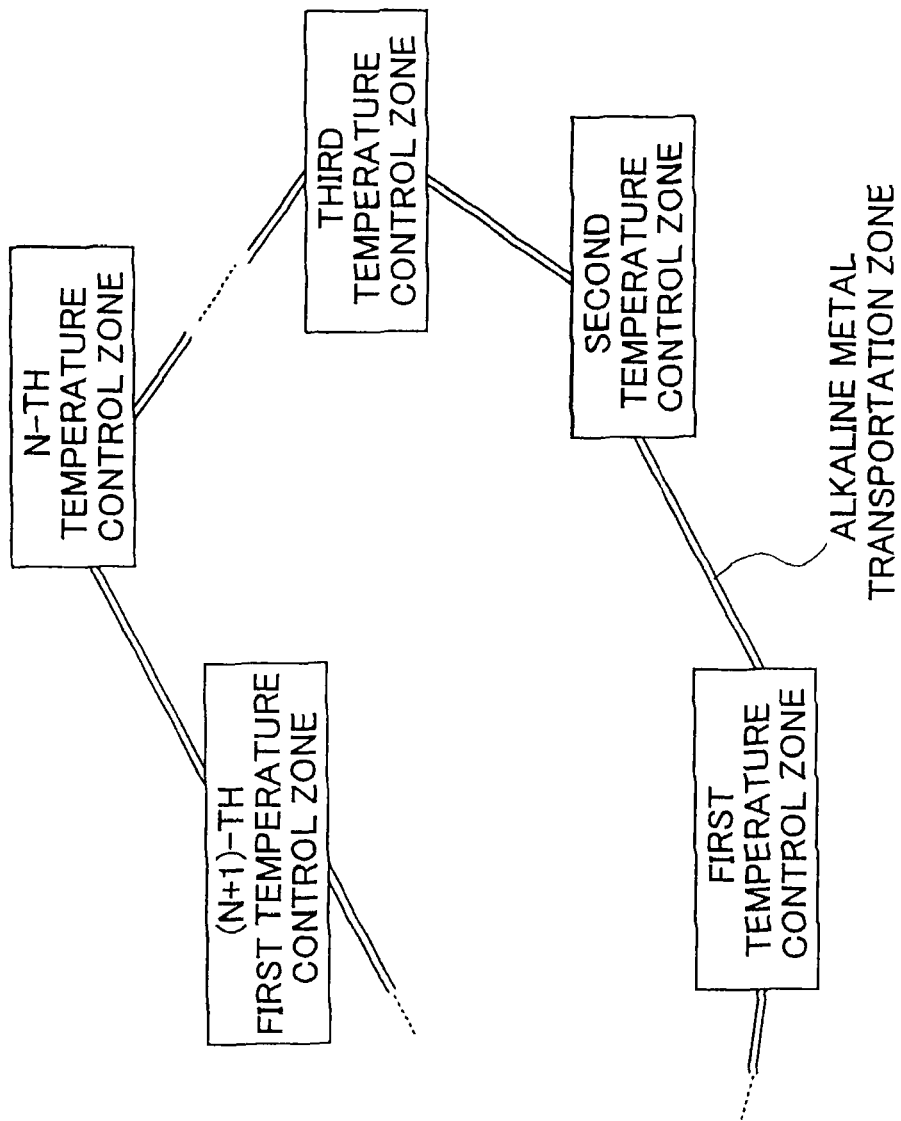
FIG. 19 illustrates a first variant embodiment of the embodiment shown in FIG. 17.

FIG. 19 shows a first variant embodiment of the eighth embodiment in which three or more temperature control zones (first, second, third, . . . , n-th, (n+1)-th temperature control zones) are provided in one reaction vessel 2101. In the configuration shown in FIG. 19, each pair of adjacent temperature control zones are connected by an alkaline metal transportation zone for conveying the alkaline metal to an adjacent temperature control zone therebetween.

In the configuration shown in FIG. 19, first, after carrying out crystal growth of the group-III nitride in the first temperature control zone, the alkaline metal is conveyed to the second temperature control zone from the first temperature control zone, and crystal growth of the group-III nitride is carried out in the second temperature control zone, as in the process illustrated with reference to FIGS. 18A through 18H. Next, the alkaline metal is conveyed to the third temperature control zone from the second temperature control zone, and crystal growth of the group-III nitride is carried out in the third temperature control zone. Thus, the alkaline metal can be conveyed to the first, second, third, . . . , n-th, (n+1)-th respective temperature control zones, one by one, in the stated order, and crystal growth of the group-III nitride can be carried out, one by one, in each of these temperature control zones, in sequence.

In case the alkaline metal is conveyed at this time, the temperature of the temperature control zone (n-th one) where the alkaline metal exists should be made more than the temperature at which the alkaline metal evaporates, while the temperature of the temperature control zone ((n+1)-th one) to which the alkaline metal is conveyed should be lower than the temperature at which the alkaline metal does not evaporate or coagulates. The temperature of the other temperature control zones is set as the temperature at which the alkaline metal evaporates or higher, and thus, the alkaline metal is not conveyed thereto.

Thus, in the configuration shown in FIG. 19, by performing crystal growth of the group-III nitride and Na transportation three times or more, the amount of consumption of the alkaline metal (Na) can be reduced further effectively, and cost reduction and environmental load reduction can be realized further effectively. Moreover, the refining effect of Na described with reference to FIG. 17 becomes more effective by further increasing the number of times of Na transportation, and, thus, it becomes possible to attain much higher purity of Na by the repetitive distillation operation of Na, and, thus, it becomes possible to carry out crystal growth of quality group-III nitride.

Figure 20:
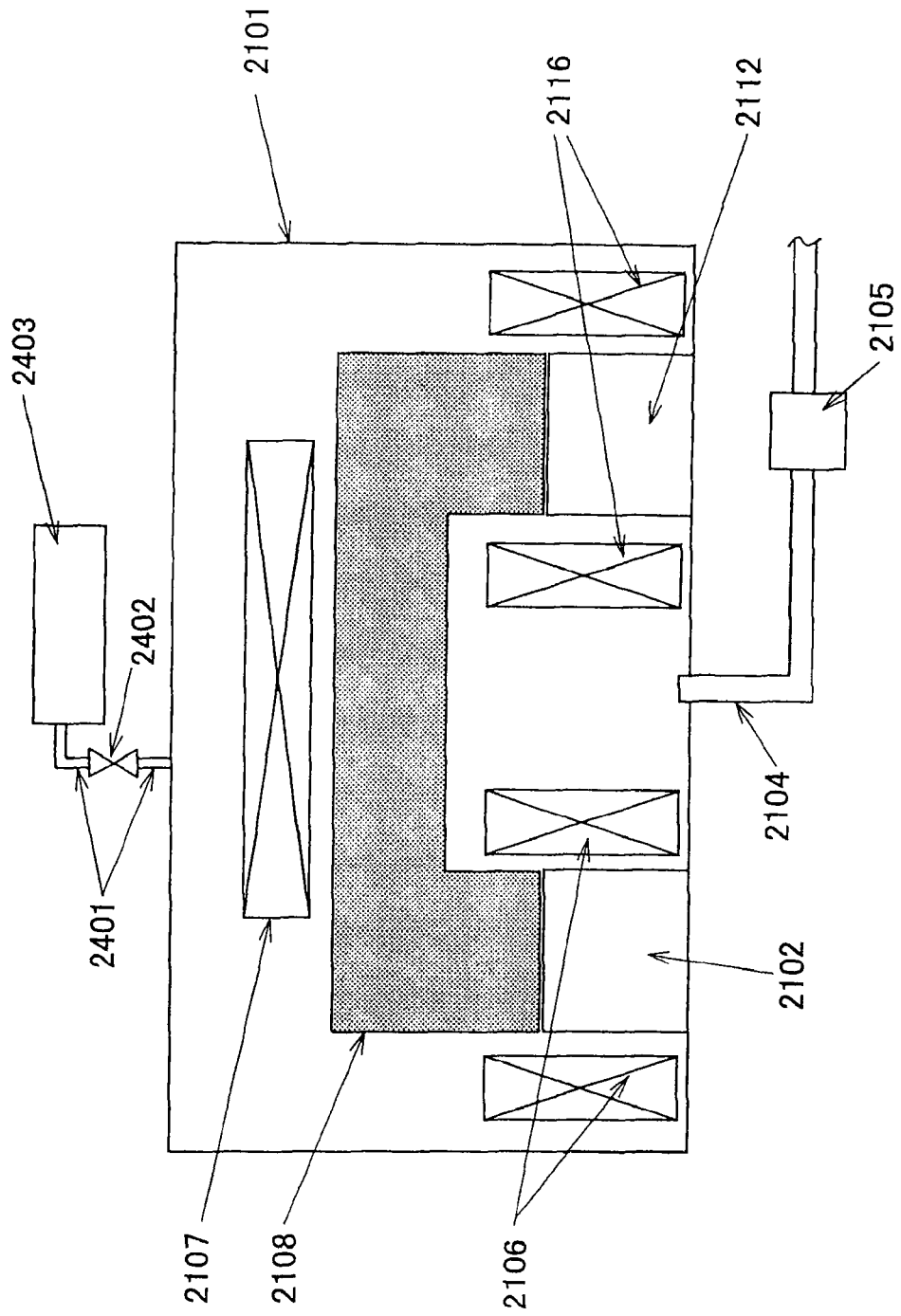
FIG. 20 illustrates a second variant embodiment of the embodiment shown in FIG. 17.

FIG. 20 shows a second variant embodiment of the eighth embodiment of the group-III nitride crystal growth apparatus. In comparison to the group-III nitride crystal growth apparatus of FIG. 17, a vacuum pump 2403 is added to a reaction vessel 2101 in the group-III nitride crystal growth apparatus shown in FIG. 20. That is, the vacuum pump 2403 is connected to the reaction vessel 2101 via an exhaust piping 2401. And also, an exhaust valve 2402 is provided in the middle of the exhaust pipe 2401 between the reaction vessel 2101 and vacuum pump 2403.

In this configuration, the vacuum pump 2403 and the exhaust pipe 2401 reduce the pressure in the reaction vessel 2101, and, further, the exhaust valve 2402 separates and integrates the atmosphere between the vacuum pump 2403 and reaction vessel 2101. That is, it is possible to decompress the atmosphere in the reaction vessel 2101 by operating the vacuum pump 2403 and opening the exhaust valve 2402.

That is, the vacuum pump 2403, the exhaust pipe 2401, and exhaust valve 2402 act as a decompression unit for changing the alkaline metal transportation zone into a decompressed state, in case the alkaline metal is conveyed to another temperature control zone from one temperature control zone.

According to the group-III nitride crystal growth device shown in FIG. 20, before conveying the alkaline metal from one temperature control zone to another temperature control zone as in the embodiment shown in FIG. 17, the inside of the reaction vessel 2101, including the inside of the transportation zone 2108, is decompressed by the vacuum pump 2403. In this case, since the inside of the reaction vessel 2101 is decompressed, it becomes possible to convey Na at high speed compared with the case where Na is conveyed in the condition where the inside of the reaction vessel 2101 is in the normal pressure as in the configuration shown in FIG. 17. Therefore, further cost reduction on the growth of a GaN crystal is attained.

As mentioned above, according to the eighth embodiment, the plurality of temperature control zones which can be controlled in temperature independently are provided, and, the temperatures thereof are appropriately controlled so that the alkaline metal (Na or so) needed for crystal growth of group-III nitride (GaN or so) is transported among them in evaporated form. Thereby, the alkaline metal is used repetitively, and, thus, the alkaline metal can be efficiently used, and, also, the alkaline metal is purified by the repetitive distillation operation.

Figure 21:
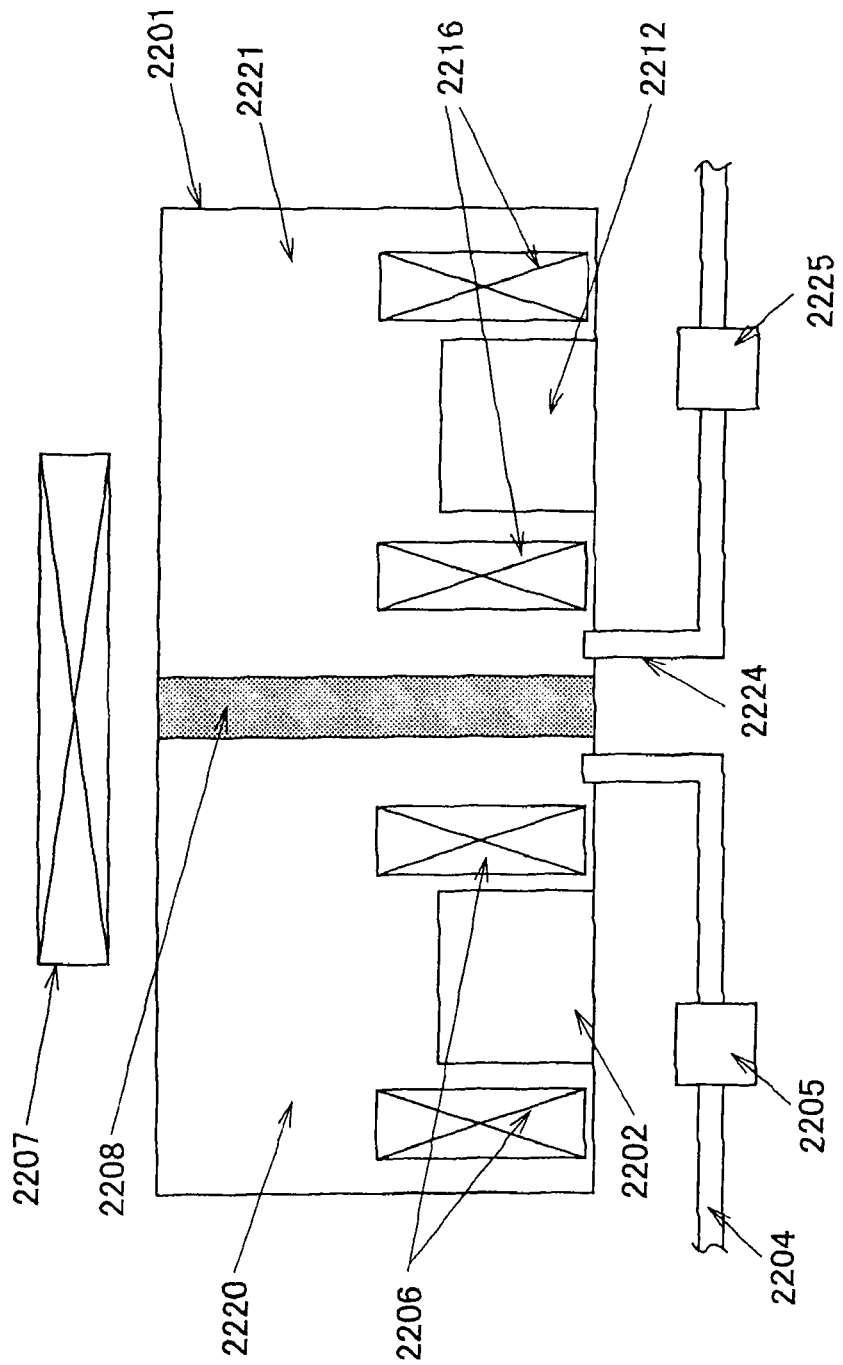
FIG. 21 illustrates a group-III nitride crystal growth apparatus in a ninth embodiment of the present invention.

The ninth embodiment of the present invention will now be described with reference to FIG. 21. FIG. 21 shows a configuration of a group-III nitride crystal growth apparatus in the ninth embodiment of the present invention. As shown in FIG. 21, in a reaction vessel 2201, a first mixed molten liquid holding container 2202 and a second mixed molten liquid holding container 2212 are provided. Moreover, for the first mixed molten liquid holding container 2202, a first heating device 2206 is provided so that heating control to an arbitrary temperature may be made there, while, for the second mixed molten liquid holding container 2212, a second heating device 2216 is provided so that heating control may be made to an arbitrary temperature there. This first heating device 2206 and the second heating device 2216 can carry out temperature control of the mixed molten liquid holding containers 2202 and 2212, independently, respectively.

In other words, the first mixed molten liquid holding container 2202 and the first heating device 2206 act as a first temperature control zone, while the second mixed molten liquid holding container 2212 and the second heating device 2216 act as a second temperature control zone.

Moreover, in order to control the temperature of the entire reaction vessel 2201 independently from the mixed molten liquid, a reaction vessel heating device 2207 is provided so that heating control may be made. This reaction vessel heating device 2207 is arranged on the outside of the reaction vessel 2201.

Moreover, in this group-III nitride crystal growth apparatus of FIG. 21, a gate valve 2208 is provided for the purpose of separation such that control for separation and unification between the circumference atmosphere 2220 of the first mixed molten liquid holding container 2202 and the circumference atmosphere 2221 of the second mixed molten liquid holding container 2212 may be made. In other words, in the group-III nitride crystal growth apparatus shown in FIG. 21, this gate valve 2208 separates or unifies the atmospheres of the plurality of temperature control zones independently controllable in temperature.

Separating the atmospheres of the plurality of temperature control zones enables holding of the atmosphere of each temperature control zone independently, and, thus, makes it possible to prevent the atmospheres of those zones from being mixed together. On the other hand, unifying the atmospheres of the plurality of temperature control zones enables these zones to have the common atmosphere.

Specifically, the circumference atmosphere 2220 of the first mixed molten liquid holding container 2202 and the circumference atmosphere 2221 of the second mixed molten liquid holding container 2212 are integrated/unified by opening the gate valve 2208 in the group-III nitride crystal growth device shown in FIG. 21. The gate valve 2208 is closed for separating the circumference atmosphere 2220 of the first mixed molten liquid holding container 2202 from the circumference atmosphere 2221 of the second mixed molten liquid holding container 2212.

Moreover, controlling independently the atmospheres of the plurality of temperature control zones can be achieved where the atmospheres of the plurality of temperature control zones are separated by the gate valve 2208 in the group-III nitride crystal growth apparatus according to the ninth embodiment.

That is, in the group-III nitride crystal growth apparatus of FIG. 21, in case an group-III nitride crystal is made grow up in either the first temperature control zone or the second temperature control zone, the atmosphere of the first temperature control zone and the second temperature control zone is divided by the gate valve 2208. On the other hand, in case the alkaline metal (Na) is conveyed therebetween, the gate valve 2208 is widely opened and thus, the divided atmospheres of the first temperature control zone and the second temperature control zone are unified.

The way of conveying of the alkaline metal (Na) is the same as that in the case of the above-described eighth embodiment. That is, in conveying the alkaline metal to the second temperature control zone from the first temperature control zone, the atmospheres of these two zones are unified, and, then, the first temperature control zone is heated into more than the temperature at which the alkaline metal evaporates, while the temperature of the second temperature control zone is made lower than the temperature at which an alkaline metal does not evaporate or coagulate. By doing so, the alkaline metal is conveyed to the second temperature control zone from the first temperature control zone as in the eighth embodiment.

Moreover, in the group-III nitride crystal growth apparatus shown in FIG. 21, in order to supply the substance (in this example, nitrogen gas) which contains nitrogen into the circumference atmosphere 2220 (referred to as a first atmosphere 2220, hereafter) of the first mixed molten liquid holding container 2202, a first nitrogen supply pipe 2204 is provided. Moreover, in order to supply the substance (in this example, nitrogen gas) which contains nitrogen into the circumference atmosphere 2221 (referred to as a second atmosphere 2221, hereafter) of the second mixed molten liquid holding container 2212, a second nitrogen supply pipe 224 is provided. Moreover, in order to adjust the nitrogen pressure supplied into the first atmosphere 2220, a first pressure adjustment mechanism 2205 is provided, while, in order to adjust the nitrogen pressure supplied into the second atmosphere 2221, a second pressure adjustment mechanism 2225 is provided. These pressure adjustment mechanisms 2205 and 2225 include pressure sensors, pressure adjustment valves etc.

Moreover, the material of the reaction vessel 2201 is stainless steel, and the material of the mixed molten liquid holding containers 2202 and 2212 and the connection pipe 2108 is BN (boron nitride) or pyrolytic BN.

A group-III nitride crystal growth process executed in the above-described group-III nitride crystal growth apparatus will now be described with reference to FIGS. 22A through 22H. FIGS. 22A through 22D show transition of the state of the first mixed molten liquid holding container 2202, while FIGS. 22E through 22H show corresponding transition of the state of the second mixed molten liquid holding container 2212.

Figure 22A:
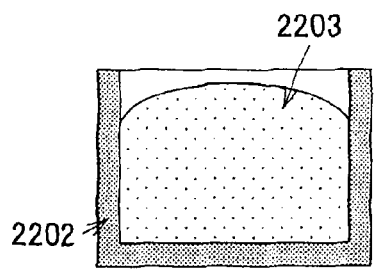
FIGS. 22A through 22H and 23A through 23H illustrate group-III nitride crystal growth processes according to the present invention performed in the apparatus shown in FIG. 21.
Figure 22E:
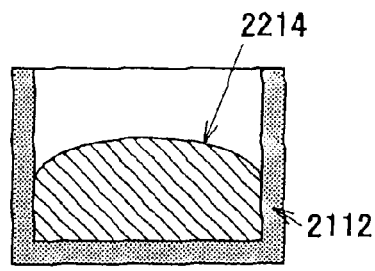

First, a mixed molten liquid 2203 of Ga as the group-III metal and Na as the alkaline metal is prepared in the first mixed molten liquid holding container 2202, as shown in FIG. 22A. At this time, as shown in FIG. 22E, only Ga 2114 as the group-III metal is provided in the second mixed molten liquid holding container 2212. At this time, the gate valve 2208 may be either closed or opened, i.e., the first and second atmospheres 2220 and 2221 may be either separated or unified.

Under such conditions, the gate valve 2208 is closed. Then, the nitrogen pressure in the first atmosphere 2220 is increased into 50 atmospheres, for example, and also, the temperature in the first mixed molten liquid holding container 2202 is increased into 750 degrees C. by using the first heating device 2206 by which crystal growth can starts there. At this time, in the second mixed molten liquid holding container 2212, the temperature is still the room temperature unchanged.

Figure 22B:
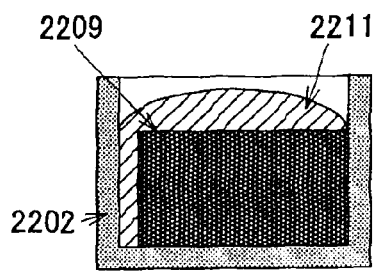
Figure 22F:
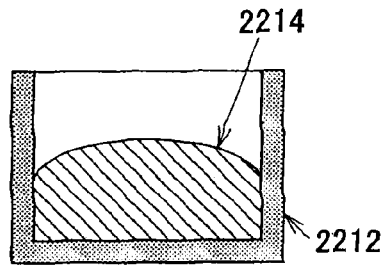

By keeping these growth conditions for a predetermined time interval, the GaN crystal 2209 which is the group-III nitride grows in the first mixed molten liquid holding container 2202, as shown in FIG. 22B. In this time, no transportation of Na occurs between the two mixed molten liquid holding containers 2202 and 2212 as the gate valve 2208 is closed. Accordingly, there is no Na as the alkaline metal in the second mixed molten liquid holding container 2112, and, thus, GaN crystal does not grow there, as shown in FIG. 22F.

The above-mentioned temperature and nitrogen pressure conditions are kept until the group-III nitride crystal (GaN crystal) grows sufficiently in the first mixed molten liquid holding container 2202. At this time, as shown in FIG. 22B, in the first mixed molten liquid holding container 2202, all Ga is consumed to yield the GaN crystal and then this container 2202 enters a state where only the GaN crystal 2109 and Na 2111 exist. At this time, in the second mixed molten liquid holding container 2212, the original state of FIG. 22E is kept unchanged as shown in FIG. 22F where only Ga 2214 exists.

Figure 22C:
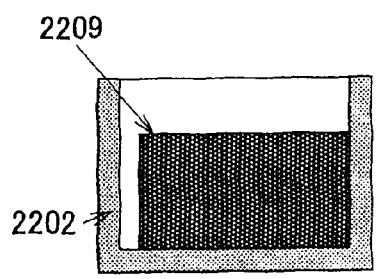

Next, after the nitrogen pressure in the first atmosphere 2220 is lowered to the normal pressure, the gate valve 2208 is opened, and, thus, the first and second atmospheres are integrated. In this state, the first mixed molten liquid holding container 2202 is increased in temperature into 900 degrees C., while the temperature of the second mixed molten liquid holding container 2212 is unchanged as the room temperature. Then, by holding these conditions for a predetermined time interval, Na 2211 as the alkaline metal moves to the second mixed molten liquid holding container 2212 from the first mixed molten liquid holding container 2202 in evaporated state due the temperature difference between the first and second containers 2202 and 2212. That is, Na 2211 which exists in the first mixed molten liquid holding container 2202 evaporates, and Na 2211 moves into the second mixed molten liquid holding container 2212 having the lower temperature. At this time, as shown in FIG. 22C, in the first mixed molten liquid holding container 2102, only the GaN crystal remains.

Figure 22G:
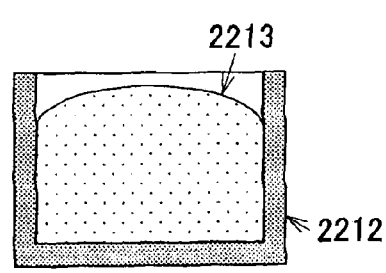

Then, by means of the reaction vessel heating device 2207, the temperature of the reaction vessel 2201 is increased into approximately 800 degrees C. in which Na does not adhere to the inner wall of the reaction vessel 2201. Then, by raising the temperature in the second mixed molten liquid holding container 2212 to approximately 100 degrees C., Na and Ga form a mixed molten liquid 2213 in the second mixed molten liquid holding container 2212, as shown in FIG. 22G. Then, after the transportation of Na 2211 from the first mixed molten liquid holding container 2202 to the second mixed molten liquid holding container 2212 is completed, the temperature of the first mixed molten liquid holding container 2202 and the temperature of the reaction vessel 2201 are returned to the room temperature.

Figure 22D:
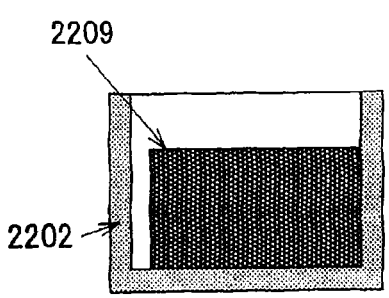
Figure 22H:
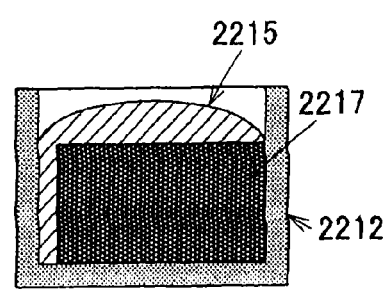

Next, the gate valve 2208 is closed, thus, the first and second atmospheres are separated, and the nitrogen pressure in the second atmosphere 2221 is increased into 50 atmospheres. Then, the temperature of the second mixed molten liquid holding container 2212 is increased to 750 degrees C., while the temperature of the first mixed molten liquid holding container 2202 is unchanged as the room temperature. Then by keeping these states for a predetermined time interval, a GaN crystal 2217 grows in the second mixed molten liquid holding container 2212. That is, Ga 2214 which was previously prepared in the second mixed molten liquid holding container 2212 at the beginning of the current process is completely consumed for the reaction so as to yield the GaN crystal in the second mixed molten liquid holding container 2212, as shown in FIG. 22H, and, thus, only the desired GaN crystal 2217 and Na 2215 remain there. In addition, at this time, in the first mixed molten liquid holding container 2202, the state in FIG. 22C is unchanged as shown in FIG. 22D.

Thus, according to the ninth embodiment, Na which is the alkaline metal is used for two times of growth of group-III nitride crystals (GaN crystal) in the group-III nitride crystal growth device. Accordingly, it is possible to effectively reduce the consumption of the alkaline metal, for example, to be halved. Thereby, cost reduction and environmental load reduction can be achieved.

Moreover, a refining effect of Na which reduces impurities can be obtained by returning Na which is the alkaline metal to liquid phase from gas phase, as in the eighth embodiment. Therefore, it becomes possible to grow up a high-quality group-III nitride crystal (GaN crystal) with fewer impurities.

In addition, in the ninth embodiment shown in FIG. 21, after the process illustrated with reference to FIGS. 22A through 22H, Na 2215 may be further moved into the first mixed molten liquid holding container 2202 from the second mixed molten liquid holding container 2212 from the state shown in FIGS. 22D and 22H, thus another group-III nitride crystal is further made grow in the first mixed molten liquid holding container 2202. FIGS. 23A through 23H show the process thus performed subsequent to the process shown in FIGS. 22A through 22H.

Figure 23A:
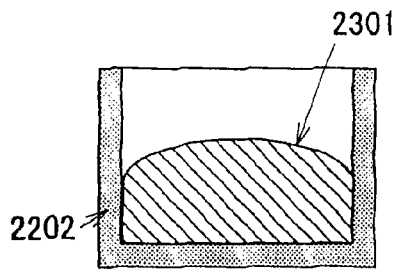
Figure 23B:
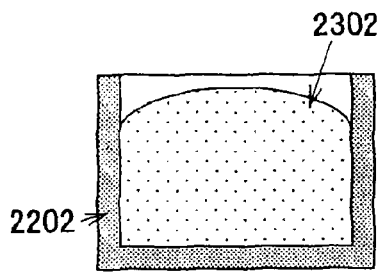
Figure 23C:
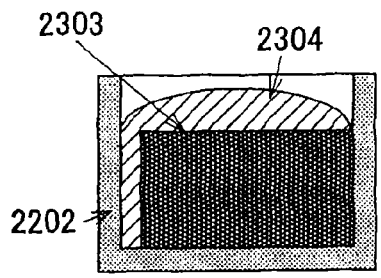
Figure 23D:
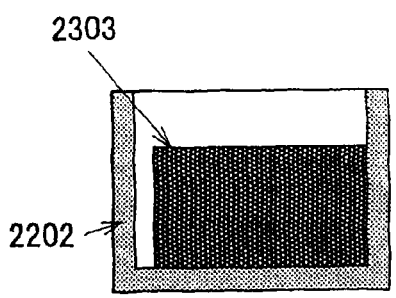
Figure 23E:
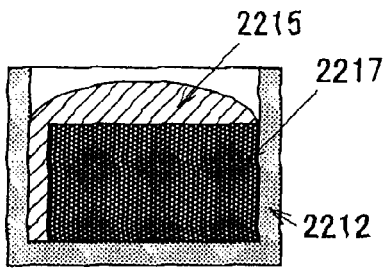

As shown in FIG. 22H, after crystal growth of the group-III nitride finishes in the second mixed molten liquid holding container 2212, the temperature of the second mixed molten liquid holding container 2212 is returned to the room temperature. At this time, Na 2215 exists in the second mixed molten liquid holding container 2212. Then, the gate valve 208 is closed, the GaN crystal 2209 is taken out from the first mixed molten liquid holding container 2202 in the state of FIG. 22D, and as shown in FIG. 23A, a metal Ga 2301 is newly put into the first mixed molten liquid holding container 2202. At this time, specifically, the GaN crystal 2209 may be exchanged with the Ga 2301 in the first mixed molten liquid holding container 2202, or, the entire mixed whole molten liquid holding container 2202 together with the GaN crystal may be replaced. At this time, in the second mixed molten liquid holding container 2212, the same state as that shown in FIG. 22H is maintained as shown in FIG. 23E, i.e., the GaN crystal 2217 and Na 2215 still exist.

Next, the first atmosphere 2220 is replaced by nitrogen atmosphere, where the pressure is made into the normal pressure, the gate valve 2208 is opened widely and the first atmosphere 2220 and second atmosphere 2221 are unified. Then, Na 2215 is conveyed to the first mixed molten liquid holding container 2202 from the second mixed molten liquid holding container 2212. That is, where the first atmosphere 2220 and second atmosphere 2221 are unified, the temperature of the second mixed molten liquid holding container 2212 is raised to 900 degrees C. while the temperature of the first mixed molten liquid holding container 2202 is unchanged as the room temperature. By maintaining this state for a predetermined time interval, Na 2215 moves to the first mixed molten liquid holding container 2202 from the second mixed molten liquid holding container 2212. Namely, Na 2215 which exists in the second mixed molten liquid holding container 2212 evaporates and moves to the first mixed molten liquid holding container 2202 with the lower temperature automatically.

Figure 23F:
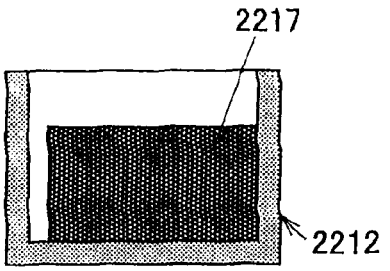

At this time, as shown in FIG. 23F, only the GaN crystal 2217 remains in the second mixed molten liquid holding container 2212. Moreover, at this time, the reaction vessel 2201 is heated by means of the reaction vessel heating device 2207 to approximately 800 degrees C. at which Na does not adhere to the inner wall thereof. Then, after transportation of Na 2215 is completed, the temperature of the second mixed molten liquid holding container 2212 and the temperature of the reaction vessel 2201 whole are returned to the room temperature. Subsequently, as the temperature in the mixed molten liquid holding container 2202 is raised to approximately 100 degrees C., Na and Ga form a mixed molten liquid 2302 in the first mixed molten liquid holding container 2202.

Next, the gate valve 2208 is closed, the first atmosphere 2220 and second atmosphere 2221 are thus separated, and the nitrogen pressure of the first atmosphere 2220 is raised to 50 atmospheres. Then, the temperature of the second mixed molten liquid holding container 2212 is unchanged as the room temperature, while the temperature of the first mixed molten liquid holding container 2202 is raised into 750 degrees C. Then, this state is held for a predetermined time interval. Thereby, a GaN crystal 2303 grows in the first mixed molten liquid holding container 2202 again as shown in FIG. 23C. After all Ga prepared at the beginning has been consumed for the reaction to yield the GaN crystal, only the desired GaN crystal 2303 and Na 2304 remain in the first mixed molten liquid holding container 2202 as shown in FIG. 23C.

Figure 23G:
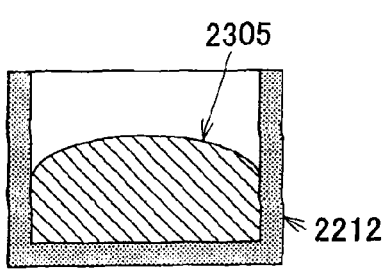

After GaN crystal growth in the first mixed molten liquid holding container 2202 is thus completed, the temperature of the first mixed molten liquid holding container 2202 is returned to the room temperature. At this time, Na 2304 exists in the first mixed molten liquid holding container 2202. Next, with the gate valve closed, the GaN crystal 2217 is taken out from the second mixed molten liquid holding container 2212 (see FIG. 23F), and then, as shown in FIG. 23G, a metal Ga 2305 is newly provided into the second mixed molten liquid holding container 2212. At this time, specifically, only the GaN crystal 2217 may be taken out from the second mixed molten liquid holding container 212 for Ga 2305, or, the entire mixed molten liquid holding container 2212 may be replaced. At this time, the GaN crystal 2303 and Na 2304 exist in the first mixed molten liquid holding container 2202 as shown in FIG. 23C.

Next, the second atmosphere 2221 is replaced by nitrogen atmosphere, where the pressure is made into the normal pressure, the gate valve 2208 is opened widely and the first atmosphere 2220 and second atmosphere 2221 are unified. As mentioned above, Na 2304 is conveyed to the second mixed molten liquid holding container 2212 from the first mixed molten liquid holding container 2202. Namely, the first atmosphere 2220 and second atmosphere 2221 are unified, the temperature of the first mixed molten liquid holding container 2202 is raised into 900 degrees C. while the temperature of the second mixed molten liquid holding container 212 is unchanged as the room temperature.

By maintaining this state for a predetermined time interval, Na 2304 moves to the second mixed molten liquid holding container 2212 from the first mixed molten liquid holding container 2202. Namely, Na 2304 which exists in the first mixed molten liquid holding container 2202 evaporates and moves into the second mixed molten liquid holding container 2212 with the lower temperature. After that, as shown in FIG. 23D, only the GaN crystal 303 remains in the first mixed molten liquid holding container 2202. Moreover, at this time, the reaction vessel 2201 is heated by the reaction vessel heating device 2207 into approximately 800 degrees C. at which Na does not adhere to the inner wall thereof.

Figure 23H:
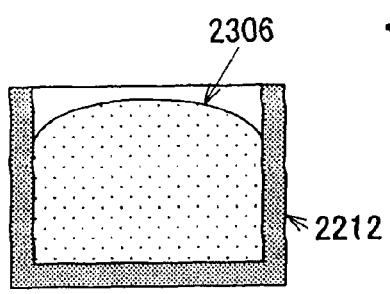

Subsequently, the temperature in the second mixed molten liquid holding container 2212 is raised to approximately 100 degrees C. Thereby, as shown in FIG. 23H, Na and Ga form a mixed molten liquid 2306. After the transportation of Na is completed to the second mixed molten liquid holding container 2212 from the first mixed molten liquid holding container 2202, the temperature of the first mixed molten liquid holding container 2202 and the temperature of the reaction vessel 2201 whole are returned to the room temperature.

This state shown in FIGS. 23D and 23H is the same as the state shown in FIGS. 22C and 22G, and, after that, the same processing may be repetitively repeated. Thereby, without newly supplying Na, growth of GaN crystal can be attained any number of times merely by supplying Ga. Therefore, the amount of consumption of Na which is the alkaline metal can be effectively saved, and, thus, cost reduction and environmental load reduction can also be achieved.

Moreover, also in this ninth embodiment, by increasing the number of times of Na transportation with distillation operation, the refining effect of Na is acquired and it becomes possible to attain much more high purity on Na.

In addition, in the example of process described above, extraction of the GaN crystal at the second time and subsequent thereto is made after the crystal growth in the other mixed molten liquid holding container is completed. However, this extraction operation may be performed immediately after conveying of the alkaline metal to the other zone and before the next crystal growth begins.

Thus, according to the ninth embodiment, different from the eighth embodiment, the gate valve 2208 is provided so as to completely separate the plurality of temperature control zones while crystal growth is performed.

Further, according to the ninth embodiment, the processes of crystal growth and alkaline metal transportation are repeated between the plurality of temperature control zones alternately, while closing/opening of the gate valve is controlled appropriately.

Figure 24:
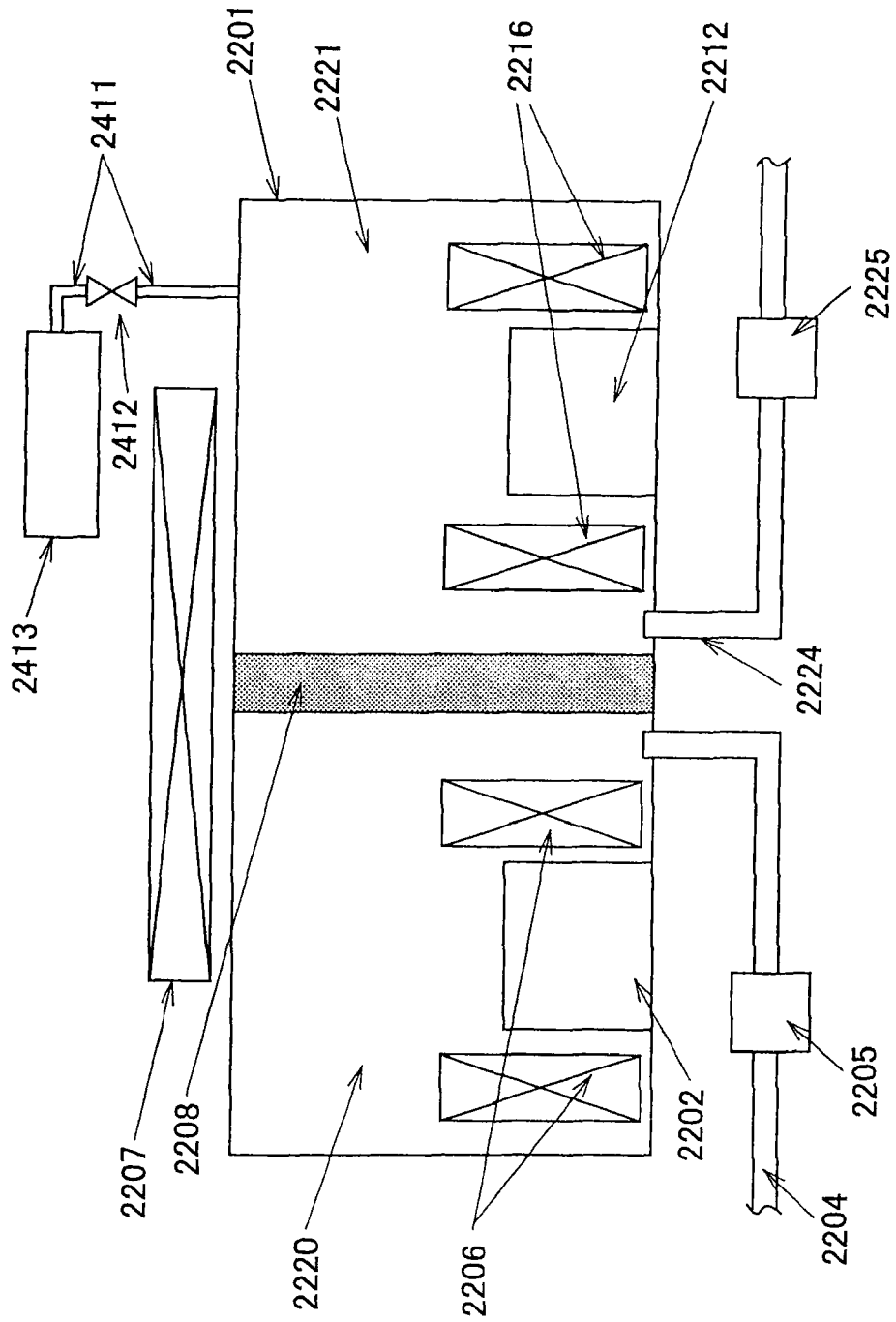
FIG. 24 illustrates a variant embodiment of the embodiment shown in FIG. 21.

FIG. 24 shows a variant embodiment of the ninth embodiment of the group-III nitride crystal growth apparatus. In comparison to the group-III nitride crystal growth apparatus of FIG. 21, a vacuum pump 2413 is added for a reaction vessel 2201 in the group-III nitride crystal growth device shown in FIG. 24. That is, the vacuum pump 2413 is connected to the reaction vessel 2201 via an exhaust pipe 2411. And also, an exhaust valve 2412 is provided in the middle of the exhaust pipe 2411 between the reaction vessel 2201 and vacuum pump 2413.

In this configuration, the vacuum pump 2413 and the exhaust pipe 2411 reduce the pressure in the reaction vessel 2201, and, further, the exhaust valve 2412 separates and integrates the atmosphere between the vacuum pump 2413 and reaction vessel 2201. That is, it is possible to decompress the atmosphere in the reaction vessel 2201 by operating the vacuum pump 2413 and opening the exhaust valve 2412.

That is, the vacuum pump 2413, the exhaust pipe 2411, and exhaust valve 2412 act as a decompression unit for changing the alkaline metal transportation zone into a decompressed state, in case the alkaline metal is conveyed to another temperature control zone from one temperature control zone.

According to the group-III nitride crystal growth device shown in FIG. 24, before conveying the alkaline metal from one temperature control zone to another temperature control zones as in the embodiment shown in FIG. 21, the inside of the reaction vessel 2201 is decompressed by the vacuum pump 2413. In this case, since the inside of the reaction vessel 2201 is decompressed in a state where the two temperature control zones 2220 and 2221 are unified by opening a gate value 2208, it becomes possible to convey Na at high speed compared with the case where Na is conveyed in the condition where the inside of the reaction vessel 2201 is in the normal pressure as in the configuration shown in FIG. 21. Therefore, further cost reduction on the growth of GaN crystal is attained.

Also a group-III nitride crystal yielded according to each of these eighth and ninth embodiments of the present invention may be applied to a group-III nitride semiconductor device as shown in FIG. 13 as in the cases of the first through seventh embodiments. Also in this case, the same advantages can be obtained as in the cases of the first through fourth embodiments described above.

Figure 25:
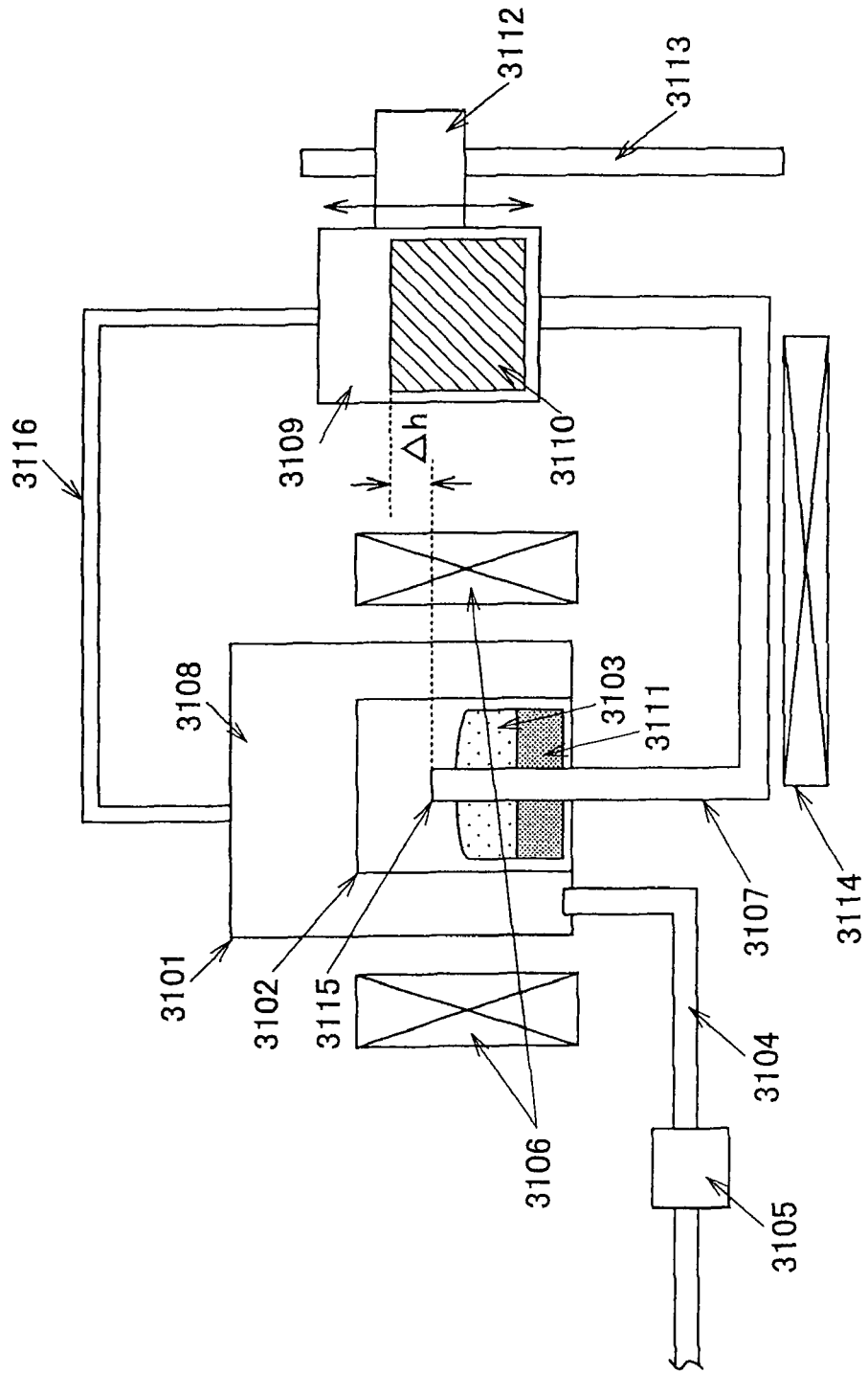
FIG. 25 illustrates a group-III nitride crystal growth apparatus in a tenth embodiment of the present invention.

A tenth embodiment of the present invention will now be described with reference to FIG. 25. FIG. 25 shows a side elevational sectional view of a group-III nitride crystal growth apparatus in the tenth embodiment of the present invention.

As shown in FIG. 25, a mixed molten liquid holding container 3102 holding a mixed molten liquid 3103 of the alkaline metal (for example, Na) and the substance which contains a group-III metal (for example, Ga) at least, are provided in a reaction vessel 3101.

The alkaline metal (for example, Na) may be supplied from the outside, or may exist in the reaction vessel 3101 from the beginning.

The reaction vessel 3101 is made of stainless steel. The mixed molten liquid holding container 3102 is made of BN (boron nitride), AlN, or pyrolytic BN.

A nitrogen supply pipe 3104 for supplying the substance (for example, nitrogen gas, ammonia gas, or sodium azide) which contains nitrogen at least, into the reaction vessel 3101 is provided in the group-III nitride crystal growth apparatus of FIG. 25.

A pressure adjustment mechanism in order to adjust the pressure of the nitrogen gas is provided in the nitrogen supply pipe 3104. This pressure adjustment mechanism 3105 includes a pressure sensor, a pressure adjustment valve, etc.

A first heating device 3106 for controlling the inside temperature of the reaction vessel 3101 into the temperature at which crystal growth on group-III nitride (for example GaN) may occur is provided in the reaction vessel 3101. That is, by the temperature control function of the first heating device 3106, the inside temperature of the reaction vessel 3101 is raised to the temperature at which the crystal growth is possible, lowered to the temperature at which the crystal growth stops, and also, the temperature in the reaction vessel 3101 is kept at each of these temperatures for an arbitrary time interval.

Moreover, at least, in order to supply the substance 3110 (referred to as a group-III material, hereafter) containing the group-III metal into the reaction vessel 101 from the exterior of the reaction vessel 3101, a material holding container 3109 which holds the group-III material 3110 is provided in the exterior of the reaction vessel 3101. Concretely, from this material holding container 3109, the group-III material 3110 (for example, metal Ga) is supplied by an amount corresponding an amount consumed in the reaction vessel 3101 (for example, consumed for the crystal growth of the GaN from Ga and N).

This material holding container 3109 and the reaction vessel 3101 are connected together by a supply pipe 3107 in order to supply the substance 3110 which contains the group-III metal at least into the mixed molten liquid holding container 3102, and also, are connected together by a pressure adjustment pipe 3116 such that the pressure in the reaction vessel 3101 and the pressure of the material holding container 3109 holding the substance 3110 containing the group-III metal at least may become equal.

There, the fact that the pressure in the reaction vessel 3101 and the pressure of the material holding container 3109 holding the substance 3110 containing group-III metal at least are equal means that the pressure of the gas in the reaction vessel 3101, and the pressure of the gas in the material holding container 3109 holding the substance 3110 containing group-III metal are equal.

Moreover, a mechanism which controls the relative height of the substance 3110 at least containing the group-III metal held by the material holding container 3109 with respect to the mixed molten liquid 3103 held by the mixed molten liquid holding container 3102 is provided. Concretely, at least, the mechanism which controls the relative height of the substance 3110 containing group-III metal and the mixed molten liquid 103 held by the mixed molten liquid holding container 3102 is such that the material holding container 3109 is supported by a support 3113 via a height adjustment unit 3112 for adjusting the height of the material holding container 3109. By means of this mechanism, the material holding container 3109 which contains the substance 3110 containing group-III metal at least is positioned higher than the mixed molten liquid holding container 3102 so that the substance 3110 containing group-III metal is automatically transported to the reaction vessel 101 due to the self gravity.

In this tenth embodiment shown in FIG. 25, the two containers 3101 and 3109 are connected physically via the pipes 3116 and 3107, thereby, the pressures of the gases in these containers 3101 and 3109 become equal to one another, so that the substance 3110 containing group-III metal may be conveyed therebetween merely by creating difference in height therebetween due to it's self gravity.

Moreover, a second heating device 3114 for carrying out heating control of the supply pipe 3107 and the material holding container 3109 is provided in the group-III nitride crystal growth apparatus shown in FIG. 25. By this second heating device 3114, the temperature of the supply pipe 3107 and material holding container 3109 is raised to approximately 40 degrees C., and, thereby, the group-III material (substance which contains group-III metal at least) 3110 is heated so that this material may be held in a liquid state (for example, liquid metal Ga), while it is sent to the reaction vessel 3101 through the supply pipe 3107.

The crystal growth of a group-III nitride can be made to start in this group-III nitride crystal growth apparatus by setting the temperature in the reaction vessel 3101 and effective nitrogen partial pressure as the conditions in which crystal growth of the group-III nitride can occur.

Concretely, the nitrogen pressure in the reaction vessel 3101 is made into 50 atmospheres, and the temperature in the reaction vessel 3101 is increased to the temperature of 750 degrees C. at which the crystal growth starts. By keeping for a predetermined time interval this growth condition, the group-III nitride crystal (for example, GaN crystal) 3111 grows in the mixed molten liquid holding container 3102.

At this time, the position of the material holding container 3109 which contains at least the substance 3110 containing group-III metal is made higher than the reaction vessel 3101, and, thereby, the substance 3110 containing group-III metal is supplied to the reaction vessel 3101 automatically due to the self gravity of the substance 3110 containing group-III metal as mentioned above.

Thus, in the tenth embodiment of the present invention, an amount of the group-III metal (for example, Ga) consumed as the group-III nitride crystal (for example, GaN) 3111 grows in the group-III nitride crystal growth apparatus can be appropriately supplemented in the liquid state through the supply pipe 3107 from the material holding container 3109. Simultaneously, the nitrogen consumed can be supplemented through the nitrogen gas supply pipe 3104 in the gas state.

Thus, after the growth of group-III nitride crystal begins, the group-III nitride crystal can be continuously made grow up through supply of the group-III material (substance which contains group-III metal at least) 3110 into the reaction vessel 3101.

Thus, by thus keeping stable supply of the group-III materials into the reaction vessel 3101, the group-III nitride crystal (for example, GaN crystal) 3111 can be made grow up stably, and the group-III nitride crystal (GaN crystal) having a large size can be yielded.

Thus, according to the present invention, no complicated process is needed, but it becomes possible to realize a quality group-III nitride crystal at low cost.

Furthermore, according to the present invention, growth temperature required is low, i.e., 1000 degrees C. or less, and also growth pressure required is 100 atmospheres or less. Accordingly, it is not necessary to use an expensive reaction vessel which can bear super-high pressure and super-high temperature. Consequently, it becomes possible to realize a semiconductor device using the group-III nitride crystal at low cost.

Furthermore, according to the tenth embodiment, especially, by continuously supplying the group-III material, it becomes possible to make the amount ratio of Ga in the mixed molten liquid 3103 constant, consequently to grow up the good group-III nitride crystal 3111 with a low defect density.

Specifically, according to the tenth embodiment shown in FIG. 25, the positional relationship between the mixed molten liquid 3103 contained in the mixed molten liquid holding container 3102 and the substance 3110 at least containing the group-III metal held by the material holding container 3109 is controlled at least according to the relationship between the mass of the substance 3110 at least containing the group-III metal and the friction amount of the portions through which the substance 3110 at least containing the group-III metal is fed from the material holding container 3109 to the mixed molten liquid holding container 3102. Thereby, a desired amount of the substance 3110 at least containing the group-III metal is properly fed.

In fact, the amount of the substance 3110 at least containing the group-III metal automatically fed from the group-III metal holding container 3109 to the mixed molten liquid holding container 3102 is determined according to the mutual height relationship of the substance 3110 at least containing the group-III metal with respect to the mixed molten liquid 3103, the friction amount (referred to as a feeding friction amount) of the portions through which the substance 3110 at least containing the group-III metal is fed, and the mass of this substance 3110. Accordingly, the group-III nitride crystal growth apparatus according to the tenth embodiment of the present invention controls the amount of the substance containing group-III metal being fed by controlling the above-mentioned mutual height relationship (relative height) with respect to the feeding friction amount and the mass of the substance 3110.

Moreover, in this tenth embodiment shown in FIG. 25, a mechanism by which the amount of the substance 3110 which contains the group-III metal at least exists in the material holding container 3109 can be observed is provided.

Specifically, for example, at least a part of the material of the material holding container 3109 is made of a material having transparency with respect to visible light. Thereby, the amount of the substance 3110 at least containing the group-III metal can be optically observed from the outside of the container 3109.

The configuration shown in FIG. 25 will now be described in more detail. In this configuration, the mixed molten liquid 3103 which consists of Na as the alkaline metal and Ga as the group-III metal is held by the mixed molten liquid holding container 3102 provided in the reaction vessel 3101.

Moreover, in order to feed the substance (Ga) 3110 which contains the group-III metal at least from the outside of the reaction vessel 3101, the material holding container 3109 is provided in order to supply Ga as a group-III metal from the exterior of the reaction vessel 3101.

The supply pipe 3107 connects between the container 3109 and the reaction vessel 3101. As shown in FIG. 25, this supply pipe 3107 projects from the mixed molten liquid 3111 as the pipe 3107 extends from the bottom of the container 3109, and passes through the reaction vessel 3101 and the mixed molten liquid holding container 3102. Moreover, the pressure adjustment pipe 3116 connects between the top of the container 3109 and the reaction vessel 3101. The pressure in the reaction vessel 3101 and the pressure in the material holding container 3109 can be made equal by means of this pressure adjustment pipe 3116.

The material holding container 3109 is connected to the support 3113 through the height adjustment unit 3112. A pulse motor, a gear, etc. are prepared in the height adjustment unit 3112, and thus, it is possible to change continuously the vertical position thereof with respect to the support 3113. Thus, the vertical position of the container 3109 can be freely controlled by operation of the motor.

There, the supply pipe 3107 and the pressure adjustment pipe 3116 which connect between the reaction vessel 3101 and the material holding container 3109 have flexibility such that, no trouble/problem occur even when the positional relationship between the reaction vessel 3101 and material holding container 3109 changes as mentioned above. For example for this purpose, a stainless steel pipe whose outer diameter is $\frac{1}{16}$ inch is used as these pipes 3107 and 3116.

Moreover, the supply pipe 3107 and the container 3109 have the second heating device 3114 which performs temperature control such that the supply pipe 3107 and the material holding container 3109 are heated as mentioned above. For example, a heater is wound on the supply pipe 3107 and container 3109 so as to heat them. The temperature thereof is set as approximately 40 degrees C., and thereby, the metal Ga keeps in liquid state.

Under such a situation, as the substance which contains nitrogen at least (nitrogen gas is used, in this example), nitrogen pressure in the reaction vessel 3101 is made into 50 atmospheres, and the temperature is increased to the temperature of 750 degrees C. at which the crystal growth starts. By keeping this growth condition for a predetermined time interval, the GaN crystal 3111 which is the group-III nitride grows in the mixed molten liquid holding container 3102. At this time, the GaN crystal grows and the thus-consumed metal Ga is supplied into the mixed molten liquid holding container 3102 through the supply pipe 3107 from the material holding container 3109. The consumed nitrogen is supplied through the nitrogen gas supply pipe 3104 in the state of gas.

In order to cause automatic transportation of the metal Ga by its self gravity from the container 3109 to the mixed molten liquid holding container 3102 via the supply pipe 3104, the surface height of the liquid Ga 3110 in the container 3109 is made higher than the height of the top end 3115 of the supply pipe 3104 projecting from the mixed molten liquid 3110 in the mixed molten liquid holding container 3102. Thereby, the metal Ga is transported automatically by its self gravity from the container 3109 to the mixed molten liquid holding container 3102 via the supply pipe 3104. Namely, as shown in FIG. 25, $$\Delta h > 0$$

where $\Delta h$ denotes a mutual height of the surface of Ga 3110 in the container 3109 with respect to the top end 3115 of the supply pipe 3104. There, according to an experiment, the following requirement should be satisfied for causing automatic feeding of the liquid Ga:

$$\Delta h \geq 40 \text{ (mm)}$$

in case, as the supply pipe 3107, a stainless steel pipe having an outer diameter of $\frac{1}{16}$ inch and a length of 500 mm is used.

It becomes possible to control the amount of liquid Ga fed into the mixed molten liquid holding container 3102, and the feeding rate thereof, by controlling the speed in lifting the container 3109 by the height adjustment unit 3112, and by previously determining the content of the container 3109.

The feeding rate of liquid Ga is thus controlled as mentioned above, and thereby, a desired large size of GaN crystal is attained by growing up the GaN crystal 3111 continuously stably.

According to an experiment, for causing the above-mentioned automatic feeding of liquid Ga, essential matters are such that the pressure should be made equal through the pressure adjustment pipe 3116 among the reaction vessel 3101, supply pipe 3104 and material holding container 3109; and, also, careful study should be made on relationship between the above-mentioned height difference $\Delta h$ and friction loss in the supply pipe 3104.

Figure 26:
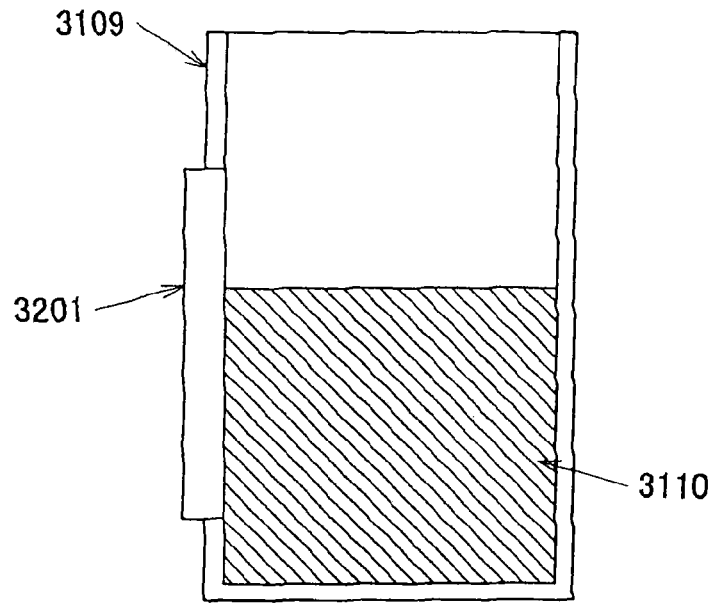
FIG. 26 illustrates a first variant embodiment of the embodiment shown in FIG. 25.

FIG. 26 shows a first example of a device allowing observation of the amount of liquid Ga present in the material holding container 3109 shown in FIG. 25. FIG. 26 shows a side elevational sectional view of the container 3109 shown in FIG. 25. There, the Ga 3110 is in liquid state by keeping the temperature of the container 3109 at approximately 40 degrees C.

In this example, a window 3201 for Ga surface check is provided as a part of the side wall of the container 3109. This window 3201 is made of a pressure-resist glass, and the container 3109 is formed by stainless steel. Thus, this window 3201 has a resistance against pressure, in a case of the crystal growth pressure mentioned above with reference to the tenth embodiment. This window 3201 is embedded in the side wall of the container 3109, and it is located so that the surface of Ga 3110 can be observed therethrough, and the glass thereof may touch the Ga liquid 3110, as shown in FIG. 26.

Moreover, preferably, coating of GaN thin film is made on the inside walls of the window 3201 and the container 3109. When the inside walls of the window 3201 and container 3109 which the liquid Ga touches have the same material (GaN in this case), the container 3109 and window 3201 have the same wetting angle with respect to the liquid Ga, in the inside thereof, and thus, the container 3109 and window 3201 become wet uniformly with the liquid Ga. Consequently, it becomes possible to properly observe the remaining amount of liquid Ga in the container 3109 to be fed into the mixed molten liquid holding container 3102.

Since the stainless steel surface and the surface of glass have different wetting angles, proper observation of Ga residual amount would be difficult if there were no such a GaN thin film coating.

Thus, according to the configuration shown in FIG. 26, the amount of Ga liquid being fed to the mixed molten liquid holding container 3102 can be checked because the Ga residual quantity in the container 3109 can be checked on real time, and the crystal growth control performance on the GaN crystal in the tenth embodiment improves further. That is, control on the ratio in amount of Ga in the mixed molten liquid 3103 improves, and thereby, the yielded crystal quality can be improved.

Figure 27:
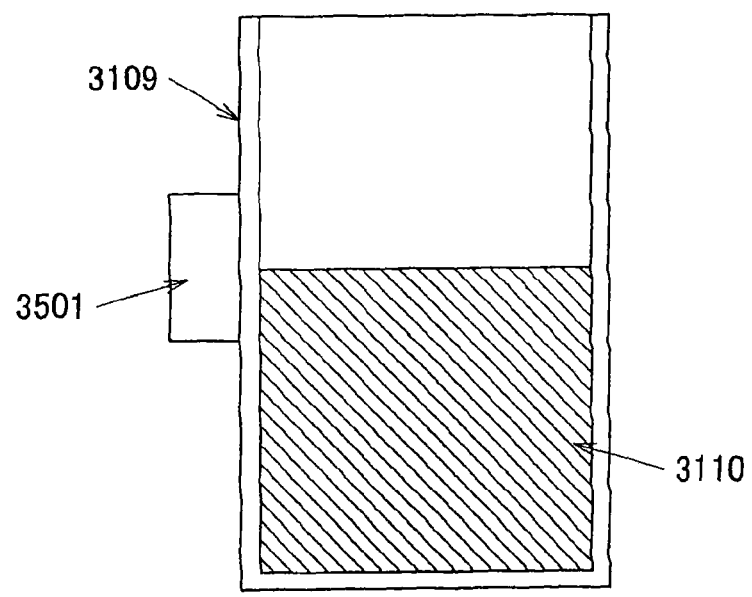
FIG. 27 illustrates a second variant embodiment of the embodiment shown in FIG. 25.

FIG. 27 illustrates a second embodiment of a liquid Ga surface observation device. FIG. 27 also shows a side elevational sectional view of the container 3109 shown in FIG. 25. As shown in FIG. 27, Ga 3110 is held by the container 3109, and it is in liquid state as a result of the temperature of the container 3109 is kept approximately 40 degrees C. In addition, the container 3109 is made by stainless steel.

Moreover, in the example of FIG. 27, an ultrasonic unit 3501 for Ga surface check is provided in a part of the outer side wall of the container 3109. This ultrasonic unit 3501 includes a transmitter of an ultrasonic wave, a receiver thereof, and a control system, and thereby, it is possible to observe the position on the surface of liquid of Ga according to detected difference in ultrasonic propagation in the container 3109.

In this configuration, since it is not necessary to embed a special device such as a window in the example shown in FIG. 26 into the wall of the container 3109, the pressure-resistant ability is higher, and thereby, high flexibility in crystal growth pressure is obtained which is the important item of crystal growth conditions. Further, the safety performance also increases. Furthermore, no special inside coating as in the above-mentioned example shown in FIG. 26 is needed because the liquid Ga always touches the same the material of the original wall of the container 3109. Consequently, cost reduction is attained.

Moreover, the ultrasonic unit 3501 can be moved on the outer wall of the Ga container 3109 vertically to follow the current surface of the liquid Ga, and thereby, the position of the surface of liquid of Ga 3110 can be positively detected. Accordingly, the amount of Ga liquid being fed to the mixed molten liquid holding container 3102 can be checked because the Ga residual quantity in the container 3109 can be checked on real time, and the crystal growth control performance on the GaN crystal in the tenth embodiment improves further. That is, control on the ratio in amount of Ga in the mixed molten liquid 3103 improves, and thereby, the yielded crystal quality can be improved.

Figure 28:
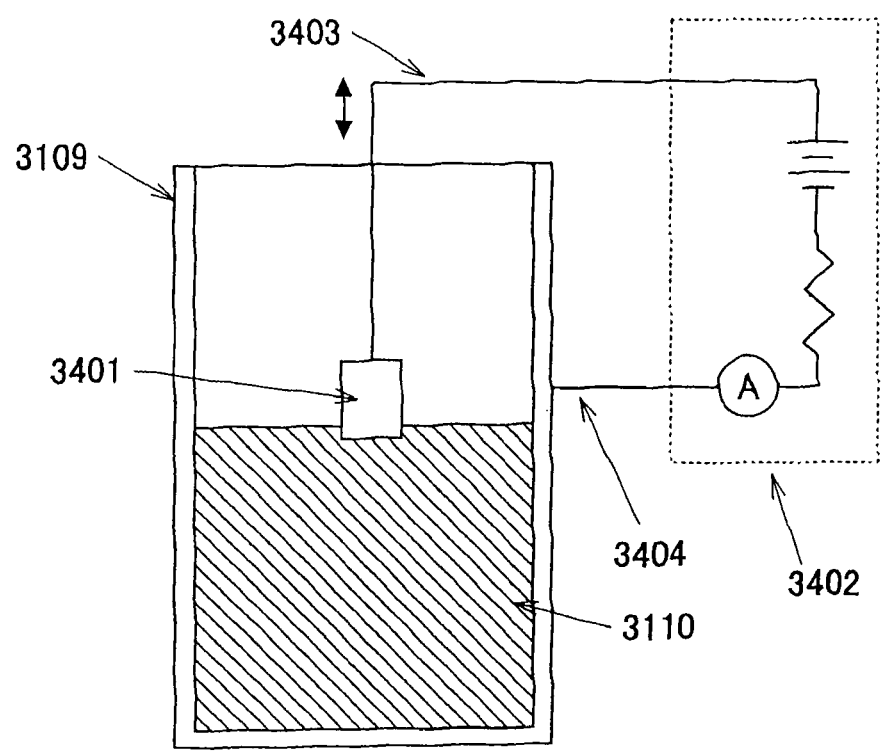
FIG. 28 illustrates a third variant embodiment of the embodiment shown in FIG. 25.

FIG. 28 illustrates a third example of a liquid Ga surface observation device. FIG. 28 shows a side elevational sectional view of the material holding container 3109 shown in FIG. 25. Also in this configuration, Ga 3110 is held by the container 3109. There, Ga 3110 is in liquid state as the temperature of the Ga container 3109 is kept approximately 40 degrees C. In addition, the container 3109 is made by stainless steel.

Moreover, in the example of FIG. 28, an electrode 3401 is held at a position near the surface of Ga 3110. This electrode 3401 can be moved vertically according to the height change in the surface of Ga 3110. Moreover, on the outside of the container 3109, a power supply unit 3402 is provided. The power supply unit 3402 includes a power supply source, a resistor, an ammeter, etc. One terminal of the power supply unit 3402 is connected to the electrode 3401 positioned inside of the container 3109 by a first electric wiring 1403. Moreover, the other terminal of the power supply unit 3402 is connected to the outer wall of the container 3109 by a second electric wiring 3404, as shown in FIG. 28.

In such a situation, when the electrode 3401 is in contact with Ga 3110, an electric current is made to flow into the ammeter in the power supply unit 3402. On the other hand, after Ga is fed into the mixed molten liquid holding container 3102, the surface of Ga in the container 3109 thus falls, and the electrode 3401 is made apart from the Ga surface. Then, the electric current flow is terminated accordingly.

By utilizing the above-descried principle, according to the example shows in FIG. 28, the electrode 3401 is lowered until the electric current starts flowing into the ammeter in the power supply unit 3402, and, thus, it is possible to detect/observe the current surface position of the Ga 3110 in the container 3109

Also in this configuration, since it is not necessary to embed a special device such as a window in the example shown in FIG. 26 into the wall of the container 3109, the pressure-resistant ability is high, and thereby, high flexibility in crystal growth pressure is obtained which is the important item of crystal growth conditions. Further, the safety performance also increases. Furthermore, no special inside coating as in the above-mentioned example shown in FIG. 26 is needed because the liquid Ga always touches the same the material of the original wall of the container 3109. Consequently, cost reduction is attained.

Moreover, the amount of Ga liquid being fed to the mixed molten liquid holding container 3102 can be checked because the Ga residual quantity in the container 3109 can be checked on real time, and the crystal growth control performance on the GaN crystal in the tenth embodiment improves further.

That is, control on the ratio in amount of Ga in the mixed molten liquid 3103 improves, and thereby, the yielded crystal quality can be improved.

Also a group-III nitride crystal yielded according to this tenth embodiment of the present invention, may be applied to a group-III nitride semiconductor device as shown in FIG. 13 as in the cases of the first through ninth embodiments. Also in this case, the same advantages can be obtained as in the case of applying the first through ninth embodiments described above.

An eleventh embodiment of the present invention will now be described with reference to FIGS. 29 and 30.

Figure 29:
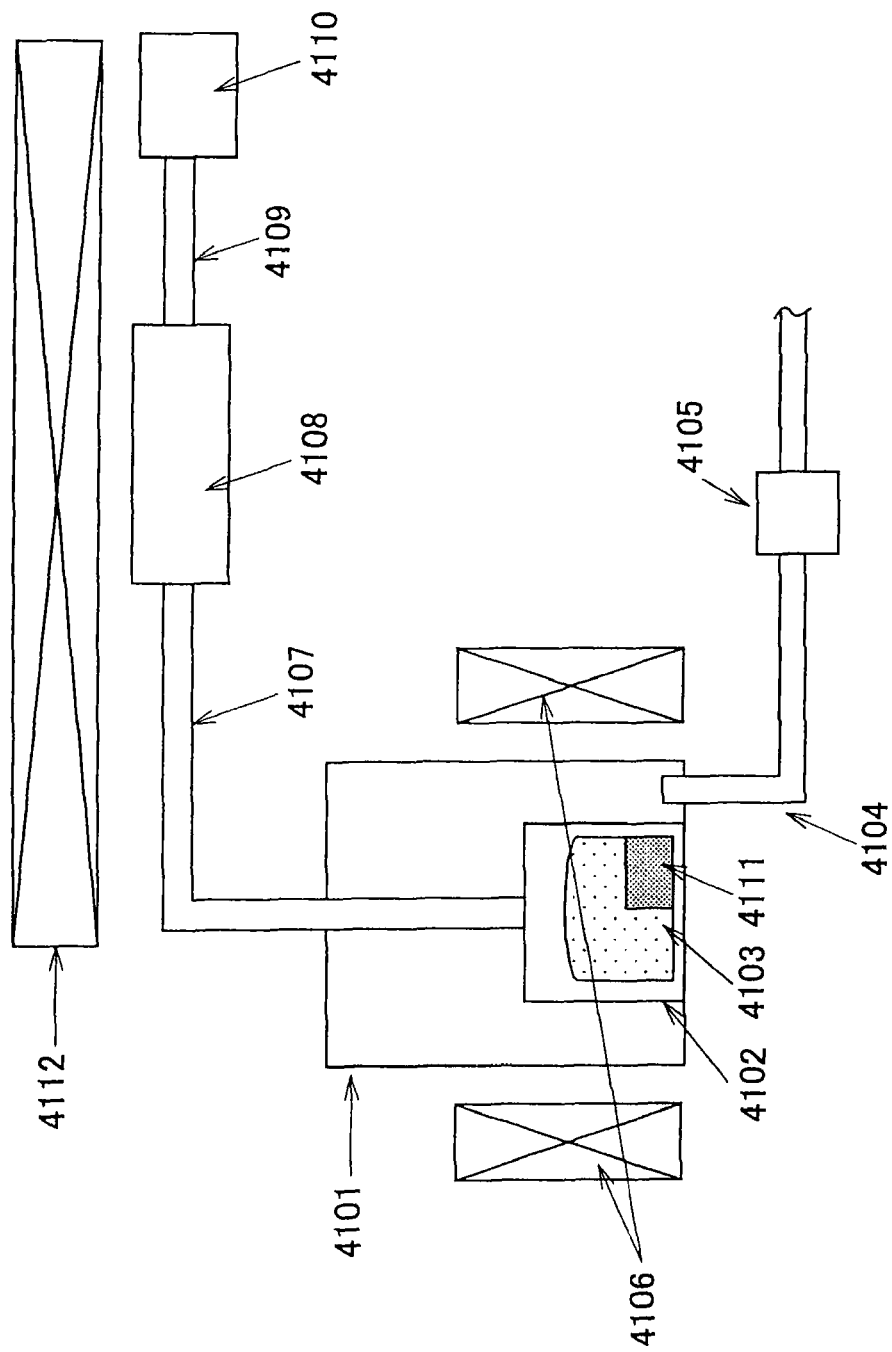
FIG. 29 illustrates a group-III nitride crystal growth apparatus in an eleventh embodiment of the present invention.

As shown in FIG. 29, as in the above-mentioned other embodiments, a mixed molten liquid holding container 4102 holding a mixed molten liquid 4103 of an alkaline metal (for example, Na) and a substance which contains a group-III metal (for example, Ga) at least, is provided in a reaction vessel 4101.

In addition, the alkaline metal (for example, Na) may be supplied from the outside, or may exist in the reaction vessel 3101 from the beginning.

Moreover, the reaction vessel 4101 is made by stainless steel. Moreover, the mixed molten liquid holding container 3102 is made by BN (boron nitride), AlN, or pyrolytic BN.

Moreover, a nitrogen supply pipe 4104 for supplying a substance (for example, nitrogen gas, ammonia gas, or sodium azide) which contains nitrogen at least, is also provided in the reaction vessel 4101.

Moreover, a pressure adjustment mechanism 4105 is provided in order to adjust the pressure of nitrogen gas in the nitrogen supply pipe 4104. In addition, this pressure adjustment mechanism 4105 includes a pressure sensor, a pressure adjustment valve, etc.

Moreover, a first heating device 4106 is provided for controlling the inside temperature of the reaction vessel 4101 to the temperature at which crystal growth of the group-III nitride (for example GaN) may occur in the reaction vessel 4101. That is, as in each of the above-described embodiments, by the temperature control function of the first heating device 4106, the temperature is raised so that the crystal growth may occur, is lowered so that the crystal growth stops, each of these temperatures is kept for a predetermined time interval, appropriately.

Moreover, in order to supply the substance (referred to as a group-III material) which contains a group-III metal in the group-III nitride crystal growth apparatus, at least to the reaction vessel 4101 from the exterior of the reaction vessel 4101, a container 4110 holding the group-III material is provided in the exterior of the reaction vessel 4101. The amount of group-III material (for example, metal Ga) consumed in the reaction vessel 4101 (for example, Ga consumption made for causing crystal growth of GaN from Ga and N) is supplemented from this material holding container 4110 holding the group-III material (for example, metal Ga) in liquid state as a result of being heated by means of a second heating device 4112.

A first supply pipe 4107 and a second supply pipe 4109 connect this container 4110 to the mixed molten liquid holding container 4102 in the reaction vessel 4101, and, thereby, the group-III material can be supplied to the mixed molten liquid holding container 4102 from the material holding container 4110.

Moreover, in order to cause stable continuous supply of the group-III material from the container 4110 to the reaction vessel 4101 through the supply pipes 4107 and 4109, a pump (liquid-feeding pump) 4108 is provided between the first supply pipe 4107 and the second supply pipe 4109 in the group-III nitride crystal growth apparatus shown in FIG. 29.

As shown in FIG. 30, as this pump 4108, such a type that, thereby, rotational movement of a motor is transformed into a linear reciprocating movement of a rod, may be applied.

Specifically, as shown in FIG. 30, the container 4110 is located on the upstream side (right side in the figure) of the second supply pipe 4109, and the reaction vessel 4101 is located on the downstream side (left side in the figure) of the first supply pipe 4107.

A motor 4201 rotates a rotational shaft 4202 according to a given electric signal. This rotational shaft 4202 is coupled with a cam 4203 at an eccentric position thereof. Also, the cam 4203 has an ellipse shape. Moreover, the rod 4204 always touches the side surface of the cam 4203. By such a configuration, according to a well-known mechanism, the rod 4204 performs the reciprocating action along arrows A1 and A2 shown in the figure according to rotation of the cam 4203 caused by the rotation of the rotational shaft 4202 by the motor 4201.

This rod 4204 is inserted into one pipe portion 4205a of a T-shape third supply pipe 4205. The other pipe portions 4205b and 4205c of the third supply pipe 4205 are connected with a first check valve (or non-return valve) 4206 and a second check valve (or non-return valve) 4207, respectively. Also, the downstream end of the first check valve 4206 is connected with the first supply pipe 4107, while the upstream end of the second check valve 4207 is connected with the second supply pipe 4109.

In each of the first and second check valves 4026 and 4207, springs 4208 and 4209, and balls 4210 and 4211 are provided, respectively. The internal structures of these check valves are also shown in FIG. 30. As shown in the figure, the balls 4210 and 4211 are arranged at the upstream side, and the springs 4208 and 4209 press these balls 4210 and 4211 from the downstream side. There, the balls 4210 and 4211 stop at the upstream end of the valves 4206 and 4207, respectively. When the balls 4210, 4211 touch openings 4206a and 4207a of the valves 4206 and 4207, the valves are closed, respectively, and thus no flow along the reverse direction (from the downstream side to the upstream side) is allowed there.

In this configuration, when the rod 4204 moves by the pump 4108 along the arrow A2, the inside of the third supply pipe 4205 enters a decompressed state, and thereby, the group-III material in liquid state is drawn in from the container 4110. At this time, the first check valve 4206 prevents the adverse flow because the ball 4210 moves to the upstream side, while the ball 4211 of the second check valve 4207 can be moved to the downstream side. Thereby, the group-III material in liquid state can be drawn in from the container 4110.

On the contrary, when the rod 4204 moves along the direction of arrow A1, the inside of the third supply pipe 4205 enters a compressed state, and the group-III material in liquid state drawn in from the container 4110 as mentioned above is then pushed out to the downstream side (toward the reaction vessel 4101). At this time, the adverse flow of the group-III material in liquid state can be prevented as the ball 4211 of the second check value 4207 moves to the upstream side, while, as the ball 4210 moves to the down-stream side in the check valve 4026, the group-III material in liquid state can be forwarded to the reaction vessel 4101.

In this configuration, the rate of feeding the group-III material in liquid state into the reaction vessel 4101 can be controlled by controlling the rotation speed of the motor 4201 so as to control the reciprocating movement speed of the rod 4204. Thus, it becomes possible to control the feeding rate of the group-III material in liquid state into the reaction vessel 4101.

Thus, the liquid-sending speed of the group-III material in liquid state into the reaction vessel 4101 can be controlled, and thus, the group-III material can be stably supplied to the reaction vessel 4101.

According to an experiment, for the purpose of fine control of the material feeding rate of the group-III material by mean of the pump 4108, the material of the balls 4210 and 4211 of the check values 4206 and 4207 is essential. Namely, the density of the balls 4210 and 4211 in the check valves 4206 and 4207 should be higher than the density of the group-III material to be fed. Experiments were conducted for cases of using stainless steel (density being 8 $g/cm^3$), sapphire, and glass (density being 4 $g/cm^3$) as the material of the balls 4210 and 4211, while density (for example, density of metal Ga) of group-III material is approximately 6 $g/cm^3$. As a result, by using the stainless steel of higher density than the density of group-III material as the material of balls 4210 and 4211, the check valves 4206 and 4207 performed satisfactory operation as mentioned above. On the other hand, when sapphire, glass, or the like, having the density lower than the density of group-III material was used as the material of the balls 4210 and 4211, the check valves 4206 and 4207 did not operate properly and, rather, the group-III material in liquid state flowed backwards.

In addition, in this embodiment, not only a spherical shape but also another shape such as an ellipse shape or a polygon shape may be applied as the balls of the check values.

Moreover, a second heating device 4112 is provided for carrying out temperature control of the first supply pipe 4107, second supply pipe 4109, pump 4108, and container 4110 in the group-III nitride crystal growth apparatus shown in FIG. 29. The group-III material can be kept liquid state as the temperature of the first supply pipe 4107, second supply pipe 4109, pump 4108, and container 4110 as approximately 40 degrees C. by the second heating device 4112. Thereby, the group-III material held by the container 4110, and, the same being fed therefrom into the reaction vessel 4101 through the second supply pipe 4109, pump 4108, and first supply pipe 4107 are kept liquid state.

Crystal growth of the group-III nitride can be made to start in the group-III nitride crystal growth apparatus shown in FIG. 29 by setting the temperature in the reaction vessel 4101 and the effective nitrogen partial pressure there as the conditions at which the group-III nitride crystal starts crystal growth.

Concretely, the nitrogen pressure in the reaction vessel 4101 is made into 50 atmospheres, and the temperature in the reaction vessel 4101 is raised to the temperature of 750 degrees C. at which crystal growth starts. By keeping this growth condition for a predetermined time interval, the group-III nitride crystal (for example, GaN crystal) 4111 grows in the mixed molten liquid holding container 4102.

At this time, the pump 4108 is used to supply the group-III material from the container 4110 for supplementing the amount of group-III material (for example, Ga) consumed in the group-III nitride crystal growth apparatus for yielding the group-III nitride crystal (for example, GaN) 4111 through crystal growth. The group-III material is supplied in liquid state to the reaction vessel 4101 through the second supply pipe 4109 and the first supply pipe 4107. Moreover, the nitrogen is also supplied for supplementing the consumed nitrogen for the above-mentioned crystal growth through the nitrogen gas supply pipe 4104 in the state of nitrogen gas.

Thus, after growth of the group-III nitride crystal begins, the group-III nitride crystal can be continuously grown up by having the group-III material (substance which contains group-III metal at least) fed in the reaction vessel 4101 (and to the container 4103) from the container 4110.

Thus, by utilizing the pump 4108, stable and continuous supply of the group-III material to the reaction vessel 4101 can be achieved. Accordingly, the group-III nitride crystal (for example, GaN crystal) 4111 can be grown up well, and the group-III nitride crystal (GaN crystal) having a large size can be yielded. Thus, without needing a complicated process. A quality group-III nitride crystal can be obtained at low cost.

Furthermore, according to the eleventh embodiment, especially, by continuously supplying the group-III material, it becomes possible to make the amount ratio of Ga in the mixed molten liquid 4103, consequently to grow up the good group-III nitride crystal 4111 with a low defect density.

Also a group-III nitride crystal yielded according to this eleventh embodiment of the present invention may be applied to a group-III nitride semiconductor device as shown in FIG. 13 as in the cases of the first through tenth embodiments. Also in this case, the same advantages can be obtained as in the case of applying the first through tenth embodiments described above.

Figure 31A:
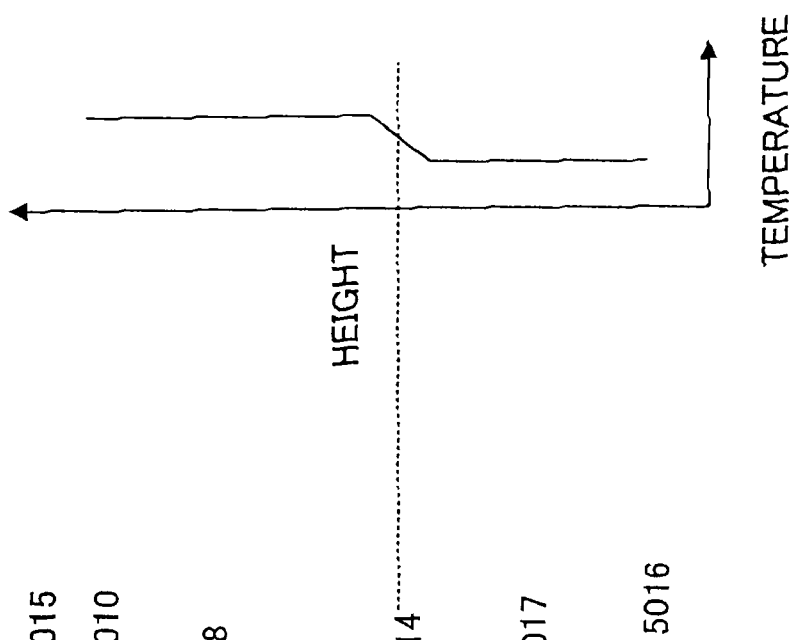
FIGS. 31A and 31B illustrate a group-III nitride crystal growth apparatus in a twelfth embodiment of the present invention.

A twelfth embodiment of the present invention will now be described with reference to FIGS. 31A and 31B. FIG. 31A shows a side elevational sectional view of a crystal growth apparatus in the twelfth embodiment of the present invention.

As shown in FIG. 31A, a crystal growth container 5012 by which a group-III metal 5018 and an alkaline metal molten liquid 5017 are held is provided in a reaction vessel 5010 made of stainless steel having a closed shape, as in the other embodiments. In addition, a lid 5013 is provided on the crystal growth container 5012. There, the crystal growth container 5012 is divided by a mesh 5014, and the group-III metal 5018 is held by an upper part with respect to the mesh 5014. Moreover, the alkaline metal molten liquid and molten liquid of group-III metal are held by the lower part of the mesh 5014 in a mixed state. Crystal growth of group-III nitride is performed in a zone of the lower part of the mesh 5014.

In addition, the material of the crystal growth container 5012, lid 5013, and mesh 5014 is BN (boron nitride). Moreover, heaters 5015 and 5016 are provided on the outside of the reaction vessel 5010. The heater 5015 and heater 5016 can perform temperature control operation independently, respectively.

Next, a method of crystal growth on GaN employing the crystal growth apparatus shown in FIG. 31A will now be described. First, Na 5017 as the alkaline metal is held by the crystal growth container 5012 (lower part). Next, the mesh 5014 is put in and the upper part and the lower part of the crystal growth container 5012 are defined. Next, granular crystals 5018 of GaN of particle diameter coarser than the mesh 5014 is put in the upper part of the crystal growth container 5012.

Subsequently, the lid 5013 is put on the crystal growth container 5012, which is then put in the reaction vessel 5010. Then, the lid 5011 is attached on the reaction vessel 5010, and the inside space of the reaction vessel 5010 is sealed from the external atmosphere. A work of attaching the lid 5011 onto the reaction vessel 5010 is done in the pressurized dry high-purity nitrogen gas atmosphere.

Figure 31B:
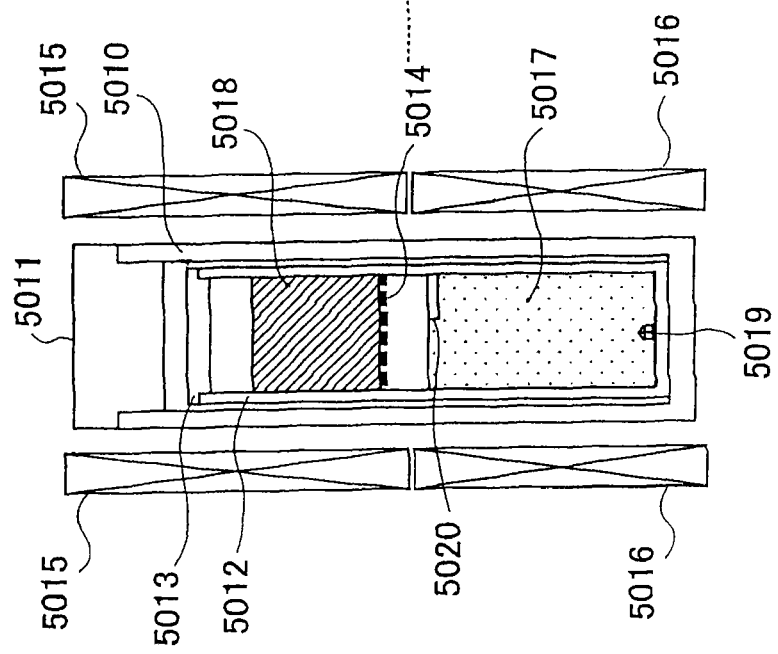

Subsequently, the temperatures of the heaters 5015 and 5016 are increased to predetermined temperatures, as shown in FIG. 31B, and the reaction vessel 5010 is thus heated, respectively. At this time, the temperature of the heater 5015 is made into 900 degrees C., while the temperature of the heater 5016 is made into 700 degrees C. During the temperature rise, in the upper part of the crystal growth container 5012, GaN 5018 decomposes, the group-III metal (Ga) and nitrogen are thus generated, and the group-III metal and the nitrogen thus generated are supplied to the Na molten liquid 5017 in the lower part of the crystal growth container 5012 through the mesh 5014, and react in the Na molten liquid 5017, thereby the crystal of GaN growing.

In an experiment, after holding this state for 200 hours, when the reaction vessel 5010 was opened, in the crystal growth container 5012, the single crystals 5019 and 5020 of GaN with a size of approximately 10 mm were yielded through the crystal growth.

FIG. 32 shows a side-elevational sectional view of a crystal growth apparatus in a thirteenth embodiment of the present invention. As shown in FIG. 32, a second container 5039 for performing crystal growth, and a first container 5038 for decomposing the group-III nitride (for example, GaN) 5042 used as materials are provided in a reaction vessel 5030 made of stainless steel and having a closed shape.

Moreover, a gas supply pipe 5031 which makes it possible to make an internal space of the reaction vessel 5030 full of nitrogen ($N_2$) gas used as the nitrogen material, and to control the nitrogen ($N_2$) pressure in the reaction vessel 5030 passes through the reaction vessel 5030. A valve 5032 and a pressure control device 5033 are provided in the gas supply pipe 5031, and the pressure control device 5033 is used for adjusting the nitrogen pressure therein. Moreover, a pressure gauge 5034 used as a monitor of the total pressure in the reaction vessel 5030 is provided.

Moreover, the first container 5038 by which the group-III nitride (for example, GaN) 5042 is held is provided in an upper part of the second container 5039. A hole is formed in the first container 5038 at the bottom of a zone at which the group-III nitride 5042 is held, and the group-III metal (for example, Ga) molten liquid 5043 generated by decomposition drops toward the lower-positioned second container 5039 through a pipe connecting therebetween. Moreover, the first container 5038 and second container 5039 can be separate from one another, and also, can be removed from the reaction vessel 5030.

In addition, the material of the first container 5038 and the second container 5039 is BN (boron nitride).

Moreover, a cover 5037 is provided in the periphery of so as to enclose the first container 5038 and second container 5039 for avoiding pollution due to scattering of the alkaline metal or material steam of the inside of the reaction vessel 5030. A cover made of stainless steel can be used as the above-mentioned cover 5037.

In addition, a gap 5040 is provided between the cover 5037 and the reaction vessel 5030, and, also, a gap 5041 is provided between the first containers 5038 and second container 5039. Thus, the nitrogen gas enters into the second container 5039 through the gap 5040 between the cover 5037 and the reaction vessel 5030, and then through the gap 5041 between the first container 5038 and second container 5039. Thereby, the pressure of nitrogen gas is applied onto the molten liquid 5044 of the alkaline metal and group-III metal in the second container 5049.

Moreover, heaters 5035 and 5036 are provided on the outside of the cover 5037. The heater 5035 and heater 5036 can carry out temperature control independently, respectively. Thereby, it is possible to control independently the temperature of the first container 5038 and second container 5039 by the heaters 5035 and 5036 to arbitrary temperatures, respectively. These heaters 5035 and 5036 can be removed.

Next, a method of growing GaN employing the above-described crystal growth apparatus shown in FIG. 32 will now be described. First, granular crystals or powders of GaN are put into the first container 5038. Further, Na is put into the second container 5039 as the alkaline metal.

Then, the first container 5038 is placed on the second container 5039, and, then, they are set in the reaction vessel 5030. Next, the cover 5037 made of stainless steel is put on the first and second containers, and the heaters 5035 and 5036 are set at predetermined positions, respectively. The series of above-mentioned steps are performed in a high-purity Ar gas atmosphere.

Subsequently, the reaction vessel 5030 is sealed, the valve 5032 is closed, and thus, the inside of the reaction vessel 5030 is made isolated from the external atmosphere.

Subsequently, the temperatures of the heaters 5035 and 5036 are increased to predetermined temperatures. At this time, the temperature of the first container 5038 is made into 1000 degrees C., while the temperature of the crystal growth zone in the second container 5039 is made into 700 degrees C.

Subsequently, the valve 5032 is opened, nitrogen gas is put into the reaction vessel 5030 from the nitrogen gas supply pipe 5031, the pressure control device 5033 adjusts the pressure, and the total pressure in the reaction vessel 5030 is set to 3 MPa. Then, after keeping this state for 200 hours, the temperature in the reaction vessel 5030 is lowered Then, in an experiment made according to the above-described procedure, after lowering the pressure of the gas in the reaction vessel 5030, the reaction vessel 5030 was opened. As a result, in the second container 5039, single crystals 5045 and 5046 of GaN of size of approximately 10 mm were yielded through the crystal growth there, as shown in FIG. 32.

Figure 33:
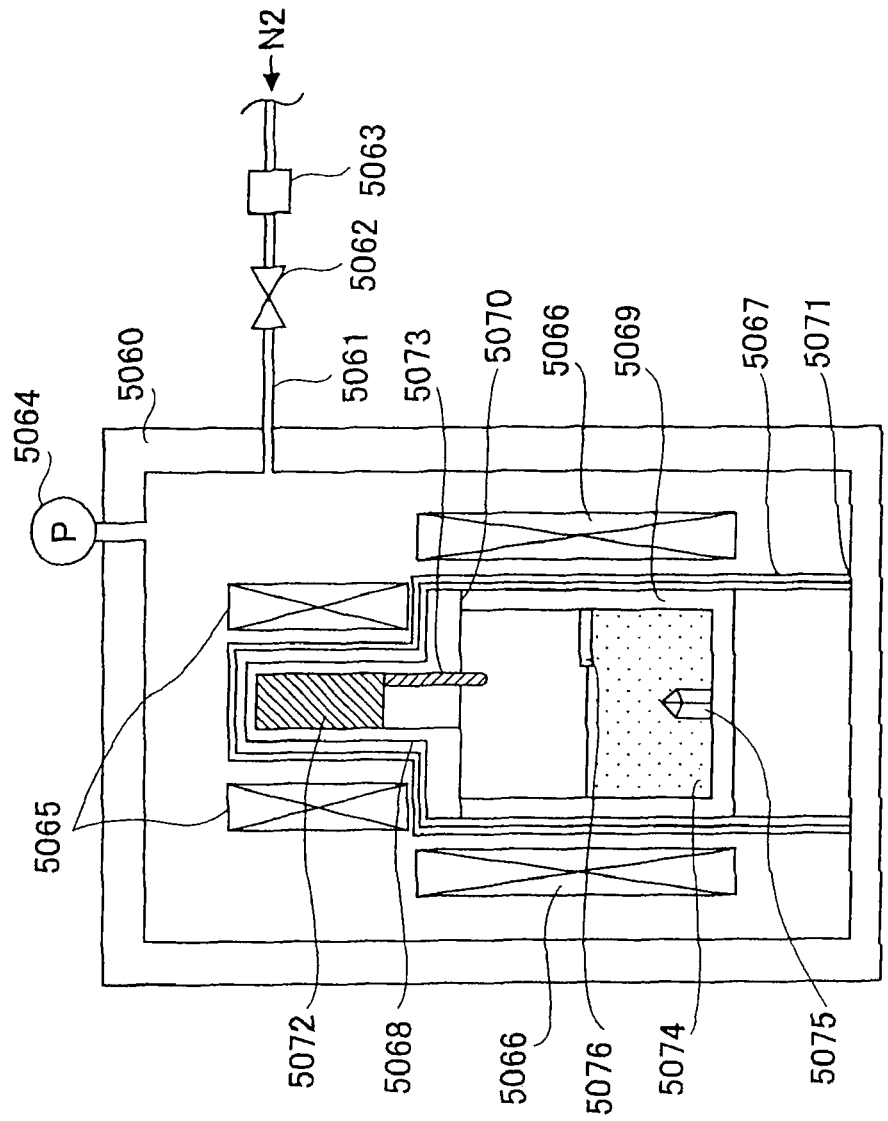
FIG. 33 illustrates a group-III nitride crystal growth apparatus in a fourteenth embodiment of the present invention.

FIG. 33 illustrates a fourteenth embodiment of the present invention. FIG. 33 shows a side-elevational sectional view of a crystal growth apparatus in the fourteenth embodiment of the present invention. Basically, the crystal growth apparatus shown in FIG. 33 is approximately same as the crystal growth apparatus shown in FIG. 32. That is, as shown in FIG. 33, a second container 5069 for performing crystal growth, and a first container 5068 for decomposing the group-III nitride used as materials are provided in a reaction vessel 5060 made of stainless steel having a closed shape, as in the crystal growth apparatus of FIG. 32.

Moreover, a gas supply pipe 5061 which makes the internal space of the reaction vessel 5060 full of the nitrogen ($N_2$) gas used as the nitrogen material, and controls the nitrogen ($N_2$) pressure in the reaction vessel 5060, passes through the reaction vessel 5060. A valve 5062 and a pressure control device 5063 are provided in the gas supply pipe 5061, and the pressure control device 5063 can adjust the nitrogen pressure therein. Moreover, a pressure gauge 5064 used as a monitor of the total pressure in the reaction vessel 5060 is provided.

Moreover, in this fourteenth embodiment, the first container 5068 by which the group-III nitride (for example, GaN) is held is placed on the top of the second container 5069, and thus, acts as a lid of the second container 5069. Moreover, the first container 5068 has a cylindrical inner wall, and, the group-III nitride 5072 adheres to this inner wall. Then, the group-III metal molten liquid 5073 obtained from decomposition of the group-III nitride drops into the second container 5069 from the first container 5068 as it runs on the inner wall of the first container 5068. Moreover, the first container 5068 and second container 5069 can be made separate from one another, and also, can be removed from the reaction vessel 5060.

In addition, the material of the first container 5068 and second container 5069 is BN (boron nitride).

Moreover, a cover 5067 is provided so as to enclose the first container 5068 and second container 5069 for preventing pollution of the inside of the reaction vessel 5060 due to scattering of the steam of the alkaline metal or the materials. The cover 5067 is made of stainless steel.

In addition, a narrow gap 5071 is provided between the cover 5067 and reaction vessel 5060, and, also a narrow gap 5070 is provided between the first container 5068 and second container 5069. The nitrogen gas enters the second container 5069 through the gap 5071 and gap 5070 from the reaction vessel 5060. Thus, the pressure of the nitrogen gas is applied also to the molten liquid 5074 of the alkaline metal and group-III metal in the second container 5069.

Moreover, heaters 5065 and 5066 are provided in the outside of the cover 5067. The heater 5065 and heater 5066 can carry out temperature control independently, respectively. Thereby, it is possible to control independently the temperature of the first container 5068 and second container 5069 by the heaters 5065 and 5066 to respective arbitrary temperatures. The heaters 5065 and 5066 can be removed.

Next, a method of growing GaN crystal employing the crystal growth apparatus shown in FIG. 33 will now be described. First, synthesis of GaN is performed in the first container 5068. In order to perform this synthesis, at first, the upper and lower sides of the first container 5068 are made upside-down from the state shown in FIG. 33. Then, Na, the alkaline metal, and the metal Ga are put into the first container 5068. Then, this first container 5068 is put into a reaction vessel identical to the reaction vessel 5060 shown in FIG. 33. Then, the inside atmosphere of the reaction vessel is kept at 600 degrees C. with a pressure of nitrogen of 8 MPa for 100 hours. Thereby, fine crystals of GaN are synthesized inside of the first container 5068. The fine crystals of GaN stick to the inner wall of the first container (decomposition container) 5068, and, they do not fall even when the container 5068 is made upside-down as shown in FIG. 33.

In addition, all Na used as the alkaline metal evaporates, and does not remain in the first container 5068.

Next, crystal growth for GaN single crystals in the second container 5069 is performed as described below. First, Na is newly put into the second container 5069 as the alkaline metal. Then, on the second container 5069, as shown in FIG. 33, the first container 5068 is placed, and, in this state, they are set in the reaction vessel 5060. Then, the cover 5067 made of stainless steel is put on the first and second containers 5068 and 5069, and the heaters 5065 and 5066 are provided at predetermined positions. The series of above-mentioned steps are performed in a high-purity Ar gas atmosphere.

Subsequently, the reaction vessel 5060 is sealed, valve 5062 is closed, and thus, the inside of the reaction vessel 5060 is made separate from the external atmosphere. Subsequently, the temperatures of the heaters 5065 and 5066 are increased to predetermined temperatures, respectively. At this time, the temperature of the first container 5068 is made into 1000 degrees C., while a crystal growth zone in the second container 5069 is made into 700 degrees C.

Subsequently, the valve 5062 is opened, the nitrogen gas is put into the reaction vessel 5060 from the nitrogen gas supply pipe 5061, the pressure control device 5063 adjusts the pressure, and the total pressure in the reaction vessel 5060 is made to be 3 MPa. Subsequently, by controlling the temperature of the heater 5065 so as to fluctuate the temperature of the first container 5068 up and down on both sides with respect to the decomposition temperature of the group-III nitride. Then, after keeping this state for 200 hours, the temperatures of the heaters are lowered. During this period, the decomposed group-III metal and nitrogen coming from the first container 5068 are used as the materials, and, thereby, the group-III nitride crystal grows in the second container 5069.

In an experiment, then, the pressure of the gas in the reaction vessel 5060 was lowered, then, when the reaction vessel 5060 was opened, in the second container 5069, single crystals 5075 and 5076 of GaN with size of approximately 10 mm were yielded through the crystal growth there.

Thus, according to the twelfth, thirteenth and fourteenth embodiments of the present invention, after decomposing the group-III nitride into group-III metal and nitrogen, group-III nitride crystal is made to re-grow up by utilizing at least one of the group-III metal and nitrogen thus obtained through the decomposition. For this purpose, in the first container, the group-III nitride is decomposed, and, then, at least one of the group-III nitride and nitrogen is supplied to the second container. Then, after that, in the second container, the group-III nitride crystals are made to re-grow. For this purpose, the temperatures of the first and second containers can be controlled independently. Thereby, it is possible to produce practical-large-sized and, high-quality group-III nitride crystals at low costs.

As to the twelfth, thirteenth and fourteenth embodiments, a specific way of the step of decomposition is not limited to the heating process as described above, and, various methods, i.e., decomposition by lowering the pressure of nitrogen in a heat balance state with the group-III nitride, or the like may also be applied. Further, it is also possible that the decomposition step and re-growth step are performed not only in the separate containers as described above, but also may be performed in a common container.

As the alkaline metal, not only sodium but also potassium may be used. The group-III nitride means a compound of the group-III metal such as gallium, aluminum or indium with nitrogen (not only a binary, but also, ternary, or quaternary compound may be applied therefor). Furthermore, the group-III nitride to be decomposed should not necessarily be a single crystalline one but may be a polycrystalline one, and, also, the size of particles may be various ones, i.e., powders, fine crystals, or the like.

Further, in case where only the group-III metal obtained through the decomposition is used as the material for group-III nitride crystal growth, nitrogen may be supplied from another nitrogen material such as nitrogen gas, or another compound of nitrogen with any of various elements. The nitrogen material may be of gas phase, liquid phase, or solid phase. The nitrogen gas may be supplied from the outside of the reaction vessel or may be previously molten in the alkaline molten liquid.

In case where the nitrogen obtained from the decomposition is used as the material for re-growth of group-III nitride crystal, it is preferable to previously apply the nitrogen partial pressure by filling the reaction vessel with nitrogen gas so as to prevent the nitrogen from escaping from the molten liquid into a gas phase.

By providing the material for the crystal growth from the previously prepared nitride inside of the reaction vessel, it is possible to omit a special provision to supply the same from the outside. Accordingly, it is possible to simplify the system, and, also, it is possible to prevent a problem of condensation of the material in a supply pipe or so if any.

Furthermore, according to the twelfth, thirteenth and fourteenth embodiments, the group-III metal obtained by decomposition in the first container is supplied to the second container, and, then, is molten into the Na metal molten liquid. Then, through reaction between the nitrogen molten there and the group-III metal thus supplied, the group-III nitride crystal grows. In order to transport the group-III metal obtained through the decomposition from the first container to the second container, various methods may be applied. As in the embodiments, simply a supply pipe or a supply hole may be provided for this purpose between the two containers.

In this configuration of preparing the two containers, it is possible to set suitable conditions (for example, temperatures) on the respective containers independently. Thereby, it is possible to perform the crystal growth at the optimum conditions, and, thus, to yield high-quality crystals. Furthermore, by providing the first container above the second container, the group-III metal obtained through the decomposition can be made to drop into the second container by its self gravity. Accordingly, it is possible to simplify the system.

Further, according to the system shown in FIG. 31A, as it is not necessary to apply a special pressure from the outside, it is possible to use an inexpensive materials as the containers. For example, as the first container, ceramic or the like which does not react with the group-III metal even at high temperature may be applied. In this case, as it is possible to make the crystal growth at high temperature, blockage of supply pipe or the like due to low-temperature condensation can be avoided.

Further, by fluctuating the temperature of the first container with respect to the group-III nitride decomposition temperature, it is possible to appropriately control the feeding rate of the group-III metal to the second container. That is, by raising the temperature above the decomposition temperature, the feeding is performed, and, thus, the crystal growth progresses. However, when the temperature is lowered below the decomposition temperature, the feeding is stopped, and, thus, the crystal growth is stopped. Accordingly, it is possible to arbitrarily control the crystal growth. Thereby, it is possible to proceed with crystal growth in the optimum conditions.

Furthermore, by previously causing the group-III metal obtained through the decomposition to adhere to the inner surface of the first container, it is possible to supply only the group-III metal obtained through the decomposition to the second container for the group-III nitride crystal growth from the first container. Accordingly, it is possible to avoid generation of extra crystal nucleuses, and to achieve yielding of a large sized single crystal.

Further, by previously causing reaction between a group-III metal and a nitride material in a molten alkaline metal in the first container, and, then, after that, decomposing the thus-obtained group-III nitride so as to supply the thus-obtained material to group-III nitride crystal growth, it is possible to omit operation of bringing the material from another container to the first container. Accordingly, it is possible to eliminate occasions of the material being contaminated by impurities.

Furthermore, as it is possible to set the temperatures of the first and second containers independently, it is possible to change only the temperature of the first container so as to control the amount of decomposition of the group-III nitride, and to control the feeding amount of the group-III metal for the crystal growth, as mentioned above.

Furthermore, as the first container is removable from the second container, it is possible to perform synthesis of material in the first container completely independent from the crystal growth performed in the second container, as mentioned above. Accordingly, it is possible to perform synthesis of material and crystal growth in parallel, to reduce the process time, and to reduce manufacturing costs.

Also a group-III nitride crystal yielded according to each of these twelfth, thirteenth and fourteenth embodiments of the present invention may be applied to a group-III nitride semiconductor device as shown in FIG. 13 as in the cases of the first through eleventh embodiments. Also in this case, the same advantages can be obtained as in the case of applying the first through eleventh embodiments described above.

Further, the present invention is not limited to the above-described embodiments, and variations and modifications may be made without departing from the basic concepts of the present invention.

The present application is based on Japanese priority applications Nos. 2001-134171, 2001-152977, 2001-147703, 2001-195954, 2001-355720, and 2001-358808, filed on May 1, 2001, May 22, 2001, May 17, 2001, Jun. 28, 2001, Nov. 21, 2001 and Nov. 26, 2001, respectively, the entire contents of which are hereby incorporated by reference.

What is claimed is:

1. A group-III nitride crystal growth apparatus comprising:
    a mixed molten liquid container holding a mixed molten liquid of an alkaline metal and a substance at least containing a group-III metal;
    a reaction vessel having said mixed molten liquid container set therein;
    a device introducing a substance at least containing nitrogen into said reaction vessel; and
    an observation device through which the inside of said reaction vessel is observable, said observation device comprising a transparent window provided in said reaction vessel,
    wherein said transparent window has a film of a group-III nitride provided on the inner surface thereof.

2. The group-III nitride crystal growth apparatus as claimed in claim 1, wherein said transparent window is made of quartz or sapphire.

3. The group-III nitride crystal growth apparatus as claimed in claim 1, further comprising a device supplying a gas in the vicinity of said transparent window and preventing the gas from staying there.

4. The group-III nitride crystal growth apparatus as claimed in claim 1, said observation device further comprising an optical system on the outside of said window.

5. The group-III nitride crystal growth apparatus as claimed in claim 1, wherein nitrogen gas is provided to said observation device having transparency and a device for preventing the nitrogen gas from staying there is provided.

6. The group-III nitride crystal growth apparatus as claimed in claim 1, further comprising: a crystal holding mechanism holding the group-III nitride crystal yielded by said apparatus; and a device moving one of said crystal holding mechanism and said mixed molten liquid container.

7. The group-III nitride crystal growth apparatus as claimed in claim 6, wherein said crystal holding mechanism is connected with a lid of said mixed molten liquid container.

8. A group-III nitride crystal growth apparatus applying a method including the steps of a) preparing a mixed molten liquid of an alkaline metal and a substance at least containing a group-III metal, b) causing growth of a group-III nitride crystal from the mixed molten liquid prepared in step a) and a substance at least containing nitrogen, and c) creating a state in step b) in which nitrogen can be introduced into the molten liquid prepared by step a), and thus yielding a crystal of group-III nitride, the group-III nitride crystal growth apparatus comprising:
    a plurality of temperature control zones for which temperature control can be performed independently in a single reaction vessel; and
    a respective plurality of liquid holding containers within the reaction vessel corresponding to the plurality of temperature control zones.

9. The group-III nitride crystal growth apparatus as claimed in claim 8, further comprising a transportation zone providing communication of the alkaline metal among said plurality of temperature control zones.

10. The group-III nitride crystal growth apparatus as claimed in claim 9, further comprising a device creating a decompressed state in said transportation zone during transportation of the alkaline metal among said plurality of temperature control zones.

11. The group-III nitride crystal growth apparatus as claimed in claim 8 further comprising a device separating and integrating said plurality of temperature control zones.

12. The group-III nitride crystal growth apparatus as claimed in claim 11, further comprising a device independently controlling the atmosphere of each of said plurality of temperature control zones.

13. The group-III nitride crystal growth apparatus as claimed in claim 11, further comprising a device creating a decompressed state in a transportation zone providing communication among said plurality of temperature control zones.

14. A group-III nitride crystal growth apparatus comprising:
    a mixed molten liquid container provided in a reaction vessel and in which a mixed molten liquid of an alkaline material and a substance at least containing a group-III metal is formed, growth of a group-III nitride crystal being caused from the mixed molten liquid and a substance at least containing nitrogen;
    a material container provided outside of said reaction vessel, from which the substance at least containing the group-III metal is fed into the inside of said reaction vessel due to the self gravity of said substance at least containing the group-III metal;
    a pressure adjustment pipe providing communication between said mixed molten liquid container and said material container;
    a supply pipe also providing communication between said mixed molten liquid container and said material container; and
    a device controlling the mutual height relationship between said mixed molten liquid container and said material container.

15. The group-III nitride crystal growth apparatus as claimed in claim 14, further comprising: a mechanism for observing the remaining amount of the substance at least containing the group-III metal in said material container.

16. The group-III nitride crystal growth apparatus as claimed in claim 15, wherein said mechanism for observing comprises a transparent material provided as at least a part of said material container.

17. The group-III nitride crystal growth apparatus as claimed in claim 15, wherein said mechanism for observing comprises a mechanism of emitting and receiving ultrasonic waves provided for said material container.

18. The group-III nitride crystal growth apparatus as claimed in claim 15, wherein said mechanism for observing comprises a mechanism of electrically monitoring the remaining amount of the substance at least containing the group-III metal in said material container.

19. A group-III nitride crystal growth apparatus comprising:
    a reaction vessel in which a mixed molten liquid of an alkaline material and a substance at least containing a group-III metal is formed, growth of a group-III nitride crystal being caused from the mixed molten liquid and a substance at least containing nitrogen; and
    a feeding device feeding the substance at least containing the group-III metal to said reaction vessel, said feeding device transforming rotation movement of a motor into a reciprocating movement of a rod by which the substance at least containing the group-III metal is fed.

20. The group-III nitride crystal growth apparatus as claimed in claim 19, wherein said feeding device comprises a ball-utilizing check valve avoiding adverse flow of the substance at least containing the group-III metal, said check valve comprising a ball made of a predetermined material.

21. The group-III nitride crystal growth apparatus as claimed in claim 20, wherein the material of said ball is such that the density of said material is higher than that of the substance at least containing the group-III metal.

22. A group-III nitride crystal growth apparatus comprising:
a first container, provided in a reaction vessel, holding a group-III nitride;
a second container, provided in the reaction vessel, holding an alkaline metal; and
a temperature control device controlling the temperatures on said first and second containers independently,
wherein, under temperature control performed by said temperature control device, at least one of a group-III metal and nitrogen yielded through decomposition of the group-III nitride performed in the first container is supplied to the second container; and group-III nitride crystal growth occurs in said second container by utilizing a material thus supplied.

23. The group-III nitride crystal growth apparatus as claimed in claim 22, wherein the apparatus is configured such that the first container is removable.

24. The group-III nitride crystal growth apparatus as claimed in claim 22, wherein said first container is set above said second container.

25. The group-III nitride crystal growth apparatus as claimed in claim 22, wherein the apparatus has more than two containers in the reaction vessel.

* * * * *